(12) United States Patent
Kajimoto et al.

(10) Patent No.: US 8,253,182 B2
(45) Date of Patent: Aug. 28, 2012

(54) NONVOLATILE SEMICONDUCTOR MEMORY AND METHOD FOR FABRICATING THE SAME

(75) Inventors: Minori Kajimoto, Fujisawa (JP); Mitsuhiro Noguchi, Yokohama (JP); Akira Goda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/588,203

(22) Filed: Oct. 7, 2009

(65) Prior Publication Data

US 2010/0052032 A1  Mar. 4, 2010

Related U.S. Application Data

(60) Continuation of application No. 12/000,396, filed on Dec. 12, 2007, now Pat. No. 7,622,762, which is a division of application No. 10/890,132, filed on Jul. 14, 2004, now Pat. No. 7,326,993.

(30) Foreign Application Priority Data

Jul. 15, 2003  (JP) ................................. 2003-197095

(51) Int. Cl.
*H01L 29/76*  (2006.01)

(52) U.S. Cl. . 257/314; 257/315; 257/324; 257/E23.141; 438/627

(58) Field of Classification Search .................. 257/314, 257/315, E23.141, 324; 438/627
See application file for complete search history.

(56) References Cited

U.S. PATENT DOCUMENTS

| | | | |
|---|---|---|---|
| 6,080,664 A | 6/2000 | Huang et al. | |
| 6,153,510 A | 11/2000 | Ishibashi | |
| 6,376,876 B1 * | 4/2002 | Shin et al. | 257/315 |
| 6,686,241 B2 | 2/2004 | Ati et al. | |
| 6,720,579 B2 * | 4/2004 | Shin et al. | 257/68 |
| 6,744,096 B2 | 6/2004 | Lee et al. | |
| 7,375,389 B2 * | 5/2008 | Oh et al. | 257/296 |
| 2002/0088976 A1 * | 7/2002 | Shin et al. | 257/68 |
| 2003/0042520 A1 | 3/2003 | Tsukamoto et al. | |
| 2003/0111732 A1 | 6/2003 | Goda et al. | |

(Continued)

FOREIGN PATENT DOCUMENTS

JP  63-143845  6/1988

(Continued)

OTHER PUBLICATIONS

Notification of Reason(s) for Refusal mailed on Jul. 28, 2009, issued by the Japanese Patent Office in Japanese Patent Application No. 2003-197095, and English language translation thereof.

*Primary Examiner* — David Vu
*Assistant Examiner* — Brandon Fox
(74) *Attorney, Agent, or Firm* — Finnegan, Henderson, Farabow, Garrett & Dunner, L.L.P.

(57) ABSTRACT

A nonvolatile semiconductor memory includes a first semiconductor layer; second semiconductor regions formed on the first semiconductor layer having device isolating regions extended in a column direction; a first interlayer insulator film formed above the first semiconductor layer; a lower conductive plug connected to the second semiconductor regions; a first interconnect extended in a row direction; a second interlayer insulator formed on the lower conductive plug and the first interlayer insulator film; an upper conductive plug; and a second interconnect formed on the second interlayer insulator contacting with the top of the upper conductive plug extended in the column direction.

7 Claims, 40 Drawing Sheets

U.S. PATENT DOCUMENTS

| | | |
|---|---|---|
| 2004/0079985 A1 | 4/2004 | Yonehama et al. |
| 2005/0266678 A1 | 12/2005 | Helm et al. |

FOREIGN PATENT DOCUMENTS

| | | |
|---|---|---|
| JP | 10-223867 | 8/1998 |
| JP | 10-284593 | 10/1998 |
| JP | 11-87505 | 3/1999 |
| JP | 11-288940 | 10/1999 |
| JP | 2000-91546 | 3/2000 |
| JP | 2000-196046 | 7/2000 |
| JP | 2001-167590 | 6/2001 |
| JP | 2001-196477 | 7/2001 |
| JP | 2001-244335 | 9/2001 |
| JP | 2001-274365 | 10/2001 |
| JP | 2002-110822 | 4/2002 |
| JP | 2002-151601 | 5/2002 |
| JP | 2002-368085 | 12/2002 |
| JP | 2003-188252 | 7/2003 |

* cited by examiner

NONVOLATILE SEMICONDUCTOR MEMORY AND METHOD FOR FABRICATING THE SAME

This is a continuation of U.S. patent application Ser. No. 12/000,396, filed Dec. 12, 2007 now U.S. Pat. No. 7,622,762, which is a divisional application of U.S. patent application Ser. No. 10/890,132, filed Jul. 14, 2004 (now U.S. Pat. No. 7,326,993 B2, issued Feb. 5, 2008), which is incorporated herein by reference.

CROSS REFERENCE TO RELATED APPLICATIONS

This application is based upon and claims the benefit of priority from prior Japanese Patent Application P2003-197095 filed on Jul. 15, 2003 the entire contents of which are incorporated by reference herein.

BACKGROUND OF THE INVENTION

1. Field of the Invention

The present invention relates to contacts and interconnect layers in a nonvolatile semiconductor memory. More specifically, it relates to a nonvolatile semiconductor memory and a method for fabricating the same, which is used for interconnects and contacts aligned with minimum fabrication dimensions, such as the contacts, data transfer lines, or via contacts of NAND EEPROMs or NOR EEPROMs.

2. Description of the Related Art

FIGS. 1 through 8 show the contacts and interconnect layers of an example of conventional NAND EEPROMs, which are semiconductor devices. FIG. 1 is an aerial pattern diagram of a conventional nonvolatile semiconductor memory. FIG. 2 is a schematic cross-sectional diagram cut along the line I-I of FIG. 1. FIG. 3 is a schematic cross-sectional diagram cut along the line II-II of FIG. 1. FIG. 4 is a schematic cross-sectional diagram cut along the line III-III of FIG. 1. In addition, FIG. 5 is an aerial pattern diagram for describing the data transfer line contacts CB being short-circuited due to a decrease in the lithographic margin in the conventional nonvolatile semiconductor memory. FIG. 6 is an aerial pattern diagram for describing the data transfer line contacts CB and interconnects being short-circuited due to a decrease in the alignment margin in the conventional nonvolatile semiconductor memory. On the other hand, FIG. 7A is an aerial pattern diagram for describing an open circuit failure in data transfer lines due to decrease in the lithographic margin in the conventional nonvolatile semiconductor memory, and FIG. 7B is an aerial pattern diagram for describing a short-circuit failure in data transfer lines due to a decrease in the lithographic margin in the conventional nonvolatile semiconductor memory. In addition, FIG. 8 is an aerial pattern diagram for describing a contact open circuit failure due to a decrease in the alignment margin needed when directly connecting via contacts in the conventional nonvolatile semiconductor memory, and FIG. 8A schematically shows a normal short-circuit, and FIG. 8B schematically shows a contact open circuit failure.

As shown in FIGS. 1 and 2, memory cells 20 are serially arranged having a NAND structure, and isolated from each other by interlayer insulator films 24. Circular or elliptical contacts (CB, CS, 16) are aligned perpendicular to data transfer lines BL. As shown in FIG. 4, the contacts are aligned along the line III-III in extremely close intervals of 2 to 3 F where F denotes the minimum fabrication dimension depending on the widths of a device region and a device isolating region. On the other hand, as shown in FIG. 2, the contacts are aligned along the line I-I, which is orthogonal to the line III-III, in longer intervals than the contacts along the line III-III, for example, 40 to 100 F in the case of a NAND flash memory, for example, as described in Japanese Patent Application Laid-open No. 2000-91546.

A more sufficient lithographic margin must be secured as miniaturization increases. However, conventionally, as shown in the aerial view of FIG. 1, fringes are formed on data transfer line extended regions 14 such that via contacts 16 are always formed on parts of interconnect layers, which are to form the data transfer line extended regions 14, preventing the via contacts 16 from being over-etched due to misalignment. This arrangement requires the data transfer line extended regions 14 to form a pattern where via contact 16 portions are larger than data transfer line contact CB portions, resulting in a need for two-dimensional lithography resolution, which is unnecessary for a simple linear pattern or a hole pattern. As a result, to provide the minimum line width F of interconnects for the data transfer line extended regions 14 at the data transfer line contact CB portions, it is necessary to extend the data transfer line contacts CB along the data transfer lines BL. Therefore, a pattern length of 7 F or longer is needed for a design rule of 0.13 ,m or shorter, for example. In particular, the shorter the minimum line-width F is made, the lower the resolution becomes in the direction orthogonal thereto, resulting in longer data transfer line contacts CB along data transfer lines 57.

Conventionally, the data transfer line contacts CB and the via contacts 16 are filled with phosphorus (P) or the like highly-doped polycrystalline silicon or a metal such as tungsten, and the interconnect layers are filled with a metal such as tungsten. Here, the data transfer line extended regions 14 being longer than 7 F along the data transfer lines 57 are assumed as the interconnect layers. Alternatively, a longer, linear fine metal pattern is naturally available, and the following description holds true with a configuration where the via contacts 16 and the data transfer line extended regions 14 are omitted, and contacts are directly formed on the data transfer lines BL regarding the data transfer lines BL as the interconnects.

Next, the case of the data transfer line contacts CB being aligned with pitches of 2 F along the line III-III is considered. When each of the data transfer line contacts CB has a certain aspect ratio such as 3 or greater, as with the conventional example, the diameter of each of the tops of the contacts along the line III-III becomes longer than F. This is because the diameter at the bottom, along the line III-III, needs to be approximately F to secure sufficient contact area with a well region 26 at each of the bottoms of the contacts, and the data transfer line contacts CB need to be in a forward tapered shape so that the diameter of each of the tops of the contacts along the line III-III can be longer, which allows those data transfer line contacts CB to be completely filled. On the other hand, the width of each interconnect, which makes contact with the contact for the interconnect layer formed on the top of that contact, is conventionally less than F. This is also caused even when forming a forward tapered-shape region to secure a metal filling layer in the data transfer line extended regions 14 and secure margins in a closely adjacent contact pattern. As a result, the width of each interconnect is shorter than the diameter of each contact in the cross section cutting along a line perpendicular to the data transfer lines BL (the cross section along the line III-III).

A first problem of decreasing the inter-contact short-circuit margin is raised in the inter-contact short-circuit margin because of conducting wet etching twice for the contacts: the first wet etching is carried out to remove residue left on the tops of the data transfer line contacts CB after anisotropic etching for the contacts; and the second wet etching is carried out to remove residue left after anisotropic etching the data transfer lines (see FIG. 5). In addition, another problem is a short-circuit between the contacts and the data transfer lines due to a decrease in the alignment margin resulting from an increase in the diameter of each contact due to wet etching (see FIG. 6).

A second problem is an open/short failure in the interconnects due to a decrease in the lithographic margin for the variously-shaped data transfer lines as shown in FIGS. 7A and 7B. FIGS. 7A and 7B show exemplary open circuit failure portions 36 and exemplary short-circuit failure portions 38, respectively. The conventional technology simultaneously forming ladle-shaped data transfer lines as described above as well as normal line and space patterns using one lithography process, cannot maintain a sufficient focal depth for both patterns, and also cannot perform a very fine process while maintaining a sufficient exposure fluctuation-tolerable width for extremely miniaturized devices. This is apparent from the fact that the minimum line width in two directions at the resolution limit cannot be simultaneously obtained since the spatial frequency of the light intensity in an arbitrary direction is equal to or less than the so-called resolution limit. Therefore, usage of an exposure device with deep focal depth and optimization of complex optical dimension correction (OPC) for the ladle-shaped handgrip portion are needed.

In addition, since the distance between the interconnects and opposing data transfer line extended regions 14 further greatly influences a lithographic margin as miniaturization increases, it becomes necessary to form longer opposing data transfer line extended regions 14 in a zigzag shape along the line I-I shown in FIG. 1. Therefore, the data transfer line extended regions 14 are formed overlapping the memory cells. In this case, since the data transfer line extended regions 14 are close to the memory cells, the degree of influence from the potential of the data transfer lines BL on each memory cell differs depending on whether or not the data transfer line extended regions 14 are above the memory cells when data is written/read. This creates a problem of change in the write/read voltages to/from memory cells due to the capacitive coupling, resulting in large fluctuation in threshold distribution. FIG. 3 schematically shows an example where the source line contacts CS partially overlap device isolating regions 30, and short-circuited portions 28 are formed between the source line contacts CS and the p-well regions. Moreover, FIG. 4 schematically shows an example of the short-circuited portions 32 between the data transfer line contacts CB and the p-well regions 26, and decreased margin portions 34 between the data transfer line contacts CB and the interconnects (data transfer line extended regions 14).

SUMMARY OF THE INVENTION

An aspect of the present invention inheres in a nonvolatile semiconductor memory, including (a) a first semiconductor layer; (b) a plurality of second semiconductor regions formed on the first semiconductor, layer; (c) a plurality of device isolating regions extended in a column direction so as to isolate the second semiconductor regions; (d) a first interlayer insulator film formed above the first semiconductor layer; (e) a lower conductive plug filled in the first interlayer insulator film and connected to one of the second semiconductor regions; (f) a first interconnect filled in the first interlayer insulator film and extended in a row direction; (g) a second interlayer insulator film formed on the lower, conductive plug and the first interlayer insulator film; (h) an upper conductive plug filled in the second interlayer insulator film and contacting with the top and a part of a side of the lower conductive plug, respectively; and (i) a second interconnect formed on the second interlayer insulator film contacting with the top of the upper conductive plug and extended in the column direction.

Another aspect of the present invention inheres in a method for fabricating a nonvolatile semiconductor memory, including (a) forming a barrier insulator film on a semiconductor substrate; (b) subsequently forming a first interlayer insulator film on the barrier insulator film; (c) delineating a data transfer line contact and a source line contact in the first interlayer insulator film; (d) forming a trench in the first interlayer insulator film to bury a source line and a passing interconnect; (e) depositing a first barrier metal in the trench; (f) depositing a first metallic material to fill the trench; (g) etching back the first metallic material to form the data transfer line contact, the source line contact, a source line, and a passing interconnect in the first interlayer insulator film; (h) depositing a second interlayer insulator film on the first interlayer insulator film; (i) delineating for a via contact in second interlayer insulator film; (j) etching the second interlayer insulator film so as to extend the top of the data transfer line contact; (k) depositing a second barrier metal on the top of the data transfer line contact; (l) filling a second metallic material on the second barrier metal; (m) etching back the second metallic material; and (n) forming the via contact in second interlayer insulator film.

Another aspect of the present invention inheres in a method for fabricating a nonvolatile semiconductor memory, including (a) forming a barrier insulator film on a semiconductor substrate; (b) subsequently forming a first interlayer insulator film on the barrier insulator film; (c) delineating a data transfer line contact and a source line contact simultaneously in the first interlayer insulator film; (d) forming a trench in the first interlayer insulator film to bury the data transfer line contact and the source line contact; (e) depositing and filling one of phosphorus or arsenic doped polycrystalline silicon in the trench; (f) etching back the doped polycrystalline silicon to bury the data transfer line contact and the source line contact in the first interlayer insulator film; (g) forming another trench in the first interlayer insulator film to bury a source line, a passing interconnect, and a data transfer line interconnect; (h) depositing a first barrier metal in the another trench; (i) depositing a first metallic material to fill the another trench; (j) etching back the first metallic material; (k) forming the source line, the passing interconnect, and the data transfer line interconnect filled in the first interlayer insulator film; (l) depositing a second interlayer insulator film on the first interlayer insulator film; (m) delineating for a via contact in the second interlayer insulator film; (n) etching the second interlayer insulator film so as to extend the top of the data transfer line interconnect; (o) depositing a second barrier metal on the top of the data transfer line interconnect; (p) filling the second metallic material on the second barrier metal; (q) etching back the second metallic material; and (r) forming the via contact in the second interlayer insulator film.

DETAILED DESCRIPTION OF THE EMBODIMENTS

Figure 1:
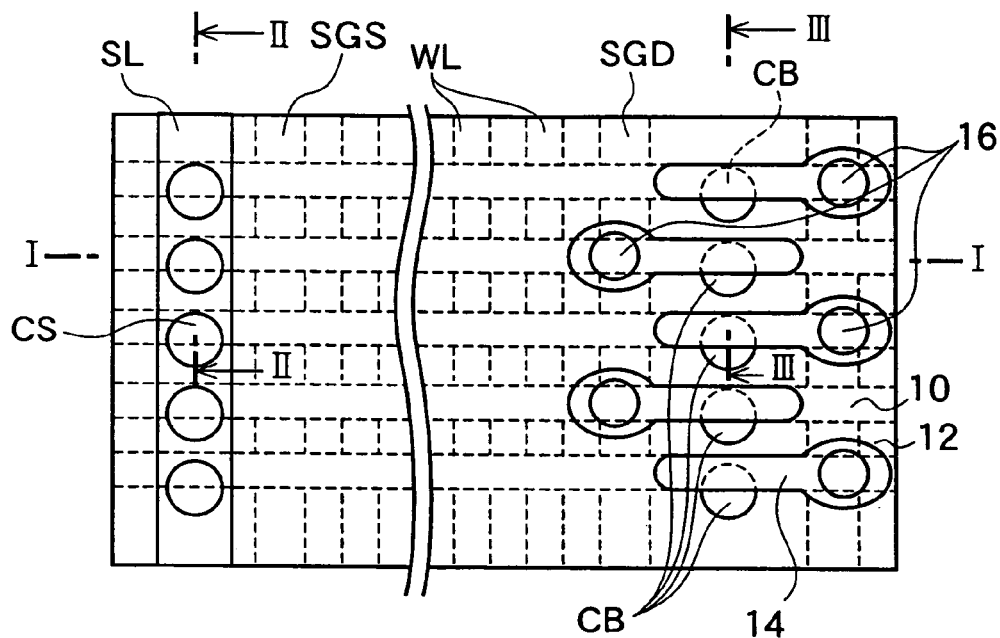
FIG. 1 is an aerial pattern diagram of a conventional nonvolatile semiconductor memory.
Figure 2:
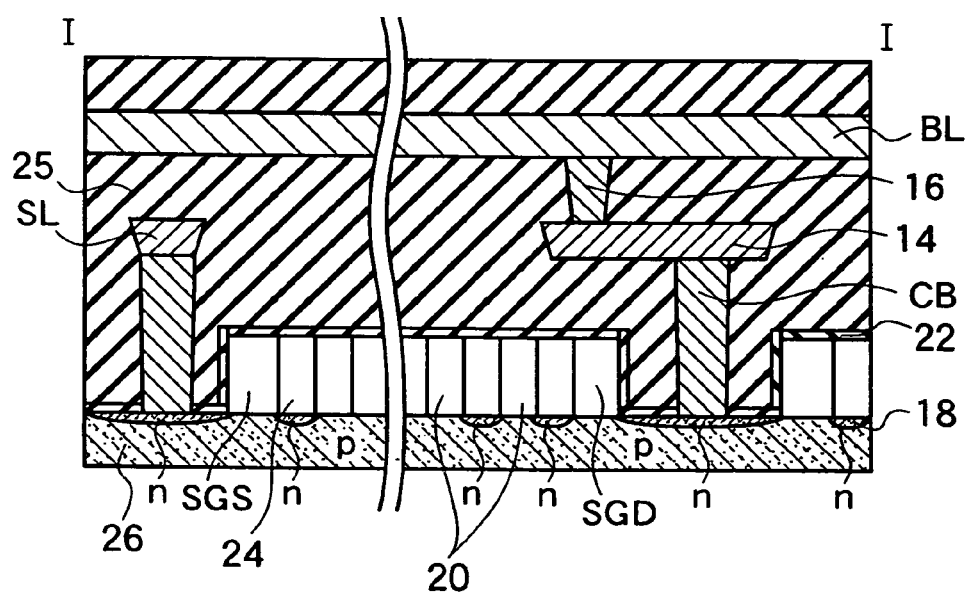
FIG. 2 is a schematic cross-sectional diagram cut along the line I-I of FIG. 1.
Figure 3:
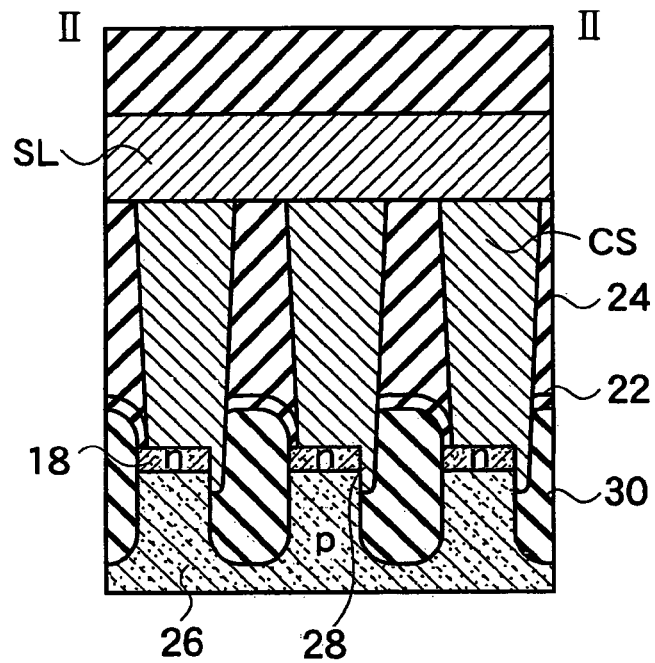
FIG. 3 is a schematic cross-sectional diagram cut along the line II-II of FIG. 3.
Figure 4:
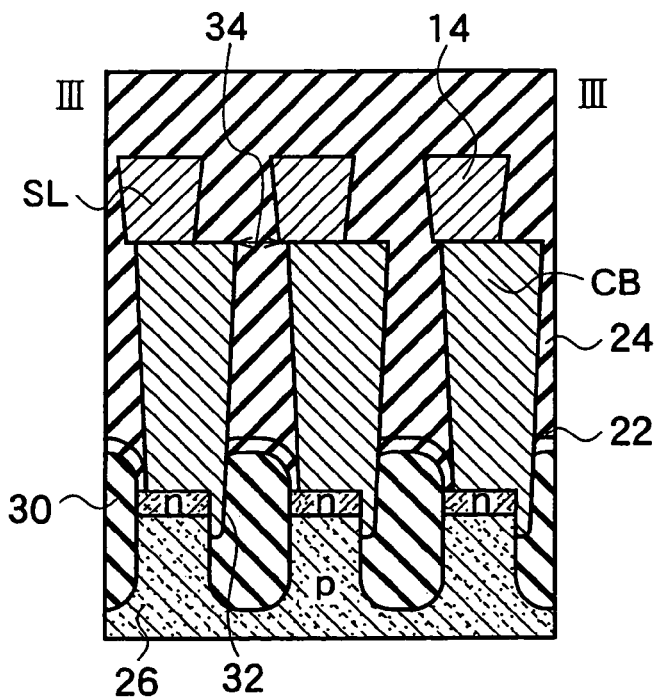
FIG. 4 is a schematic cross-sectional diagram cut along the line III-III of FIG. 1.
Figure 5:
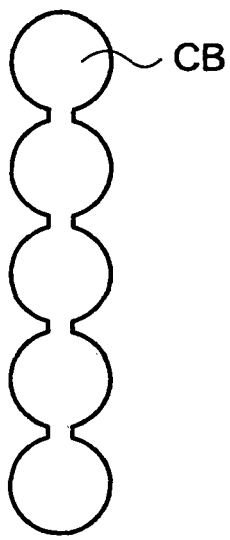
FIG. 5 is an aerial pattern diagram for describing the case of the data transfer line contacts CB being short-circuited due to decrease in the lithographic margin in the conventional nonvolatile semiconductor memory.
Figure 6:
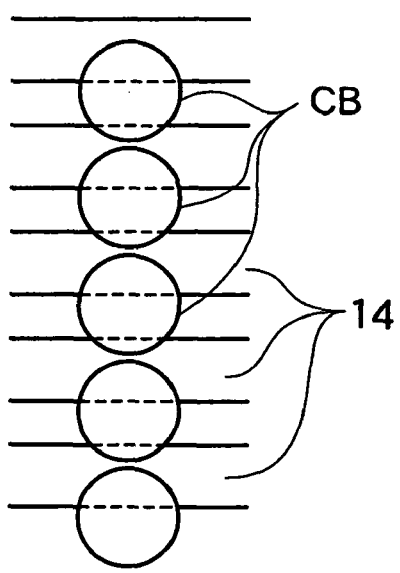
FIG. 6 is an aerial pattern diagram for describing the case of the data transfer line contacts CB being short-circuited with interconnects due to decrease in the alignment margin in the conventional nonvolatile semiconductor memory.
Figure 7A:
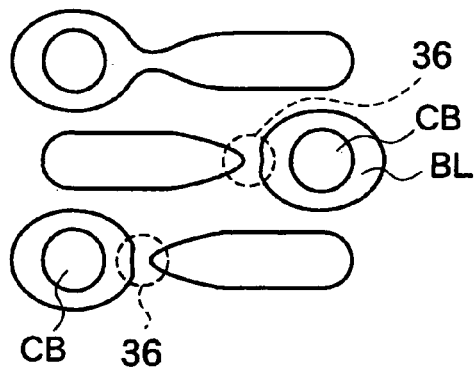
FIG. 7A is an aerial pattern diagram for describing a data transfer line open circuit failure due to decrease in the lithographic margin in the conventional nonvolatile semiconductor memory.
Figure 7B:
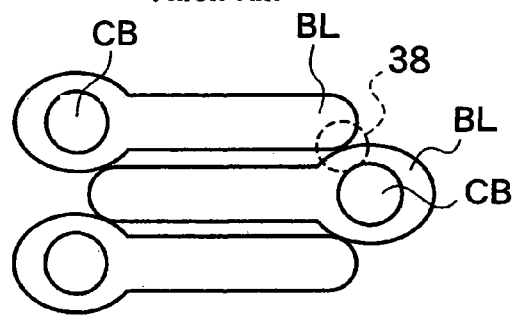
FIG. 7B is an aerial pattern diagram for describing a data transfer line short (short-circuit) failure due to decrease in the lithographic margin in the conventional nonvolatile semiconductor memory.
Figure 8A:
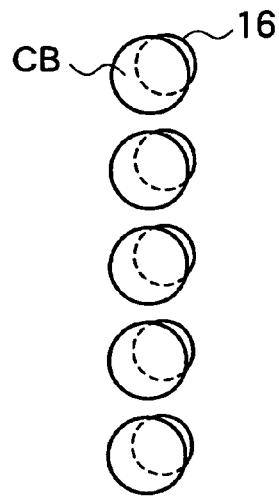
FIG. 8A is an aerial pattern diagram for describing a contact open circuit failure due to decrease in the alignment margin when directly connecting via contacts in the conventional nonvolatile semiconductor memory and schematically shows a normal short-circuit.
Figure 8B:
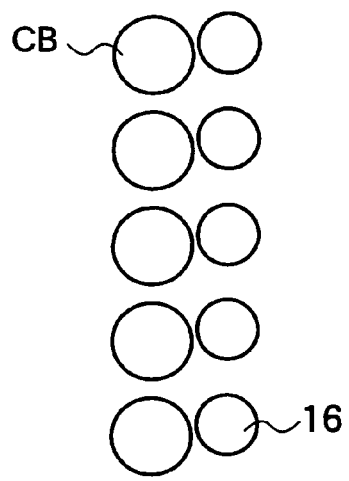
FIG. 8B is an aerial pattern diagram for describing a contact open circuit failure due to decrease in the alignment margin when via contacts are directly connected in the conventional nonvolatile semiconductor memory and schematically shows a contact open circuit failure.

Embodiments of the present invention provide a nonvolatile semiconductor memory that allows direct connection of via contacts to lower contacts, without forming data transfer line extended regions to be connected to the lower contacts.

In addition, the embodiments of the present invention using a damascene process for data transfer line extended regions provides a nonvolatile semiconductor memory and a method for fabricating the same that prevents an interconnect short (short-circuit) failure due to an increase in the widths of the data transfer line extended regions caused by wet etching preprocessing, omits the complex optical dimension correction (OPC) process, and resolves a problem of decreased lithographic margin for the interconnect layers themselves.

Furthermore, the embodiments of the present invention provide a nonvolatile semiconductor memory and a method for fabricating the same that allows resolution of misalignment along the longer side of via contacts by changing the conventional circular shape of the via contacts to an oblong shape, which is capable of providing a lithography margin.

The nonvolatile semiconductor memory and the method for fabricating the same of the present invention using a damascene process for the data transfer line extended regions prevents an interconnect short (short-circuit) failure due to an increase in the widths of the interconnect extended regions caused by preprocessing for wet etching since direct connection of the via contacts to the lower contacts without forming the data transfer line extended regions to be connected to the lower contacts is possible, and thus the data transfer line extended regions aligned with a minimum pitch are unnecessary.

In addition, omission of the complex OPC process resolves the above-identified problem of lithographic margin for the interconnect layers themselves. The problem of misalignment along the longer side of via contacts can also be solved by changing the conventional circular shape of the via contacts to an oblong shape, which is capable of securing a sufficient lithographic margin.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as is conventional in the representation of circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order not to obscure the present invention in unnecessary detail.

Referring to the drawings, embodiments of the present invention are described below. The same or similar reference numerals are attached to identical or similar parts among the following drawings. The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the scope of the claims.

First Embodiment

Figure 9:
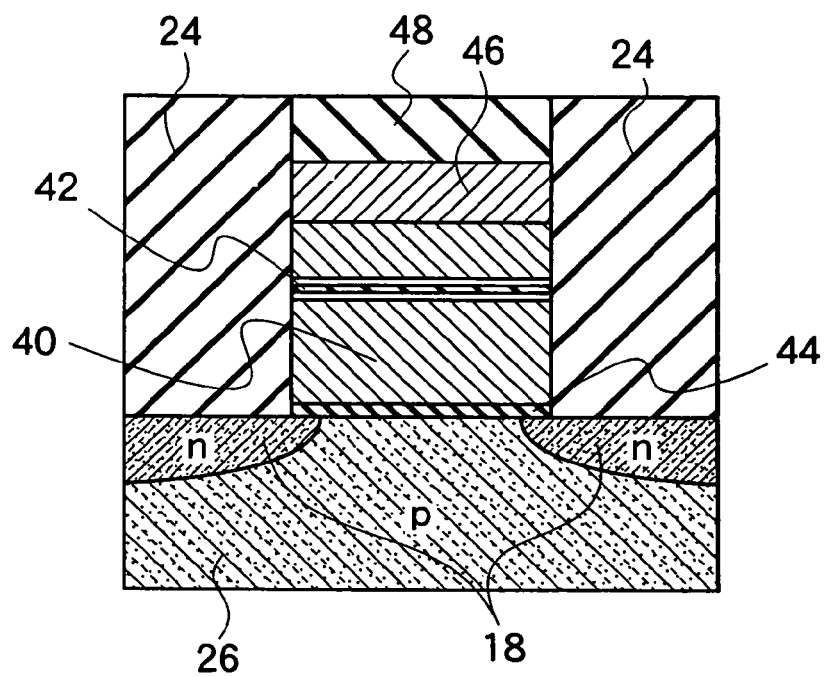
FIG. 9 is a schematic cross-sectional diagram of a floating-gate memory cell, which is used for a nonvolatile semiconductor memory of the present invention.
Figure 10:
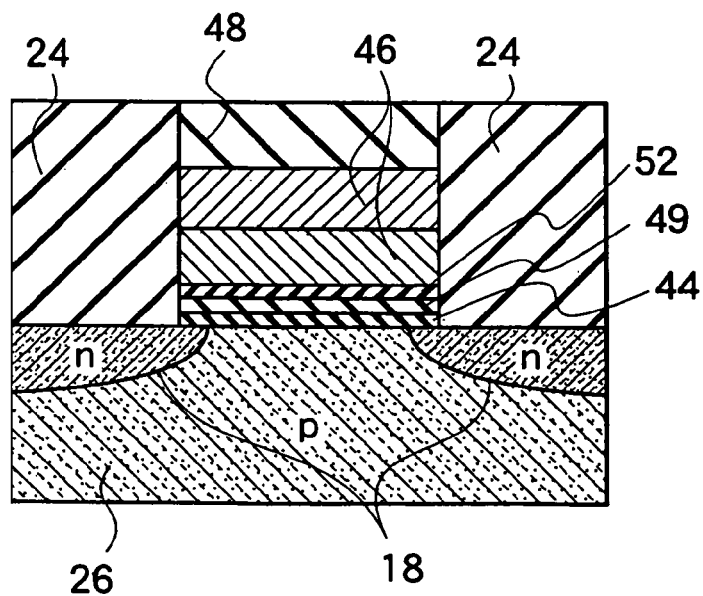
FIG. 10 is a schematic cross-sectional diagram of a MONOS memory cell, which is used for the nonvolatile semiconductor memory of the present invention.
Figure 11:
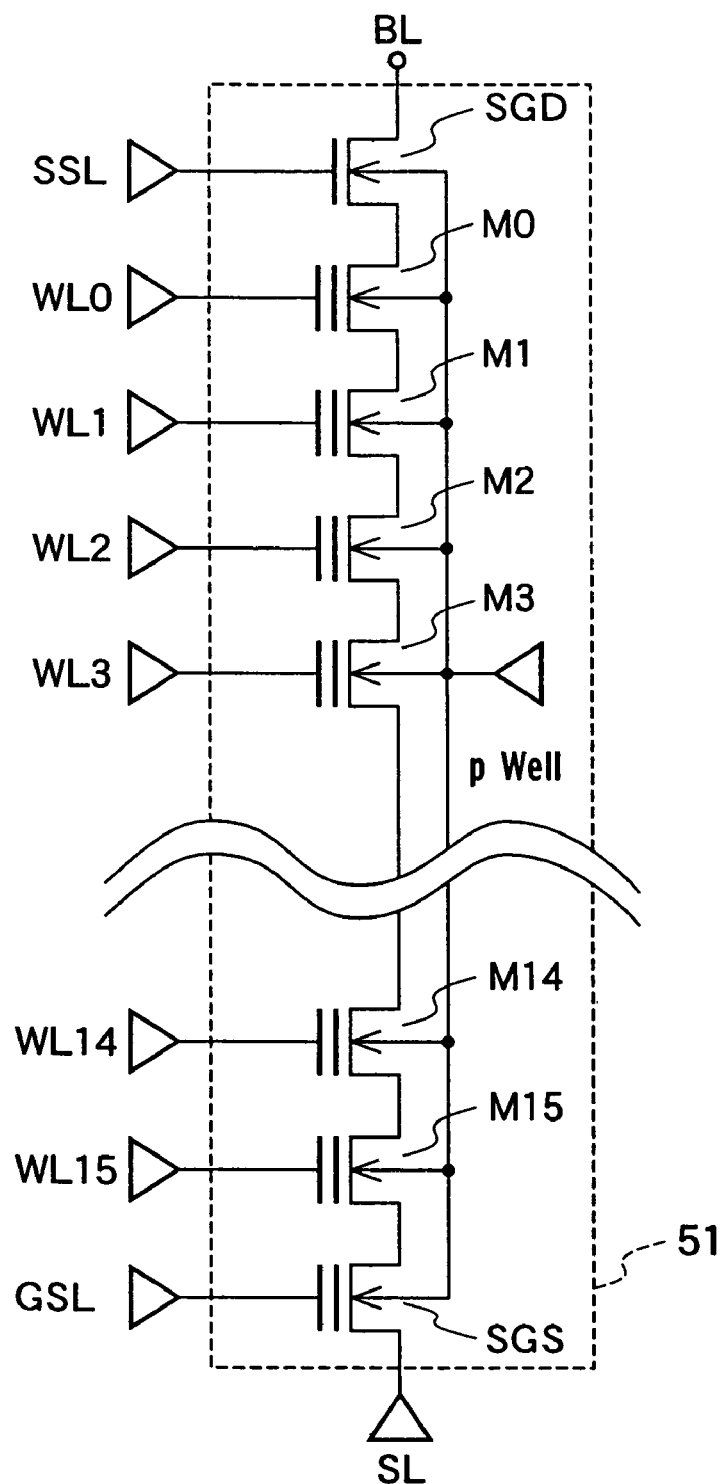
FIG. 11 is a circuit diagram of a NAND memory cell unit, which is used for the nonvolatile semiconductor memory of the present invention.
Figure 12:
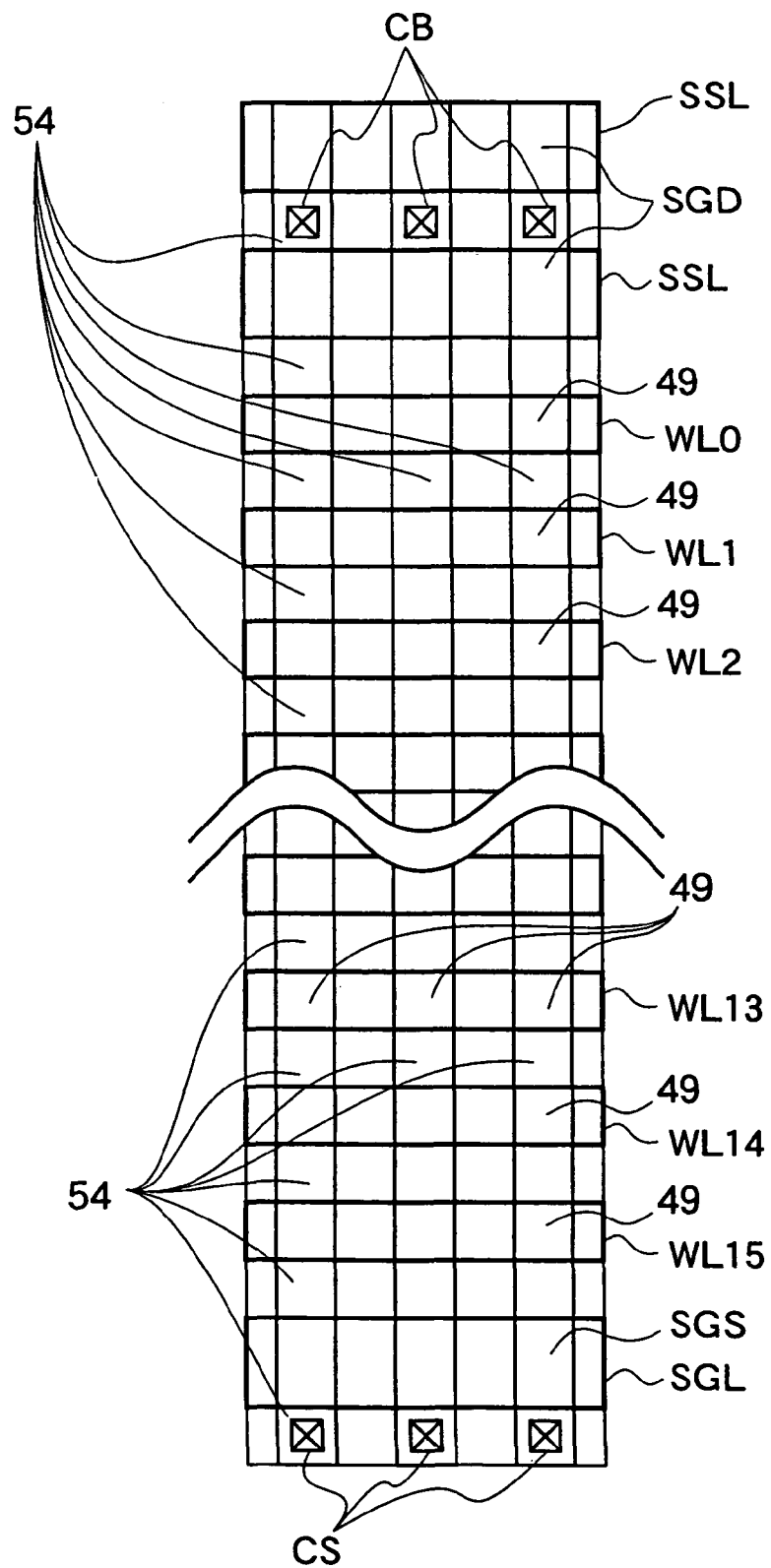
FIG. 12 is an aerial pattern diagram of a NAND memory cell, which is used for the nonvolatile semiconductor memory of the present invention.

A first embodiment of an exemplary NAND EEPROM, which is typical nonvolatile memory, is described while referencing FIGS. 9 through 16. FIGS. 11 and 12 show an equivalent circuit of a memory cell unit and an aerial view thereof, respectively; and FIGS. 9 and 10 are cross-sectional diagrams thereof. In the equivalent circuit diagram, while select transistors SGD and SGS have different configurations than the memory cells M0 to M15 (charge storage layers 49 are not included), charge storage layers 49 may be included as with the configurations of the memory cells M0 to M15.

As shown in FIG. 12, multiple memory cells M0 to M15 are connected in series via the select transistors SGS and SGD between the source line contacts CS and the data transfer line contacts CB. The memory cells M0 to M15 may be a type including a floating gate 40 as shown in FIG. 9, or a type including an insulator film with the charge storage layer 49 as shown in FIG. 10. As shown in FIG. 9, a memory cell with the floating gate 40 includes diffused layers 18 or a source and a drain region formed in a p-well region 26, a tunnel gate insulator film 44 formed on the p-well region 26, the floating gate 40, an inter-polysilicon insulator film 42, a control gate electrode 46, a mask insulator film 48, and interlayer insulator films 24.

On the other hand, as shown in FIG. 10, a memory cell with an insulator film made of the charge storage layer 49 includes diffused layers 18, or a source and a drain region formed in a p-well region 26, a tunnel gate insulator film 44 formed on the p-well region 26, the charge storage layer 49, a block insulator film 52, a control gate electrode 46, a mask insulator film 48, and interlayer insulator films 24.

In FIG. 10, a silicon nitride film, an oxynitride film, or an alumina film may be used as the charge storage layer 49. In this case, the memory cell includes the charge storage layer 49 to which charges are injected and from which charges are detrapped through the source or the drain diffused layer 18 or the well region 26 in accordance with the data to be stored. In addition, in the NAND structure of the first embodiment, multiple memory cells M0 to M15 are formed and can be re-written with data.

As shown in FIG. 11, those nonvolatile memory cells are connected in series, and one end of a source or a drain electrode 54 of the memory cell M0 is electrically connected to the select transistor SGD and a data transfer line BL via a data transfer line contact CB. On the other hand, one end of the source or the drain electrode 54 of the memory cell M15 is electrically connected to the select transistor SGS and a common source line SL via a source line contact CS. Moreover, each of the transistors is formed on the same p-well region 26. In addition, the respective memory cell control electrodes are connected to the data select lines, which are referred to as WL0 to WL15, respectively. Furthermore, to select a single memory cell block from among multiple NAND memory cell units 51 aligned along the data transfer line BL and connect the selected memory cell to the data transfer line BL, the control electrode of the select transistor SGD is connected to a block select line SSL. In addition, the control electrode of the select transistor SGS is connected to a block select line GSL, forming a so-called NAND memory cell unit. In this case, it is desirable to establish a high-density structure where, the memory cell block has at least one block select line SSL and one block select line GSL, which are formed along the data select lines WL0 to WL15. In addition, a plurality of the memory cells to be connected to the data transfer line and the data select lines should be provided, more specifically, $2^n$ (n denotes a positive integer) is desirable for decoding addresses.

Furthermore, each NAND memory cell unit 51 in FIG. 11 is formed adjacent to each other in a matrix along the data transfer line BL and the data select lines WL0 to WL15. More specifically, as shown in FIG. 12, similar memory cell arrays are formed horizontally, and share the SSL, the WL0 to WL15, the GSL, and the SL. In addition, the similar memory cell arrays are formed vertically as shown in FIG. 12, and are connected to memory cell arrays formed on the upper area via the data transfer line (BL). With such layout, each data transfer line BL running between the adjacent memory cells, and each of the interconnects of the data transfer line extended regions 14 must be connected to the n-type drain diffusion layer of corresponding select transistor. SGD for memory cells so that individual pieces of data can be stored in the corresponding memory cells.

Memory cells are covered with a barrier insulator film 22, such as a silicon nitride film, a silicon oxynitride film, or an alumina film, which is used as an etching stopper that prevents the data transfer line contacts CB and the source line contacts CS from invading the device isolating trenches. In the following embodiments, to clarify a point of the invention, only the structure beneath the via contacts 16 is illustrated in an aerial view diagram and cross-sectional diagrams cut along the lines II-II and III-III. The aerial perspective view diagram shows a structure of contacts CB and CS and part of an interconnect to clarify an overlapping layer structure.

Figure 13:
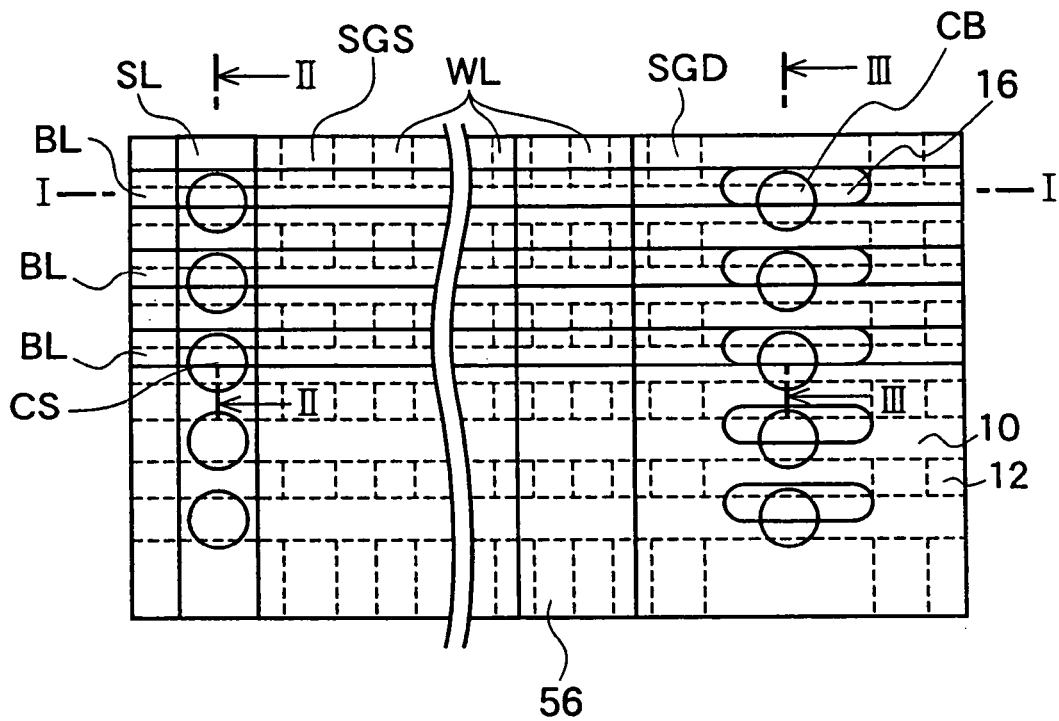
FIG. 13 is an aerial pattern diagram of a nonvolatile semiconductor memory according to a first embodiment of the present invention.
Figure 14:
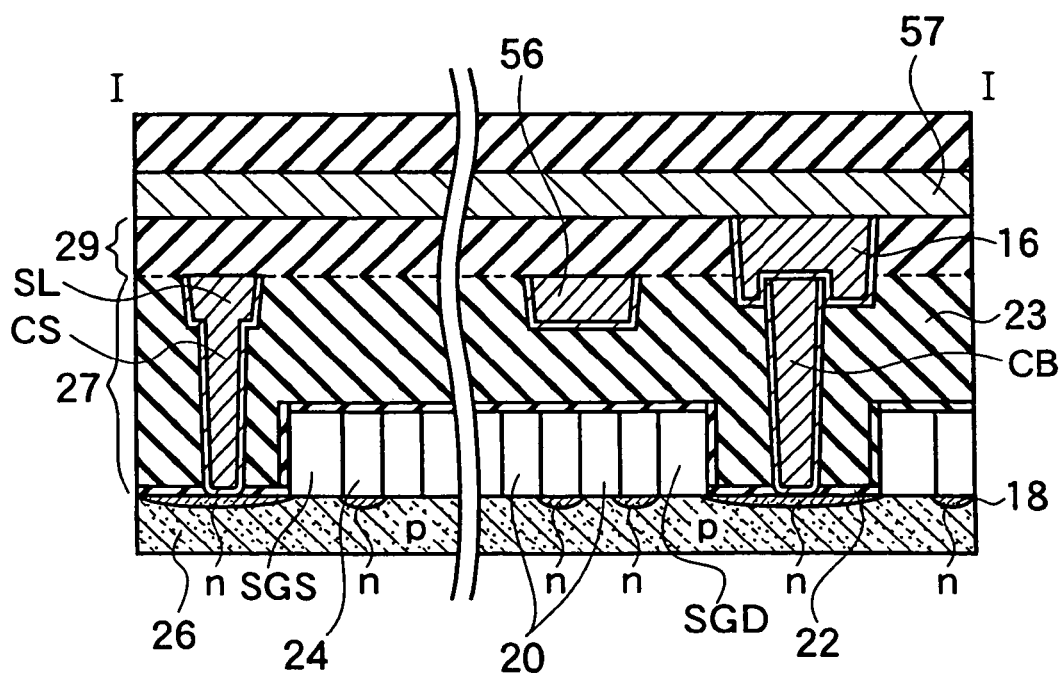
FIG. 14 is a schematic cross-sectional diagram cut along the line I-I of FIG. 13.
Figure 15:
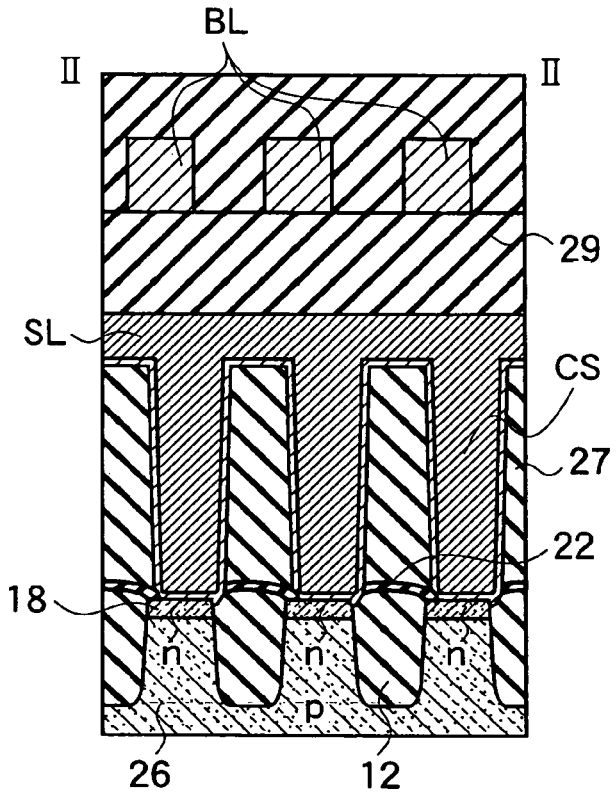
FIG. 15 is a schematic cross-sectional diagram cut along the line II-II of FIG. 13.
Figure 16:
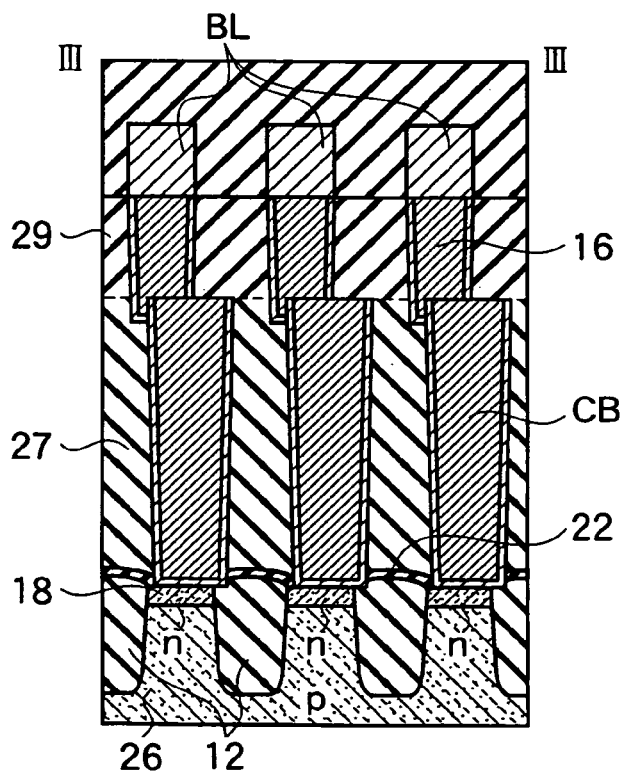
FIG. 16 is a schematic cross-sectional diagram cut along the line III-III of FIG. 13.
Figure 17:
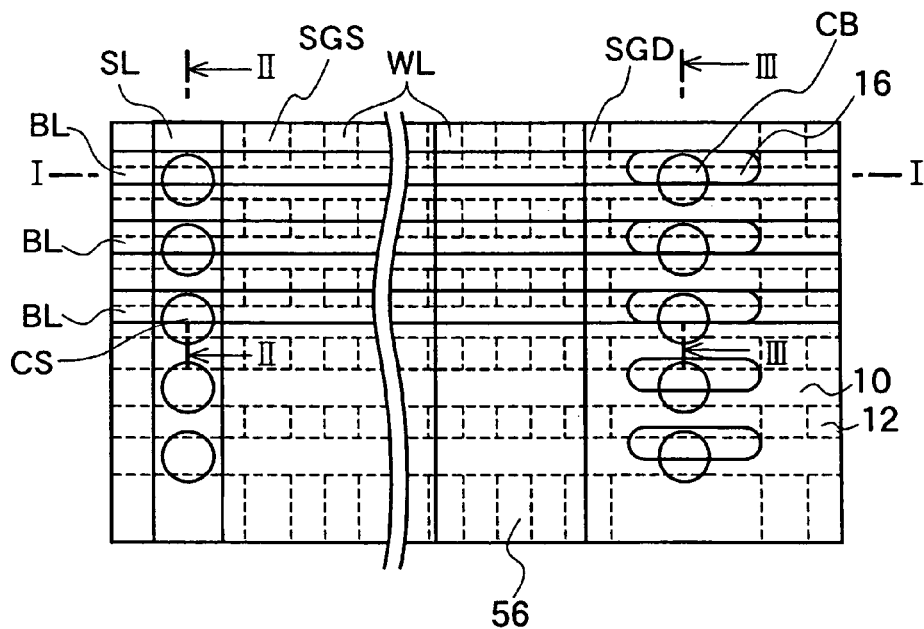
FIG. 17 is an aerial pattern diagram of a nonvolatile semiconductor memory according to a second embodiment of the present invention.

As shown in FIG. 13, subregions in the device regions 10 where the data transfer line contacts CB are to be formed are patterned in parallel to the second interconnects (BL) 57, and patterning for transistors SGD and SGS orthogonal thereto is carried out.

As shown in detail in FIGS. 13 through 16, the nonvolatile semiconductor memory according to the first embodiment of the present invention includes a first semiconductor layer 26 formed from the well region 26 or a semiconductor substrate, at least three adjacent second semiconductor regions 10, which are formed on the first semiconductor layer 26 and isolated by device isolating regions 12 so that the column direction is similar to the longitudinal bit line direction, first interlayer insulator films 27, which are formed above the first semiconductor layer 26 in which those second semiconductor regions 10 are formed, at least three lower conductive plugs CB, which are filled in the first interlayer insulator films 27 and connected to the second semiconductor regions 10, respectively, a first interconnect 56, which is filled in the first interlayer insulator films 27, second interlayer insulator films 29, which are formed on the lower conductive plugs CB and the first interlayer insulator films 27, at least three upper conductive plugs (via contacts) 16, which are filled in the second interlayer insulator films 29 and formed contacting with the tops and the sides of the lower conductive plugs CB, and at least three second interconnects (BL) 57, which are formed on the second interlayer insulator films 29 contacting with the upper conductive plugs 16, respectively. The second interconnects (BL) 57 are formed in parallel along the column direction, and the first interconnect 56 is formed along a row direction orthogonal to the column direction.

In addition, source line contact plugs (CS), which are filled in the first interlayer insulator films 27 and made of the same material as the lower conductive plugs CB, and the source line SL, which is filled in the first interlayer insulator films 27 and formed on the source line contact plugs (CS) through a damascene process, may be included. The tops of the lower conductive plugs CB make direct contact with the respective upper conductive plugs 16, and the tops of the upper conductive plugs 16 make direct contact with the second interconnects (BL) 57. In addition, the lower conductive plugs CB are arranged in series in a row direction orthogonal to the column direction. The first interconnect 56 is formed through the damascene process and filled in the interconnect trench formed in the first interlayer insulator films 27, and at least the upper regions on the lower conductive plugs CB, which are made of the same film material as the first interconnect 56, are buried and formed in the first interlayer insulator films 27.

Each of the first interlayer insulator films 27 includes a lower interlayer insulator film (barrier insulator film) 22 such as a silicon nitride film, a silicon oxynitride film, or an alumina film, and an upper interlayer insulator film 23 such as a silicon oxide film formed to border the lower interlayer insulator film 22, a silicon nitride film, silicade glass such as BPSG or PSG, or a low dielectric constant interlayer insulator film such as HSQ, MSQ, or SiLK. The diameter of each of the upper conductive plugs 16 in the column direction is longer than the diameter of each of the lower conductive plugs CB in the column direction; and the diameter of each of the upper conductive plugs 16 in a row direction orthogonal to the column direction is shorter than the diameter of each of the lower Conductive plugs CB in a row direction orthogonal to the column direction.

The nonvolatile semiconductor memory according to the first embodiment of the present invention is a rewritable nonvolatile semiconductor memory, which is formed on the second semiconductor regions 10 and has multiple memory cells M0 to M15 with the respective charge storage layers 49 to which charges are injected and from which charges are detrapped in accordance with the data to be stored. The device further includes a NAND memory cell unit 51 configured with multiple memory cell elements connected in series, and the select transistors SGD and SGS, which electrically connect one end of the source or the drain electrode of the memory cell to corresponding lower conductive plug CB. The memory cells M0 to M15 are field effective transistors, which are formed on the first conductive well region 26 and include at least single charge storage layer 49 and control gate electrodes, which become data select lines WL0 to WL15. A memory cell array is formed by arranging multiple memory cells M0 to M15 in parallel to each other in a row direction orthogonal to the column direction and the data select lines WL0 to WL15 orthogonal to the second interconnect (BL) 57. Alternatively, the first interconnect 56 may be formed on the source or the drain electrode, which connects the select transistors SGD and SGS to the memory cells M0 and M15 via the first interlayer insulator films 27.

Of the four sides of each of the via contacts (upper conductive plugs) 16, two sides along the line II-II are formed so as to extend across the two sides of each lower contact along the line III-III, and the other two sides are formed between linearly aligned contacts. In addition, the contacts and via contacts 16 are filled in with the same material. The filling material is a metal such as tungsten, aluminum, or copper, and is filled in via a barrier metal such as Ti, Ta, TaN, or TiN.

With the first embodiment, since a pattern for each via contact 16, which does not have the conventional circular shape but has a linear shape at least three times longer than the contact diameter (hereafter, called 'short diameter') along the line II-II shown in FIG. 13 is formed along the line I-I (hereafter, long diameter) using lithography processing, a decrease in the lithographic margin due to miniaturization of the distance between the contacts along the line III-III is improved. In addition, since the shape of each via contact 16 is linearly extended along the line I-I approximately three times longer than the circular shape, and a narrower than the shape contact aperture width along the line III-III is formed, misalignment along the line II-II with the data transfer line contacts CB, which are lower contacts, is improved.

(Fabrication Method)

An exemplary method for fabricating the semiconductor memory according to the first embodiment of the present invention is described while referencing FIGS. 21 through 60. In the following description, however, the method for fabricating the semiconductor memory according to the first embodiment of the present invention is not limited in this order. In the following description, while the via contacts 16 formed at the lower contacts are taken as an example, the foundation can be any type of a conductive region that allows electrical connection with the via contacts 16. Directly connecting the via contacts 16 between the interconnect layers to the via contacts 16 in the upper layer using a metallic interconnect foundation can also be made using such a method. Note that the conductors of the data transfer line contacts CB may be generally considered as 'lower conductive plugs', and the via contacts 16 as 'upper conductive plugs' in all of the following embodiments.

(a) To begin with, a device isolating region 12 made of a silicon oxide film or a silicon nitride film is formed with a depth of, for example, 0.1 to 0.4 ,.m on the first conductive semiconductor substrate or the well region 26 with a depth of 0.3 to 2 ,.m. The depth of that device isolating region 12 allows isolation of the adjacent second conductive semiconductor regions via that device isolating region. In the drawings, while the first conductive semiconductor region denotes a p-type, and the second conductive one denotes an n-type, naturally, the first conductive semiconductor region may alternatively be an n-type and the second conductive semiconductor region may be a p-type. With such a configuration, the device isolating regions 12 are formed with the same pitch as the contacts to be formed later along the line I-I, and impurities with inverse conductivity to the semiconductor substrate 26 are doped into the semiconductor surface with a depth of, for example, 0.05 to 0.3 ,.m. This allows connection of the n-type regions 18 on the semiconductor surface isolated by the device isolating regions to respective interconnects (direct connection to the via contacts in the upper layer, according to the present invention), and electrical isolation of multiple n-type regions 18 on the semiconductor surface. In addition, such a contact aperture is a problem for a design rule of 0.13 ,.m or less with which a KrF or an ArF exposure device makes a pattern using a phase shift mask. Therefore, it is desirable that the pitch of the contacts be 0.13 ,.m×2 F=0.26 ,.m or less. Furthermore, as shown in FIG. 21 through FIG. 60, it is desirable that at least three data transfer line contacts CB be arranged in a straight line adjacent to each other to reduce the surface area occupied by the data transfer line contacts CB and shorten the length occupied in a direction orthogonal to the data transfer lines BL.

(b) Next, a barrier insulator film 22 such as a silicon nitride film, a silicon oxide film, or an alumina film is deposited with a thickness of 1 to 500 nm. In this case, excessive etching due to lack of etching control when forming the contacts CB causes the contacts CB to invade the device isolating region 12 and creates a problem that the withstand voltage between the p-well region 26 and the contacts CB cannot be secured. On the other hand, insufficient etching when forming the contacts CB creates a problem of an increase in the contact resistance between the n-well regions 18 and the data transfer line contacts CB. Therefore, when forming the contacts CB, etching with sufficient selectivity for the barrier insulator film 22 relative to the interlayer insulator film 27, or with an the etching speed for the barrier insulator film 22 being slower than that for the interlayer insulator film 27, and then etching the barrier insulator film 22 reduces the influence of changes in film thickness of the interlayer insulator film 27 when etching the contacts. Alternatively, a silicon oxide film with a thickness of 1 to 50 nm may be formed on the semiconductor surface through oxidation or deposition before depositing this barrier insulator film 22. Furthermore, an interlayer insulator film made of a silicon oxide film, a silicon nitride film, silicade glass such as BPSG or PSG, or a low dielectric constant interlayer insulator film such as HSQ, MSQ, or SiLK, is then deposited on the resulting surface to a thickness of approximately 10 to 1000 nm (FIG. 21 through FIG. 24). The material of the barrier insulator film 22 needs to have a sufficient etch selectivity relative to the first interlayer insulator films 27. The thickness of the barrier insulator film 22 needs to be approximately 10 to 1000 nm; where this thickness, the etch selectivity, and the thickness of the interlayer insulator film 27 provide a sufficient fabrication margin.

(c) Next, patterning for the data transfer line contacts CB is carried out by lithography, and patterning for the interlayer insulator films 27 is carried out using anisotropic etching (FIG. 25 through FIG. 28). The etching condition should be a sufficient selectivity relative to a resist 58 and the barrier insulator film 22.

(d) Next, the barrier insulator film 22 is subjected to anisotropic etching after removing the resist (FIG. 29 through FIG. 32). In this case, it is desirable that the etching condition have a sufficient selectivity relative to the semiconductor substrate 26 and the interlayer insulator film 27, which allows omission of wet-processing for peeling off the barrier insulator film 22 to be carried out as post processing, so as to prevent excessive etching relative to the first interlayer insulator film 27, and to maintain a forward tapered-shape and a small contact diameter.

Thereafter, the resistivity of the n-type regions 18 at the contact portions may be decreased by ion implantation techniques of impurity ions, such as phosphorus (P) or arsenic (As) having a dosage of between $1\times10^{13}$ cm$^2$ and $1\times10^{16}$ cm$^{-2}$.

(e) Next, patterning for the source line contacts CS is carried out by lithography, and patterning for the first interlayer insulator films 27 is carried out using anisotropic etching (FIG. 33 through FIG. 36). At this time, it is important to fill and protect the interior of the previously formed data transfer line contacts CB with the resist 58. Therefore, the etching condition should have a sufficient selectivity relative to the resist 58 and the barrier insulator film 22.

Figure 38:
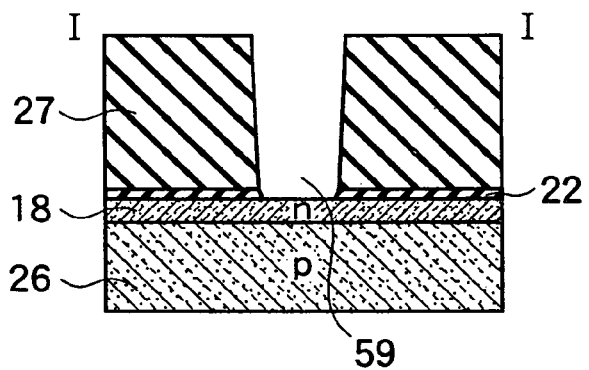
FIG. 38 is a schematic cross-sectional diagram cut along the line I-I of FIG. 37.
Figure 39:
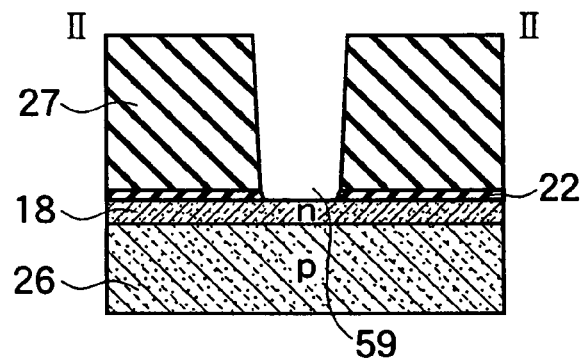
FIG. 39 is a schematic cross-sectional diagram cut along the line II-II of FIG. 37.
Figure 40:
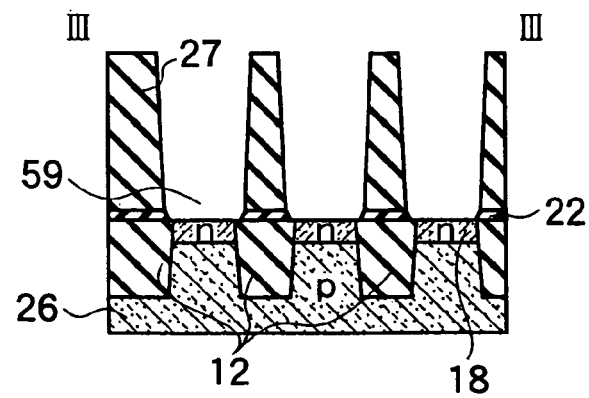
FIG. 40 is a schematic cross-sectional diagram cut along the line III-III of FIG. 37.
Figure 41:
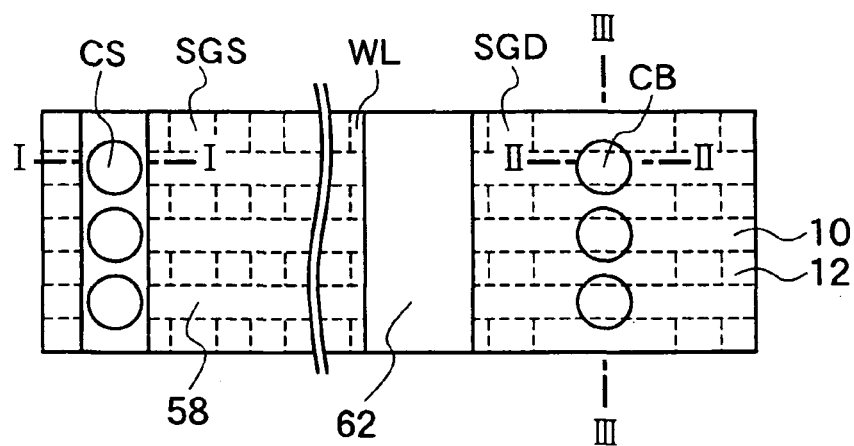
FIG. 41 is an aerial pattern diagram for describing a process of the method for fabricating the nonvolatile semiconductor memory according to the first embodiment of the present invention.
Figure 42:
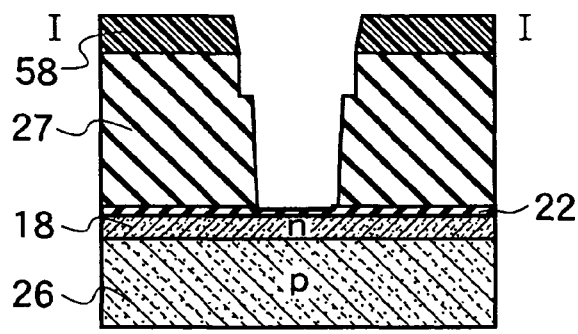
FIG. 42 is a schematic cross-sectional diagram cut along the line I-I of FIG. 41.
Figure 43:
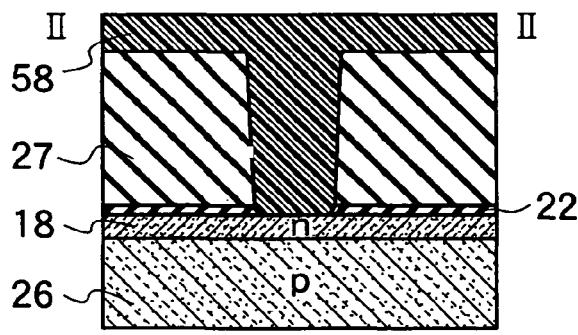
FIG. 43 is a schematic cross-sectional diagram cut along the line II-II of FIG. 41.
Figure 44:
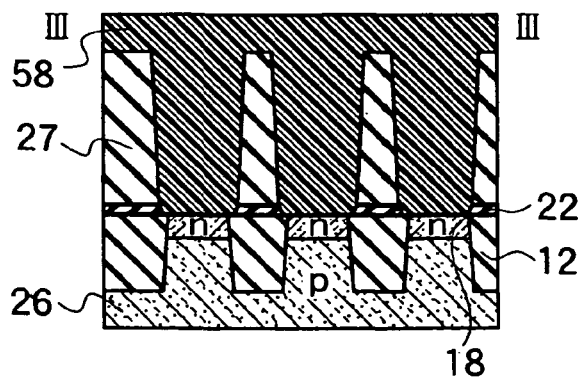
FIG. 44 is a schematic cross-sectional diagram cut along the line III-III of FIG. 41.
Figure 45:
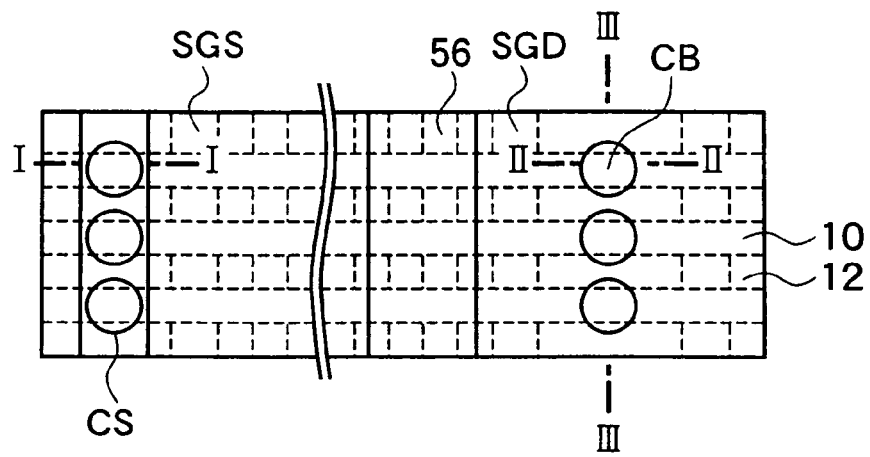
FIG. 45 is an aerial pattern diagram for describing a process of the method for fabricating the nonvolatile semiconductor memory according to the first embodiment of the present invention.
Figure 46:
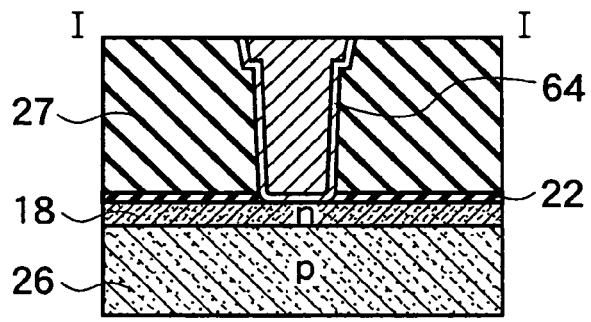
FIG. 46 is a schematic cross-sectional diagram cut along the line I-I of FIG. 45.
Figure 47:
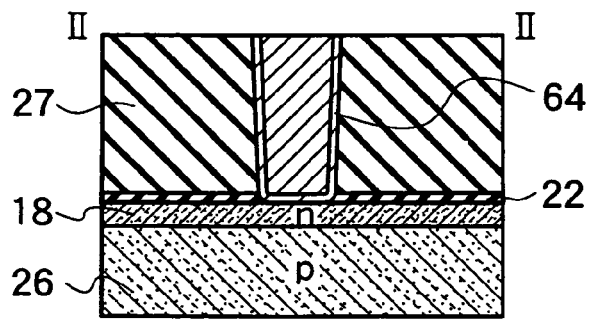
FIG. 47 is a schematic cross-sectional diagram cut along the line II-II of FIG. 45.
Figure 48:
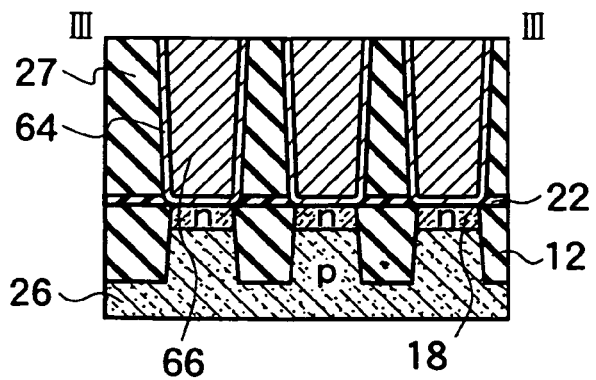
FIG. 48 is a schematic cross-sectional diagram cut along the line III-III of FIG. 45.
Figure 49:
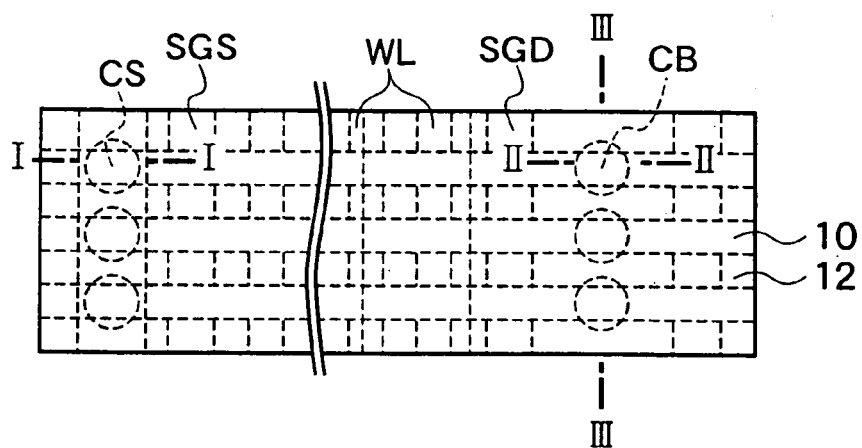
FIG. 49 is an aerial pattern diagram for describing a process of the method for fabricating the nonvolatile semiconductor memory according to the first embodiment of the present invention.
Figure 50:
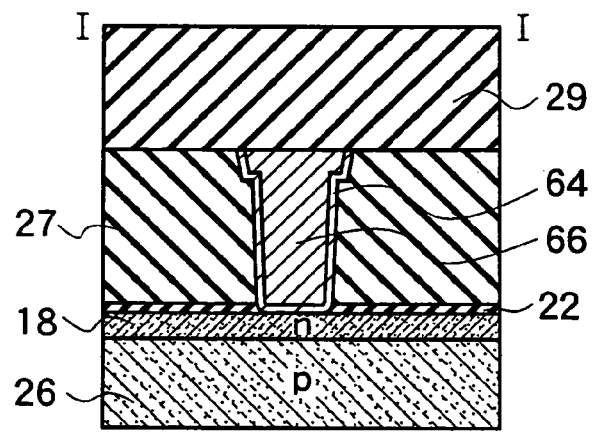
FIG. 50 is a schematic cross-sectional diagram cut along the line I-I of FIG. 49.
Figure 51:
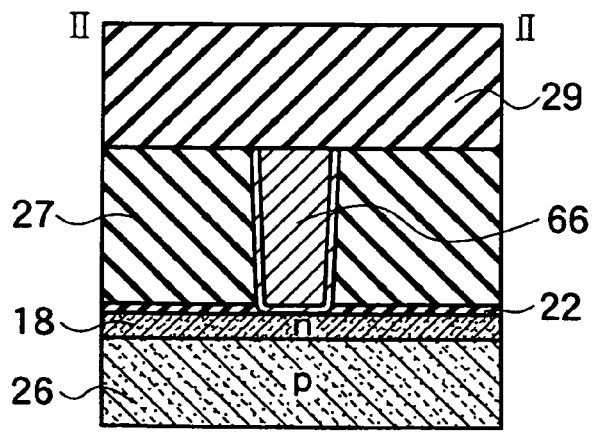
FIG. 51 is a schematic cross-sectional diagram cut along the line II-II of FIG. 49.
Figure 52:
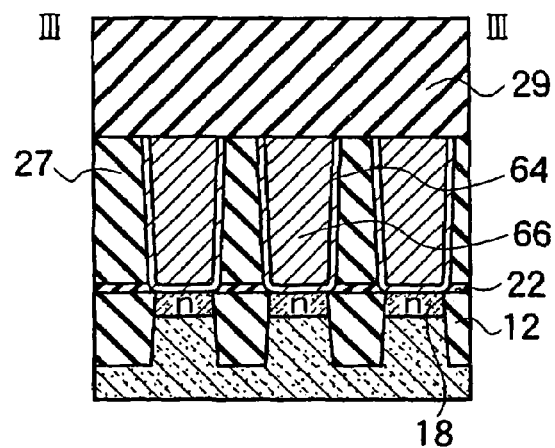
FIG. 52 is a schematic cross-sectional diagram cut along the line III-III of FIG. 49.
Figure 53:
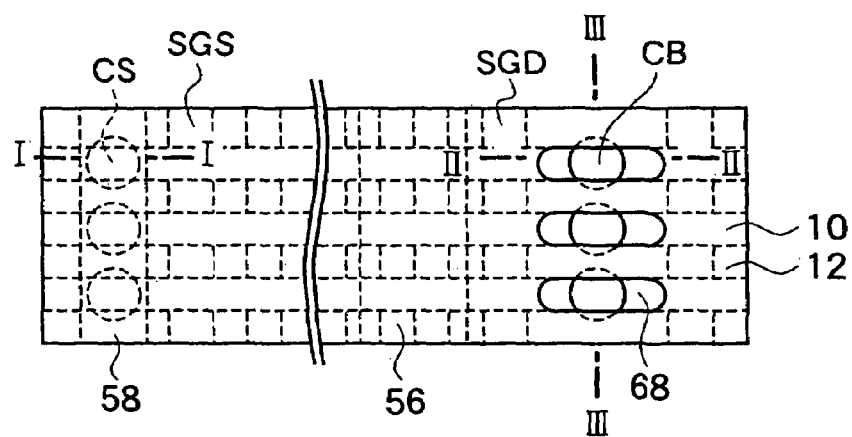
FIG. 53 is an aerial pattern diagram for describing a process of the method for fabricating the nonvolatile semiconductor memory according to the first embodiment of the present invention.
Figure 54:
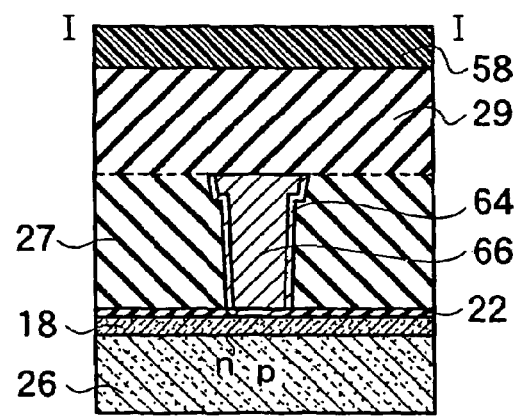
FIG. 54 is a schematic cross-sectional diagram cut along the line I-I of FIG. 53.
Figure 55:
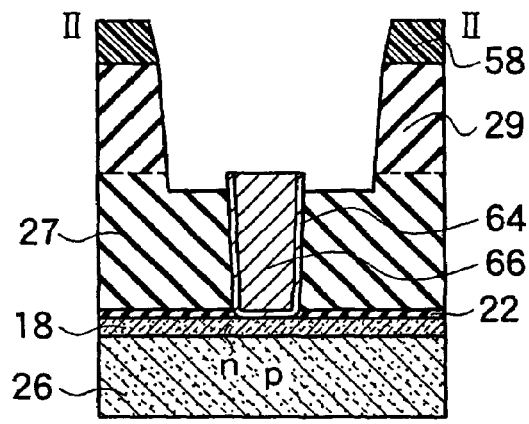
FIG. 55 is a schematic cross-sectional diagram cut along the line II-II of FIG. 53.
Figure 56:
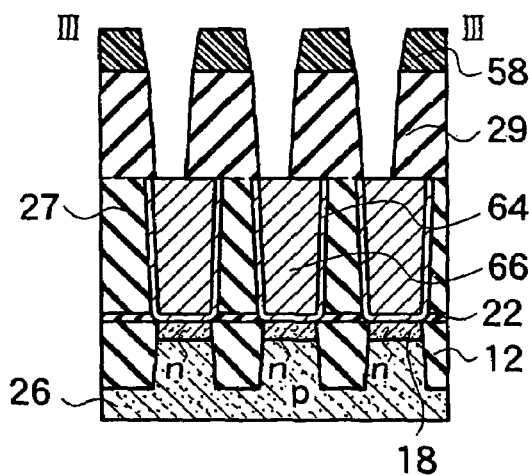
FIG. 56 is a schematic cross-sectional diagram cut along the line III-III of FIG. 53.
Figure 57:
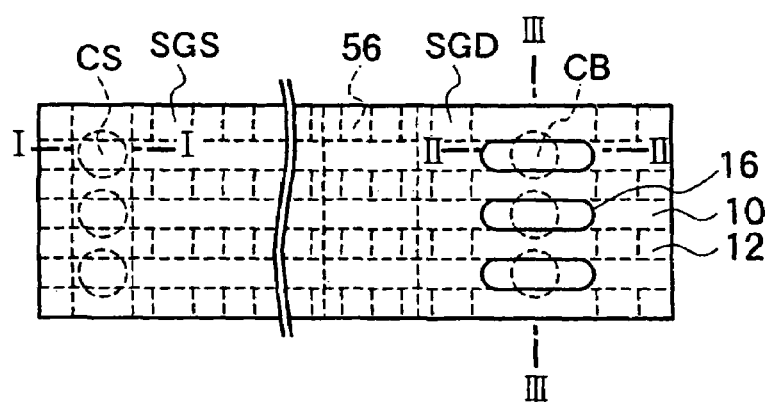
FIG. 57 is an aerial pattern diagram for describing a process of the method for fabricating the nonvolatile semiconductor memory according to the first embodiment of the present invention.
Figure 58:
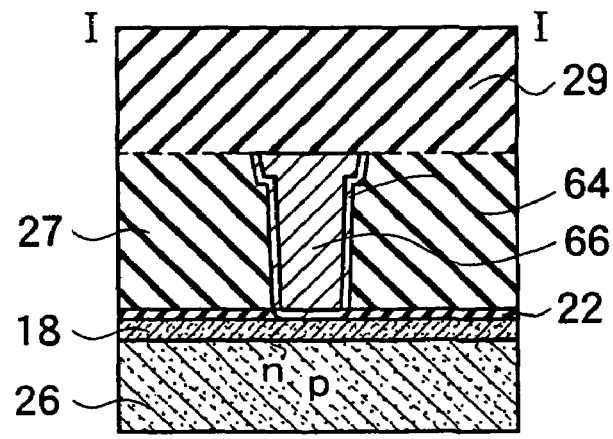
FIG. 58 is a schematic cross-sectional diagram cut along the line I-I of FIG. 57.
Figure 59:
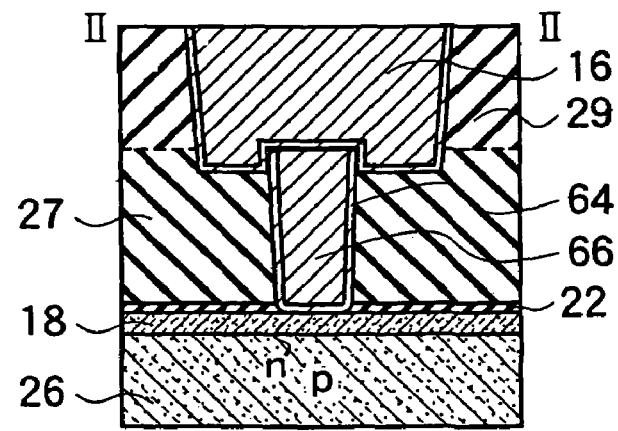
FIG. 59 is a schematic cross-sectional diagram cut along the line II-II of FIG. 57.
Figure 60:
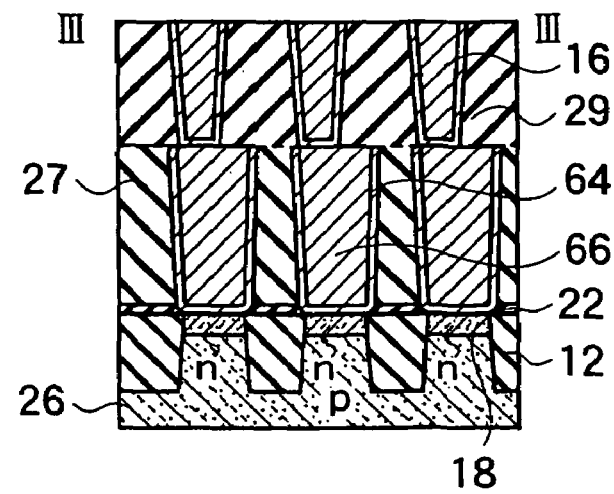
FIG. 60 is a schematic cross-sectional diagram cut along the line III-III of FIG. 57.
Figure 61:
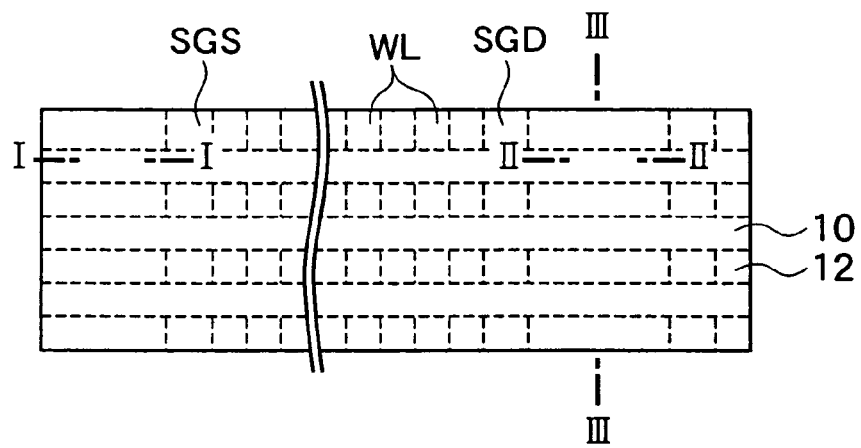
FIG. 61 is an aerial pattern diagram for describing a process of a method for fabricating the nonvolatile semiconductor memory according to the second embodiment of the present invention.
Figure 62:
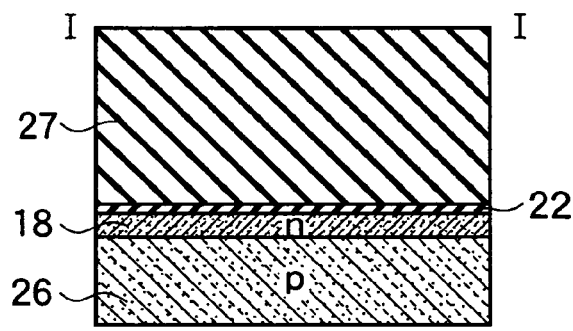
FIG. 62 is a schematic cross-sectional diagram cut along the line I-I of FIG. 61.
Figure 63:
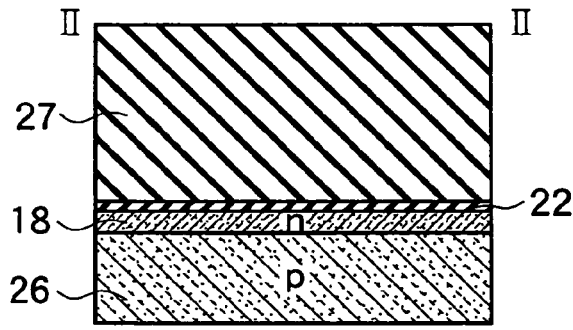
FIG. 63 is a schematic cross-sectional diagram cut along the line II-II of FIG. 61.
Figure 64:
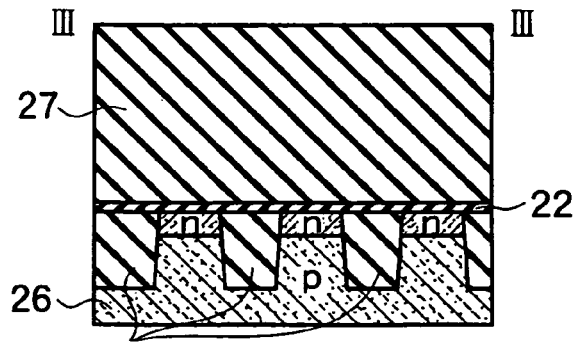
FIG. 64 is a schematic cross-sectional diagram cut along the line III-III of FIG. 61.
Figure 65:
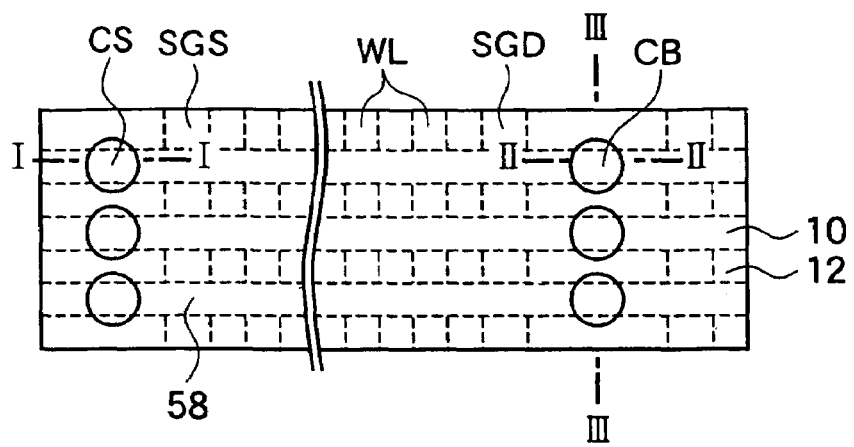
FIG. 65 is an aerial pattern diagram for describing a process of the method for fabricating the nonvolatile semiconductor memory according to the second embodiment of the present invention.
Figure 66:
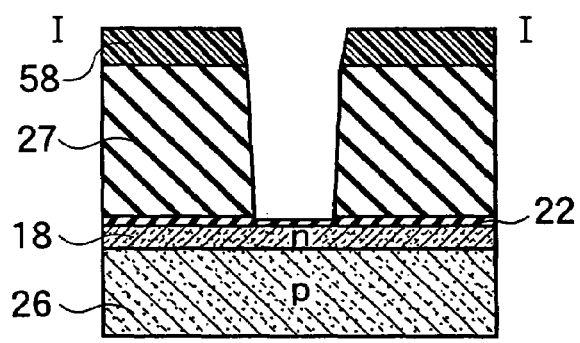
FIG. 66 is a schematic cross-sectional diagram cut along the line I-I of FIG. 65.
Figure 67:
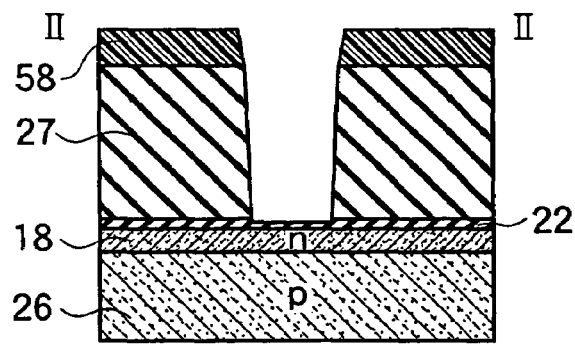
FIG. 67 is a schematic cross-sectional diagram cut along the line II-II of FIG. 65.
Figure 68:
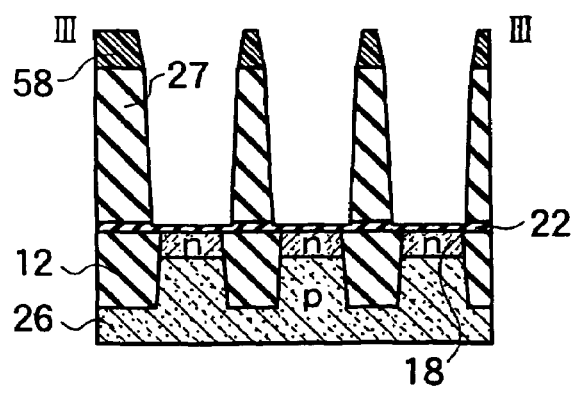
FIG. 68 is a schematic cross-sectional diagram cut along the line III-III of FIG. 65.
Figure 69:
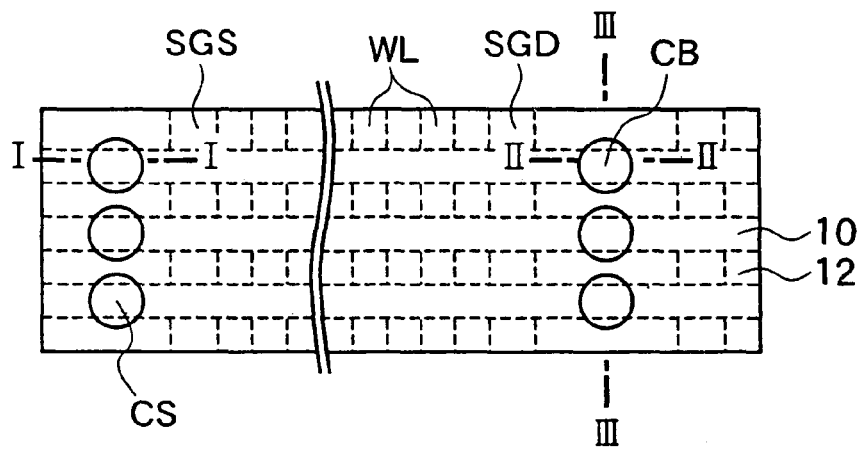
FIG. 69 is an aerial pattern diagram for describing a process of the method for fabricating the nonvolatile semiconductor memory according to the second embodiment of the present invention.
Figure 70:
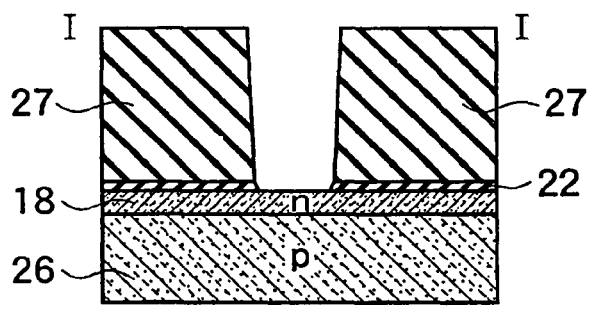
FIG. 70 is a schematic cross-sectional diagram cut along the line I-I of FIG. 69.
Figure 71:
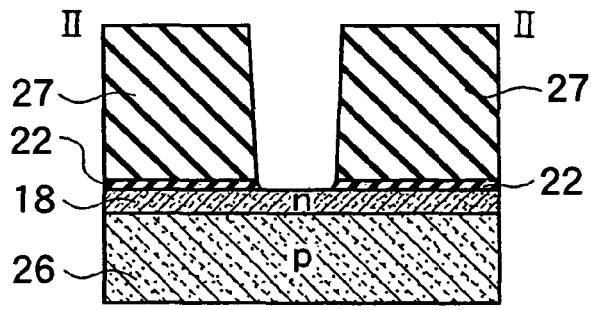
FIG. 71 is a schematic cross-sectional diagram cut along the line II-II of FIG. 69.
Figure 72:
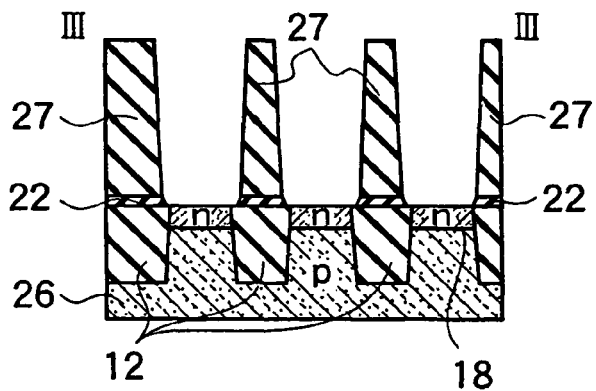
FIG. 72 is a schematic cross-sectional diagram cut along the line III-III of FIG. 69.
Figure 73:
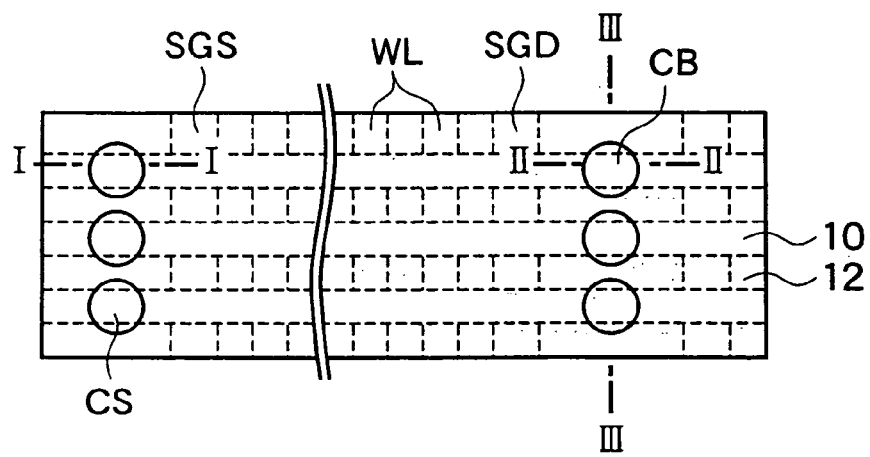
FIG. 73 is an aerial pattern diagram for describing a process of the method for fabricating the nonvolatile semiconductor memory according to the second embodiment of the present invention.
Figure 74:
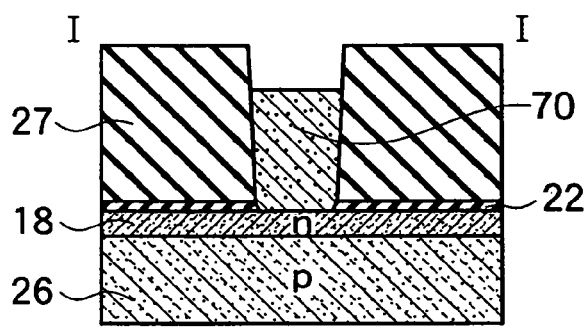
FIG. 74 is a schematic cross-sectional diagram cut along the line I-I of FIG. 73.
Figure 75:
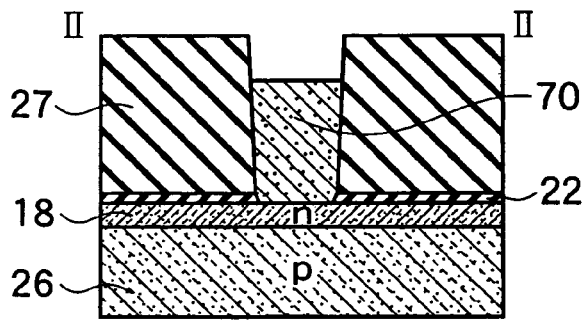
FIG. 75 is a schematic cross-sectional diagram cut along the line II-II of FIG. 73.
Figure 76:
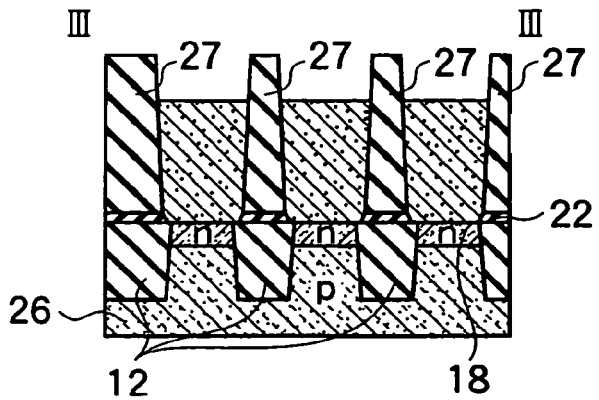
FIG. 76 is a schematic cross-sectional diagram cut along the line III-III of FIG. 73.
Figure 77:
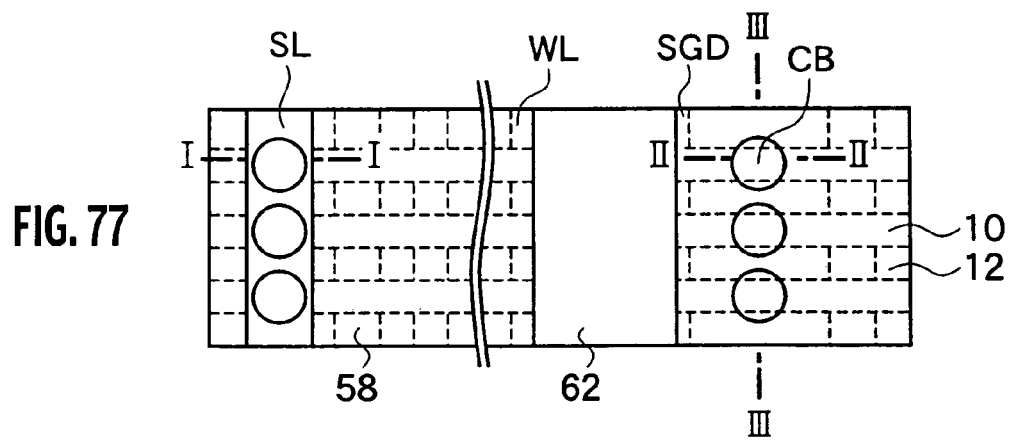
FIG. 77 is an aerial pattern diagram for describing a process of the method for fabricating the nonvolatile semiconductor memory according to the second embodiment of the present invention.
Figure 78:
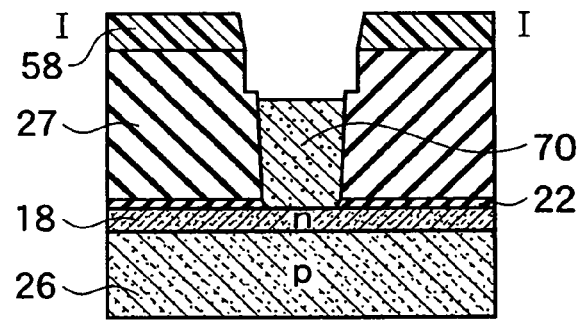
FIG. 78 is a schematic cross-sectional diagram cut along the line I-I of FIG. 77.
Figure 79:
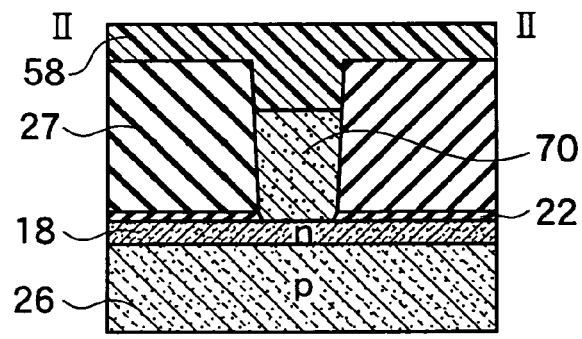
FIG. 79 is a schematic cross-sectional diagram cut along the line II-II of FIG. 77.
Figure 80:
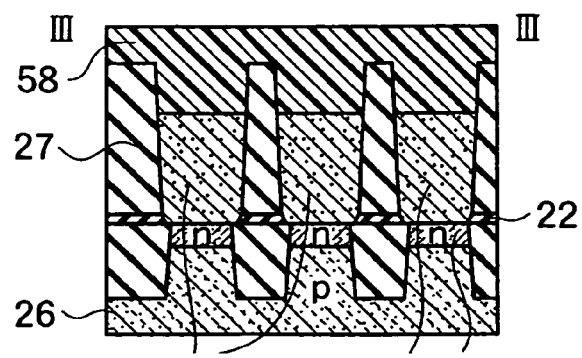
FIG. 80 is a schematic cross-sectional diagram cut along the line III-III of FIG. 77.
Figure 81:
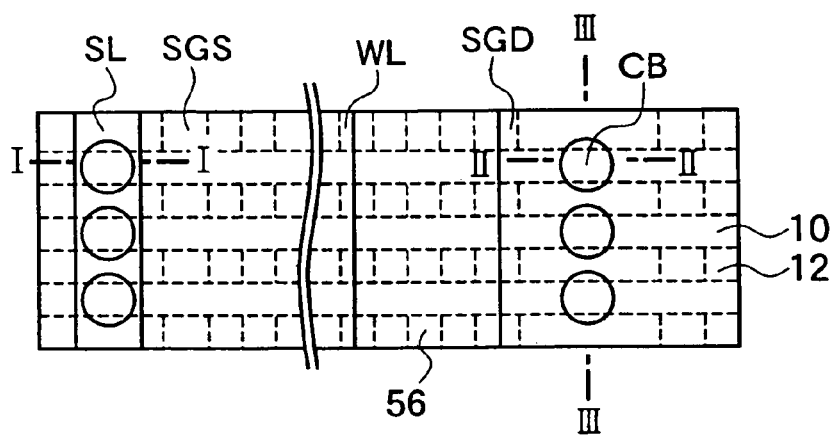
FIG. 81 is an aerial pattern diagram for describing a process of the method for fabricating the nonvolatile semiconductor memory according to the second embodiment of the present invention.
Figure 82:
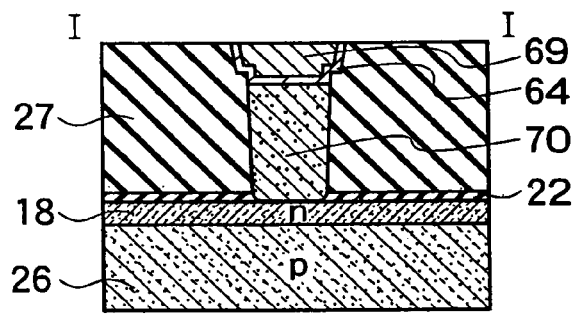
FIG. 82 is a schematic cross-sectional diagram cut along the line I-I of FIG. 81.
Figure 83:
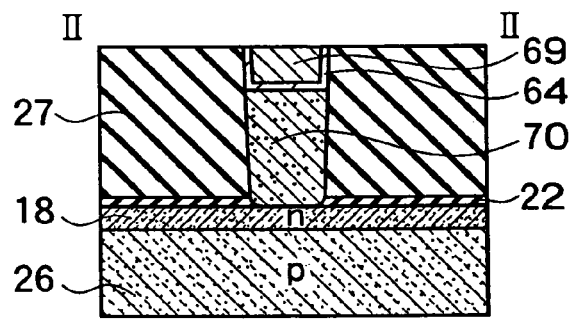
FIG. 83 is a schematic cross-sectional diagram cut along the line II-II of FIG. 81.
Figure 84:
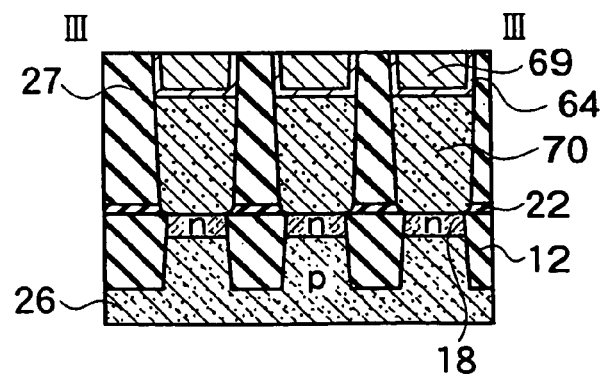
FIG. 84 is a schematic cross-sectional diagram cut along the line III-III of FIG. 81.
Figure 85:
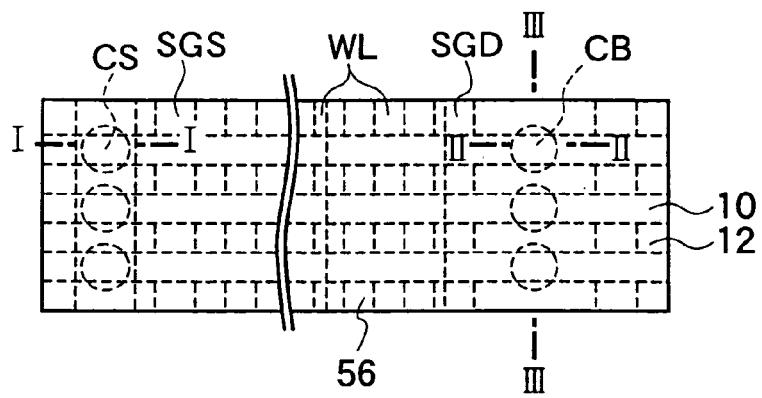
FIG. 85 is an aerial pattern diagram for describing a process of the method for fabricating the nonvolatile semiconductor memory according to the second embodiment of the present invention.
Figure 86:
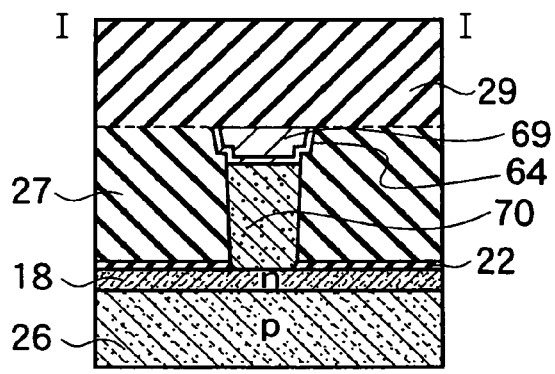
FIG. 86 is a schematic cross-sectional diagram cut along the line I-I of FIG. 85.
Figure 87:
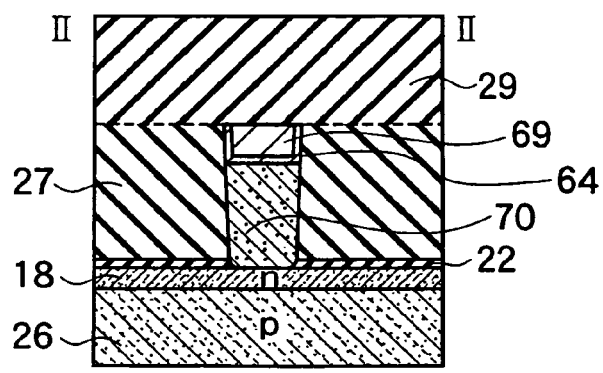
FIG. 87 is a schematic cross-sectional diagram cut along the line II-II of FIG. 85.
Figure 88:
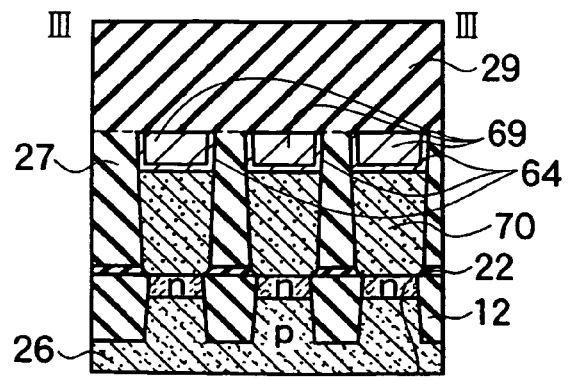
FIG. 88 is a schematic cross-sectional diagram cut along the line III-III of FIG. 85.
Figure 89:
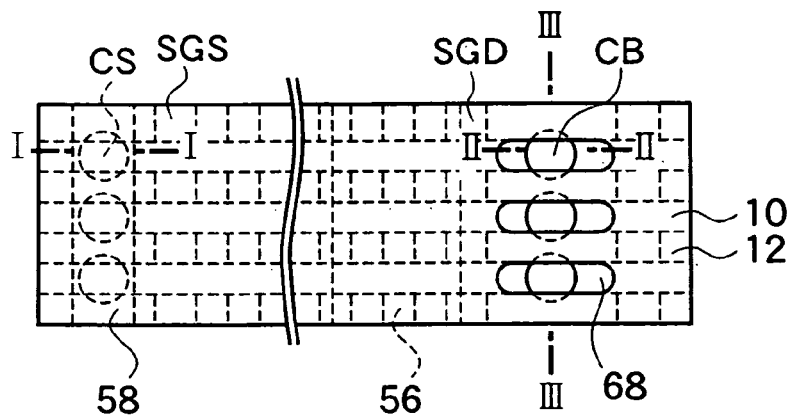
FIG. 89 is an aerial pattern diagram for describing a process of the method for fabricating the nonvolatile semiconductor memory according to the second embodiment of the present invention.
Figure 90:
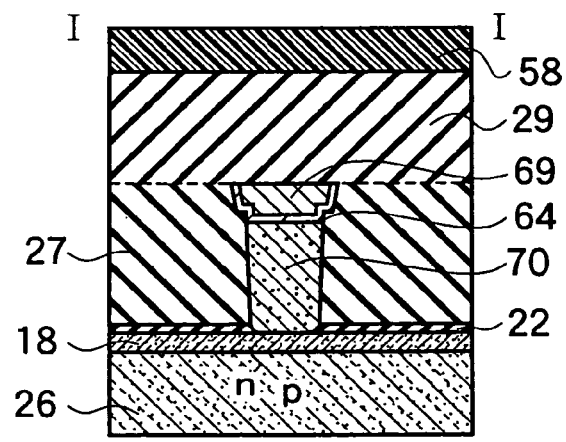
FIG. 90 is a schematic cross-sectional diagram cut along the line I-I of FIG. 89.
Figure 91:
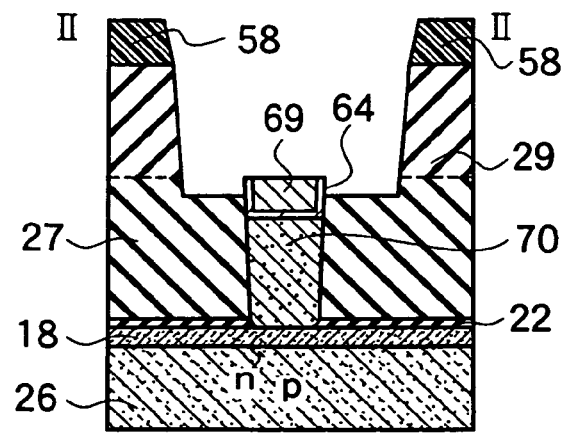
FIG. 91 is a schematic cross-sectional diagram cut along the line II-II of FIG. 89.
Figure 92:
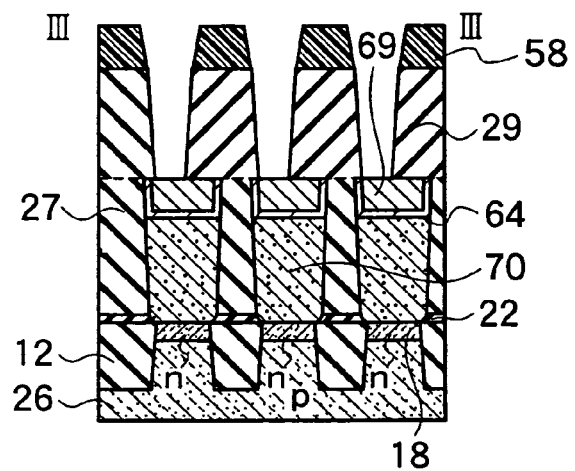
FIG. 92 is a schematic cross-sectional diagram cut along the line III-III of FIG. 89.
Figure 93:
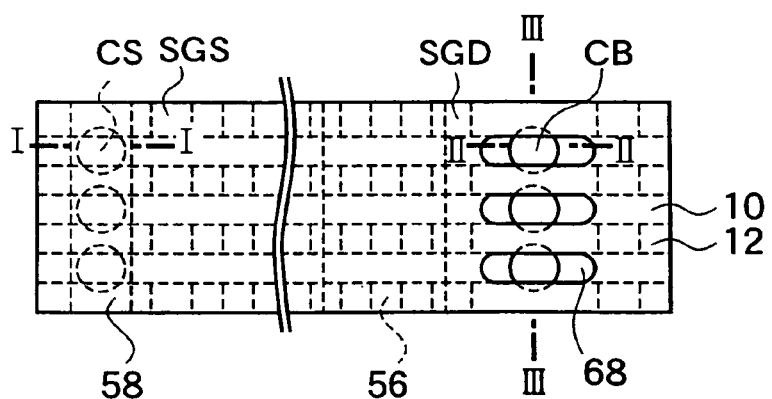
FIG. 93 is an aerial pattern diagram for describing a process of the method for fabricating the nonvolatile semiconductor memory according to the second embodiment of the present invention.
Figure 94:
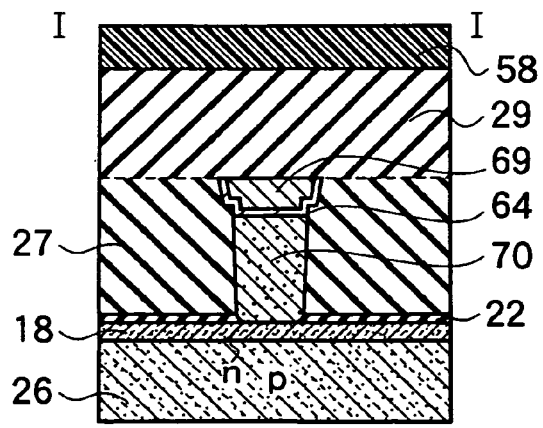
FIG. 94 is a schematic cross-sectional diagram cut along the line I-I of FIG. 93.
Figure 95:
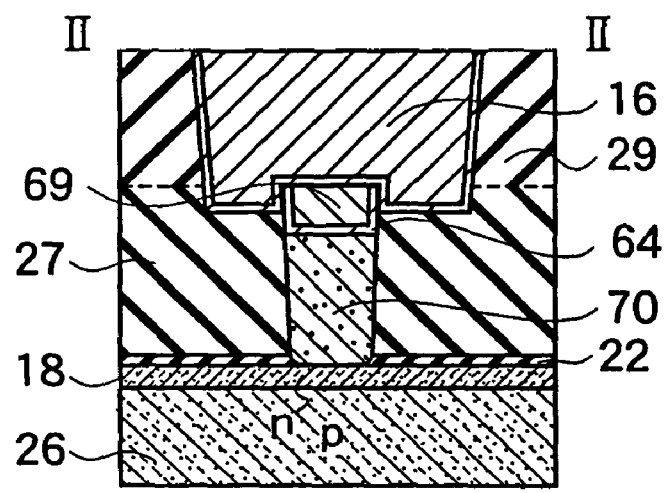
FIG. 95 is a schematic cross-sectional diagram cut along the line II-II of FIG. 93.
Figure 96:
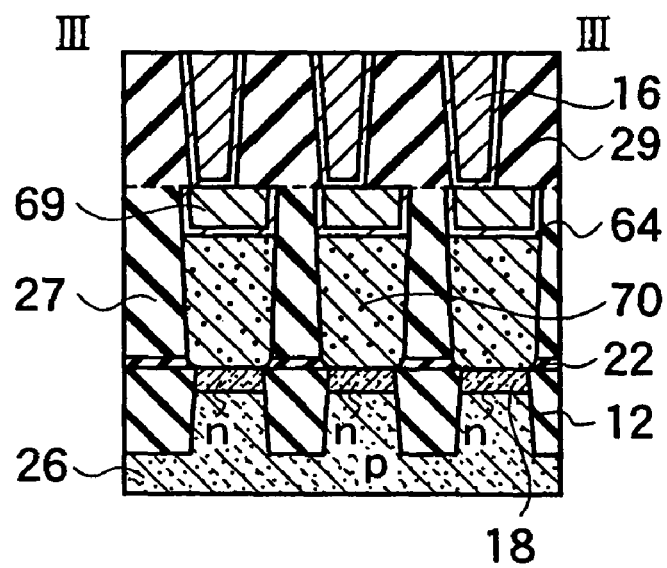
FIG. 96 is a schematic cross-sectional diagram cut along the line III-III of FIG. 93.

(f) Next, the barrier insulator film 22 is subjected to anisotropic etching after removing the resist 58 (FIG. 37 through FIG. 42). FIG. 38 schematically shows a barrier insulator film etched portion 59. In this case, it is desirable that the etching condition have a sufficient selectivity relative to the semiconductor substrate 26 and the first interlayer insulator film 27, which allows omission of wet-processing for peeling off the barrier insulator film 22 to be carried out as post processing, prevents excessive etching relative to the first interlayer insulator film 27, and maintains a forward tapered-shape and a small contact diameter.

Thereafter, the resistivity of the n-type regions at the contact portions may be decreased by ion implantation techniques of impurity ions, such as phosphorus (P) or arsenic (As) having a dosage of between $1\times10^{13}$ cm$^{-2}$ and $1\times10^{16}$ cm$^2$.

In the first embodiment, the data transfer line contacts CB and the source line contacts CS are formed independently. However, alternatively, the contacts CB and CS can be formed simultaneously.

With the conventional technology, patterning for the source line SL and the passing interconnect 56 are carried out by lithography, and patterning for the first interlayer insulator films 27 is carried out by anisotropic etching. However, in the first embodiment of the present invention, the description of formation of the data transfer line extended regions 14 is omitted.

(g) A trench of a passing interconnect region 62 for filling in the source line SL and the passing interconnect 56 is formed (FIGS. 41 through 44); a barrier metal such as Ti, Ta, TaN, or TiN is deposited to a thickness of 1 to 100 nm in the contacts and interconnect layers by sputtering or chemical vapor deposition (CVD); and a metallic material such as tungsten, aluminum, or copper is then deposited to a thickness of 10 to 1000 nm, filling in the contacts and the interconnect layers. Note that in the processes shown in FIGS. 41 through 44, after forming the interconnect trench for formation of the source line SL or the passing interconnect region 62, forming the opening for the contacts CB at the data transfer line BL and forming the opening for the contacts CS at the source line SL may be carried out in any order. However, if the contact diameter is small, it is difficult to form a high resolution pattern on the uneven foundation by lithography. Therefore, a method by which the data transfer line contacts CB are opened first is desirable, and more desirably, the contacts are opened in the order described in the following second embodiment.

(h) Next, chemical mechanical polishing (CMP) is used to etch back (FIG. 45 through FIG. 48). As for the barrier metal, the CVD technique is desirable because uniform deposition in the contact hole with a higher aspect ratio is possible.

With the first embodiment of the present invention, since an interconnect material 66 and a contact filling material made of a metallic material are filled in the contacts CB, the resistive coupling contacts can be formed using either the p-type semiconductor substrate or the n-type semiconductor substrate. Moreover, etching using dilute hydrofluoric acid or ammonium fluoride solution must be performed as pre-processing before filling conductors, so as to peel off a natural oxidized film on the n-type semiconductor diffusion layer 18. As a result, the first interlayer insulator film 27 is etched. With the first embodiment, after an interconnect trench is formed so as to form the source line SL and the passing interconnect region 62, the openings for the data transfer line BL contacts CB, and the openings for the source line SL contacts CS are filled simultaneously. This allows reduction in the number of wet etching process to one, resulting in reduction in the frequency of short-circuits due to increase in the diameter of the data transfer line BL contacts CB. This one-time conductor filling allows a reduction in the processing cost in comparison to filling the conductors several times.

(i) Subsequently, a second interlayer insulator film 29 made of a silicon oxide film, silicate glass such as BPSG or PSG, or a low dielectric constant interlayer insulator film such as HSQ, MSQ, or SiLK is deposited to a depth of approximately 10 to 1000 nm (FIG. 49 through FIG. 52).

(j) Next, patterning for the via contacts 16 is carried out by lithography, and patterning for the interlayer insulator films 29 is carried out by anisotropic etching (FIG. 53 through FIG. 56). As a result, a via contact etching region 68 is formed. The etching condition should have a sufficient selectivity relative to the resist 58, the interconnect material 66 and the contact filling material made of a metallic material, which are filled in the lower contacts, or a barrier metal 64. In addition, the via contacts 16 must be etched to a depth deeper than at least a depth extending to the tops of the contacts or the tops of the interconnect layers formed in FIGS. 45 through 48. On the other hand, for example, etching to a depth shallower than the bottoms of the interconnect layers formed in FIGS. 45 through 48 or the bottom of the passing interconnect 56 in FIGS. 13 and 14, for example, is desirable for keeping the distance between the via contacts 16 and the gate electrodes wider than the distance between the passing interconnect 56 and the select gate electrode in FIG. 45, and maintaining the withstand voltage therebetween. This allows construction of a structure with the sides of the data transfer line contacts CB making contact with the via contacts 16 as shown in FIG. 57 through FIG. 60, resulting in reduction in the contact resistance.

(k) Next, the barrier metal 64 such as Ti, Ta, TaN, or TiN is deposited to a thickness of 1 to 100 nm in the via contacts 16 by sputtering or CVD after removal of the resist, and a metallic material such as tungsten, aluminum, or copper is then deposited to a thickness of 10 to 1000 nm, filling in the via contacts 16. The shape of the first embodiment may be obtained by etching back through chemical mechanical polishing (CMP) (FIG. 57 through FIG. 60).

(l) While the subsequent processes are not shown in the drawings, Al or AlCu is deposited to a thickness of approximately 10 to 1000 nm. In addition, Al or AlCu is processed into a strip shape along the line I-I by anisotropic etching, forming the data transfer lines BL. An interlayer insulator film made of a silicon oxide film, a silicon nitride film, silicade glass such as BPSG or PSG, or a low dielectric constant interlayer insulator film such as HSQ, MSQ or SiLK is then deposited to a thickness of 10 to 1000 nm, achieving the structure of the first embodiment shown in FIGS. 13 through 16.

In the case of a NAND EEPROM, the data transfer line contacts CB are aligned with the same pitch as the device regions 10 and the device isolating regions 12 in the memory cells. In the NAND EEPROM according to the first embodiment of the present invention, a short-circuit margin among contacts and a misalignment margin between the data transfer lines (extended regions 14) and the adjacent contacts may be provided, even when the pitch of the data transfer line contacts CB are reduced as miniaturization increases.

With the nonvolatile semiconductor memory according to the first embodiment of the present invention, omission of the data transfer line BL extended regions 14 allows arrangement of the data transfer line contacts CB in series and with a minimal pitch, prevents interconnects from overlapping the memory cells, and reduction in changes to memory cell thresholds. In addition, omission of wet etching after formation of data transfer lines prevents an increase in the contact diameter, and reduction in short-circuits between the contacts and short-circuits between the contacts CB and the via contacts due to misalignment. Furthermore, omission of the data transfer line extended regions 14 allows omission of complex OPC processing and an increase in the lithographic margin. Moreover, prevention of short-circuits between the via contacts 16 and the lower contacts due to misalignment allows an increase in the contact area and a reduction in contact resistance. In addition, invasion of the contacts CB into the device isolating regions 12 and occurrence of withstand voltage failure between the p-well region 26 and the contacts CB may be prevented.

Second Embodiment

As shown in FIG. 17 through FIG. 20 in detail, a nonvolatile semiconductor memory according to a second embodiment of the present invention includes a first semiconductor layer 26, at least three adjacent second semiconductor regions 10, which are formed above the first semiconductor layer 26 and isolated by the device isolating regions 12 extended in the column direction, first interlayer insulator films 27, which are formed above the first semiconductor layer 26 in which those second semiconductor regions 10 are formed, at least three lower conductive plugs CB, which are filled in the first interlayer insulator films 27 and connected to the respective second semiconductor regions 10, a first interconnect 56, which is filled in the first interlayer insulator films 27, second interlayer insulator films 29, which are formed on the lower conductive plugs CB and the first interlayer insulator films 27, data transfer line interconnects 15, which are filled in the first interlayer insulator films 27 and arranged on the lower conductive plugs CB, at least three upper conductive plugs 16, which are filled in the second interlayer insulator films 29 and formed contacting with the tops and the sides of the data transfer line interconnects 15, and at least three second interconnects (BL) 57, which are formed on the second interlayer insulator films 29 contacting with the upper conductive plugs 16, respectively. The multiple second interconnects (BL) 57 are formed in parallel along the column direction, and the first interconnect 56 is formed along a row direction orthogonal to the column direction.

In addition, a first conductive region including phosphorus or arsenic doped silicon is formed under each lower conductive plug CB, and the data transfer line interconnects 15. The first interconnect 56 are formed from a second conductive region (metallic material) made of tungsten, aluminum, copper or the like. Furthermore, the first semiconductor layer 26 has a first type of conductive and the second semiconductor regions 10 has a second type of conductive.

Moreover, source line contact plugs (CS), which are filled in the first interlayer insulator films 27 and made of the same material as the lower conductive plugs CB, and a source line SL, which is filled in the first interlayer insulator films 27 and formed on the source line contact plugs (CS) by the damascene process are further included. In addition, the upper portions on the lower conductive plugs CB are formed so as to make direct contact with the upper conductive plugs 16 via the data transfer line interconnects 15, and the upper portions on the upper conductive plugs 16 are formed so as to make direct contact with the second interconnects 57. Furthermore, the lower conductive plugs CB are aligned in series along a row direction orthogonal to the column direction.

The first interconnect 56 is formed by the damascene process and filled in an interconnect trench formed in the first interlayer insulator films 27, and the data transfer line interconnects 15, which are arranged at least at the tops of the lower conductive plugs CB, are filled in the first interlayer insulator films 27 and made of the same material layer as the first interconnect 56.

In addition, each of the first interlayer insulator films 27 includes a lower interlayer insulator film 22 made of a silicon nitride film, a silicon oxynitride film, or an alumina film, and an upper interlayer insulator film 23 made of a silicon oxide film, a silicon nitride film, silicade glass such as BPSG or PSG, or a low dielectric constant interlayer insulator film such as HSQ, MSQ, or SiLK, which is formed contacting with the lower interlayer insulator film 22. In addition, the diameter in the column direction of each of the upper conductive plugs 16 is longer than the diameter in the column direction of each of the lower conductive plugs CB, and the diameter orthogonal to the column direction of each of the upper conductive plugs 16 is shorter than the diameter orthogonal to the column direction of each of the lower conductive plugs CB.

The nonvolatile semiconductor memory according to the second embodiment of the present invention is a rewritable nonvolatile semiconductor memory including multiple memory cells M0 to M15, which are formed on the second semiconductor regions 10 and have charge storage layers 49 to which charges are injected and from which charges are detrapped in accordance with data to be stored, and further includes a NAND memory cell unit 51, which is configured by arranging multiple memory cell elements in series, and select transistors SGD and SGS, which electrically connect one end of the source or the drain electrode to the corresponding lower conductive plug CB. The memory cells M0 to M15 are field effect transistors, which have at least one charge storage layer 49 and control gate electrodes to be data select lines WL0 to WL15 and are formed on the first conductive well region 26. The multiple memory cells M0 to M15 are formed in parallel to each other along a direction orthogonal to the column direction, and the data select lines WL0 to WL15 are arranged orthogonal to the second interconnects (BL) 57 to form a memory cell array. In addition, the first interconnect 56 may be formed on the source or the drain electrode, which connects the select transistors SGD and SGS to the memory cells M0 and M15, respectively, via the first interlayer insulator films 27.

The second embodiment is different from the first embodiment (FIG. 13 through FIG. 16) in that the contacts are filled in with two materials. More specifically, the upper regions are filled in with the same metallic material, such as tungsten, aluminum, or copper, as the interconnect layer via the barrier metal 64 when filling in and forming the source line SL, and the lower portions are filled in with a material that is different from (second contact filling material 70) the interconnect layer, such as polycrystalline silicon, single-crystal silicon, amorphous silicon, SiGe alloys mixed crystal, or SiGeC mixed crystal doped with boron, phosphorus, or arsenic impurity in an impurity concentration range of range between $1 \times 10^{19}$ cm$^{-3}$ and $1 \times 10^{22}$ cm$^{-3}$. It is desirable that the second contact filling material 70 be a phosphorus or arsenic-doped semiconductor, because even though the n-type regions 18 is in contact with the contacts CB and are made extremely shallow by diffusing impurities from the second semiconductor, a good contact resistance can be achieved. In addition, making the n-type regions 18 shallow improves the withstand voltage therebetween.

(Fabrication Method)

An exemplary method for fabricating the nonvolatile semiconductor memory according to the second embodiment of the present invention is described while referencing FIGS. 61 through 96. In the following description, however, the method for fabricating the nonvolatile semiconductor memory according to the second embodiment of the present invention is not limited in this order. As shown in FIGS. 61 through 64, and 65 through 68, the method of patterning for the data transfer line contacts CB is almost the same as in FIGS. 21 through 24, and 25 through 28 except that the source line contacts CS and the data transfer line contacts CB are opened simultaneously; therefore, description thereof is omitted.

(a) In the second embodiment, following the processes shown in FIGS. 65 through 68, a barrier insulator film 22 is anisotropically etched after removal of the resist 58 (FIGS. 69 through 72). In this case, it is desirable that the etching condition have a sufficient selectivity relative to the semiconductor substrate 26 and the interlayer insulator films 27, which allows omission of wet-processing for peeling off the barrier insulator film 22 to be carried out as post processing. Omission of the wet processing prevents excessive etching of the barrier insulator film 22 relative to the first interlayer insulator film 27 in FIGS. 65 through 68, and maintains a forward tapered-shape and a small contact diameter.

(b) Following patterning, the contacts are filled in with the second contact filling material 70. Phosphorus or arsenic highly doped polycrystalline silicon is employed as the second contact filling material 70, and anisotropic etching or isotropic etching such as chemical dry etching (CDE) is used for etching back (FIGS. 73 through 76). Not shown in the drawings, a lithographic process and etching for forming contact holes for a peripheral device may then be added as with FIGS. 33 through 36, and 37 through 40 of the first embodiment.

(c) Next, patterning for formation of the source line SL interconnects is carried out; however, since the data transfer line extended regions 14 are omitted in the second embodiment, polycrystalline silicon in the contacts CB and CS is covered with the photoresist 58. After patterning the interconnects by lithography, patterning for the interconnects is carried out using anisotropic etching (FIGS. 77 through 80).

Figure 18:
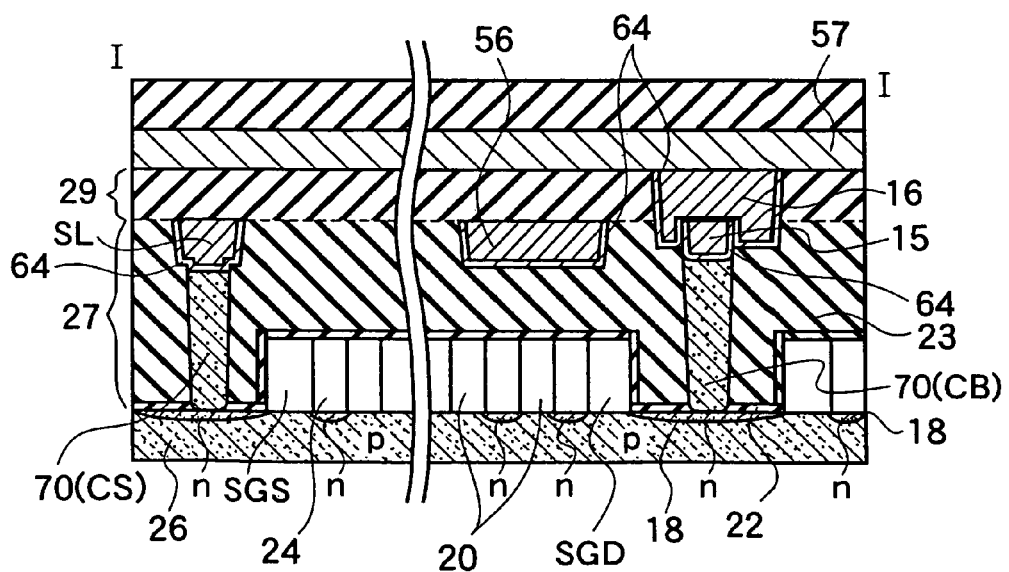
FIG. 18 is a schematic cross-sectional diagram cut along the line I-I of FIG. 17.
Figure 19:
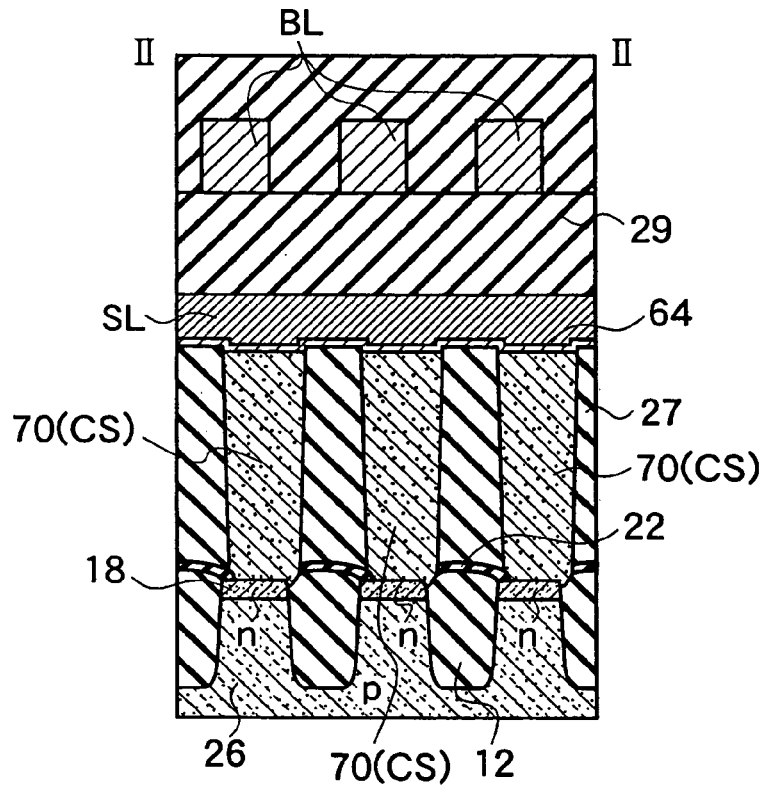
FIG. 19 is a schematic cross-sectional diagram cut along the line II-II of FIG. 17.
Figure 20:
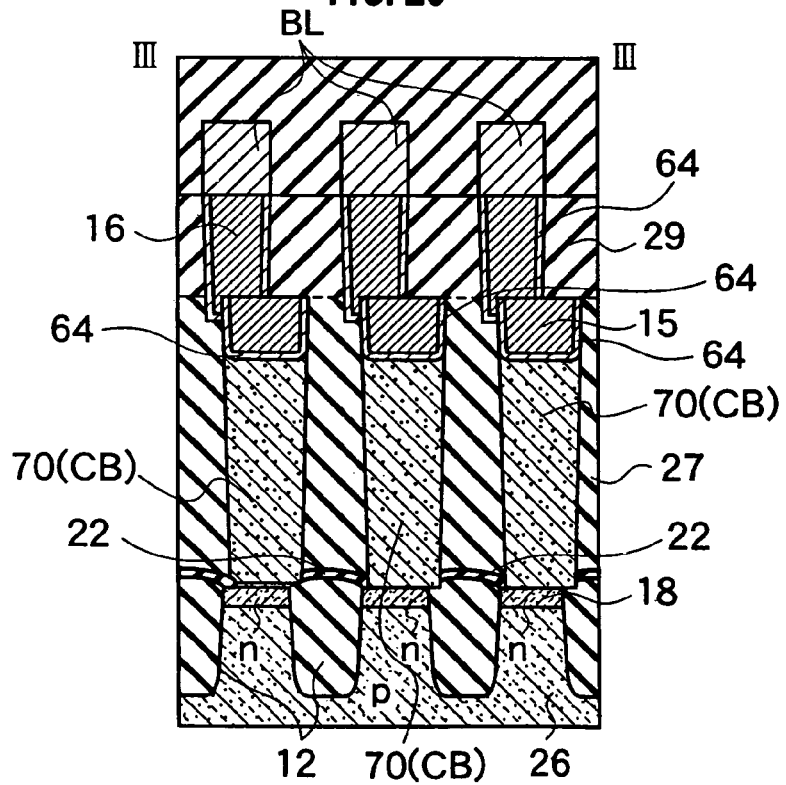
FIG. 20 is a schematic cross-sectional diagram cut along the line III-III of FIG. 17.
Figure 21:
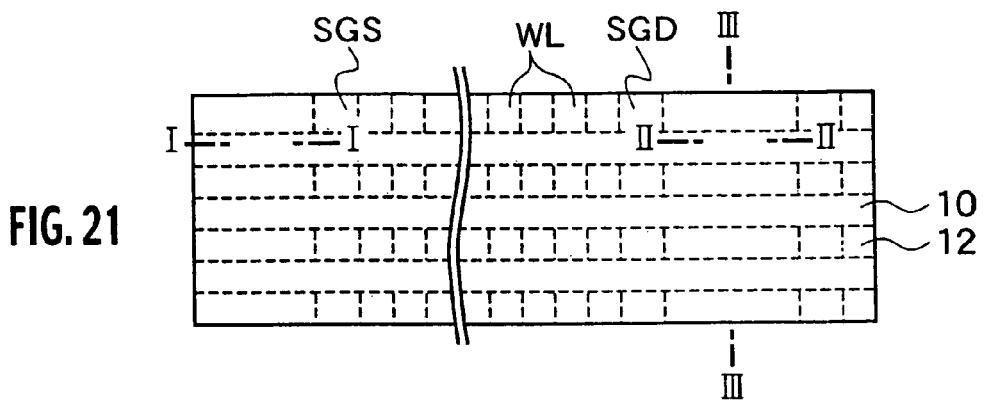
FIG. 21 is an aerial pattern diagram for describing a process of a method for fabricating the nonvolatile semiconductor memory according to the first embodiment of the present invention.

(d) Next, the barrier metal 64 such as Ti, Ta, TaN, or TiN is deposited after removal of the resist 58, the contacts CB and the second contact filling material 70 are then filled in with the interconnect material 69, and etching back using CMP is carried out (FIGS. 81 through 84). A metallic material such as tungsten, aluminum, or copper is used as the interconnect material 69. As a result, the device transfer line interconnect 15 shown in FIG. 18 is formed with the filled interconnect material 69.

(e) While the subsequent formation method for the via contacts 16 is shown in FIGS. 85 through 96, which is the same as FIGS. 45 through 56, description thereof is omitted.

(f) Subsequently, not shown in the drawings, Al or AlCu is deposited to a thickness of approximately 10 to 1000 nm. In addition, Al or AlCu is processed into a strip shape along the line I-I using anisotropic etching to form the data transfer lines BL. An interlayer insulator film made of a silicon oxide film, a silicon nitride film, silicade glass such as BPSG or PSG, or a low dielectric constant interlayer insulator film such as HSQ, MSQ or SiLK is then deposited to be a thickness of 10 to 1000 nm, so as to provide the structure of the second embodiment shown in FIGS. 17 through 20.

In the second embodiment, if the aspect ratio of the contacts CB and CS increases, the step-coverage of the filling metallic materials of the barrier metal 64 and the interconnect material 69 tends to be insufficient in order to fully fill and cover the contacts CB and CS. As a result, a deposition error of the filling metallic material of the interconnect material 69 may occur, or leakage current between the contacts CB and the semiconductor substrate 26 (or lower interconnect) increases. In the second embodiment, since the contacts CB are filled in with a material such as polycrystalline silicon, the barrier metal 64 is unnecessary in the high-aspect data transfer line contact CB portions. Accordingly, an increase in leakage current due to an insufficient coverage of the barrier metal 64 is prevented. In addition, since the lower portions of the contacts CB are pre-filled, the actual aspect ratio, which influences the capability of filling in the interconnect layer and the upper regions on the contacts, is low, and filling characteristics of the barrier metal 64 or related metals are improved. In addition, since a semiconductor material such as polycrystalline silicon is filled in, ion implantation of an n-type impurity in the lower portions of the data transfer line contacts CB is unnecessary so that the data transfer line contacts CB with an extremely shallow junction depth can be formed. This structure improves the punch-through withstand voltage between the n-type semiconductor layers in which the data transfer line contacts CB are formed. Furthermore, if polycrystalline silicon, SiGe, amorphous silicon, or SiGe is used as the contact filling material of the interconnect material 69, the Si or the SiGe alloy can be filled in by CVD, which provides better coverage than metal, and also stably filled in even for a high aspect ratio structure. In addition, if impurity-doped polycrystalline silicon or SiGe alloy is used as the interconnect material 69, stable contact resistance can be obtained by diffusing impurities to the substrate without ion-implantation for re-diffusion. Furthermore, since the barrier metal 64 is unnecessary for filling in the lower portions of the contacts, stable contact resistance with the n-type regions can be obtained even for miniaturized contacts.

In the NAND EEPROM according to the second embodiment of the present invention, a short-circuit margin between contacts and a misalignment margin between the data transfer lines (extended regions 14) and the adjacent contacts CB may be provided even for the reduced data transfer line contact CB pitch in the miniaturized device.

With the nonvolatile semiconductor memory according to the second embodiment of the present invention, arrangement of the data transfer line contacts CB in series and with a minimal pitch is possible without formation of the data transfer line BL extended regions 14. Also, since interconnects in the memory cells do not overlap, change in thresholds of the memory cells can be reduced. In addition, since increase in the contact diameter can be controlled without wet etching after formation of data transfer lines, the short-circuits between the contacts and short-circuits between the contacts CB and via contacts due to misalignment can be reduced. Furthermore, complex OPC processing can be omitted without formation of the data transfer line extended regions 14, and the lithographic margin can be enhanced. Moreover, short-circuits between the via contacts 16 and the lower contacts due to misalignment can be prevented, and the contact resistance can be reduced due to the increased ground area. In addition, invasion of the contacts CB into the device isolating region 12 and occurrence of withstand voltage failure between the p-well region 26 and the contacts CB may be prevented. Furthermore, since contacts are filled in with polycrystalline silicon, leakage current can be prevented from increasing because insufficient coverage of the barrier metal. In addition, since the lower portions of the contacts CB are pre-filled, the aspect ratio required for filling in the interconnect layer and the upper regions on the contacts is low, and filling characteristics of the barrier metal or related metals can be improved.

The first and the second embodiment share the following features.

(Feature 1)

Figure 22:
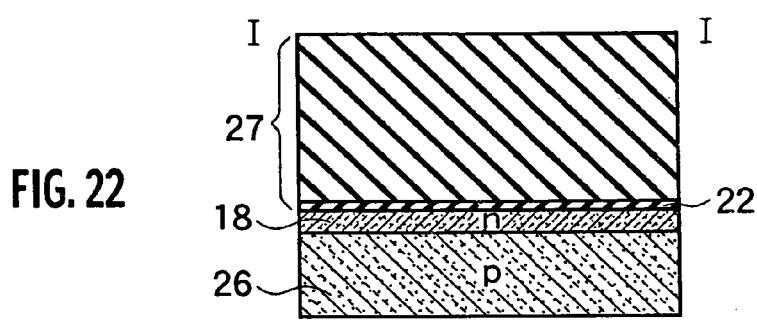
FIG. 22 is a schematic cross-sectional diagram cut along the line I-I of FIG. 21.
Figure 23:
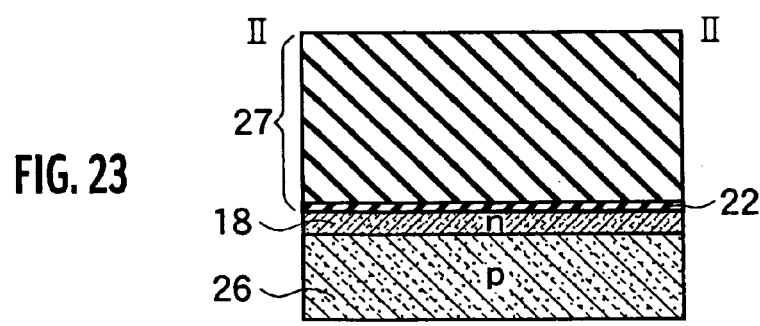
FIG. 23 is a schematic cross-sectional diagram cut along the line II-II of FIG. 21.
Figure 24:
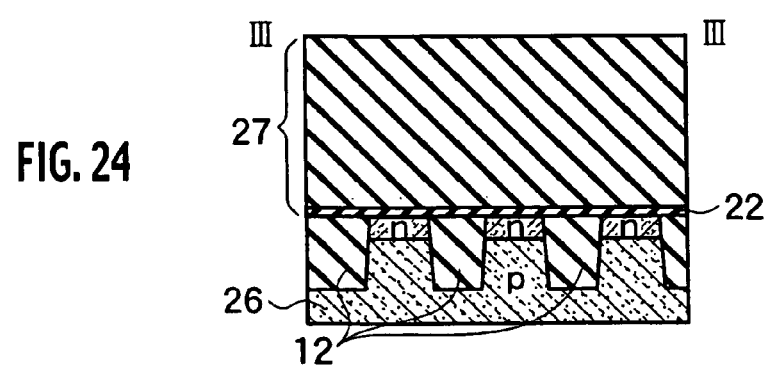
FIG. 24 is a schematic cross-sectional diagram cut along the line III-III of FIG. 21.
Figure 25:
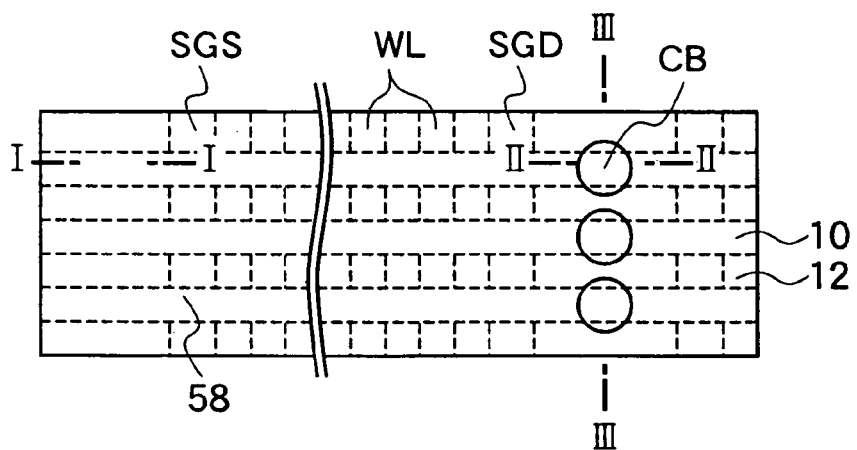
FIG. 25 is an aerial pattern diagram for describing a process of the method for fabricating the nonvolatile semiconductor memory according to the first embodiment of the present invention.
Figure 26:
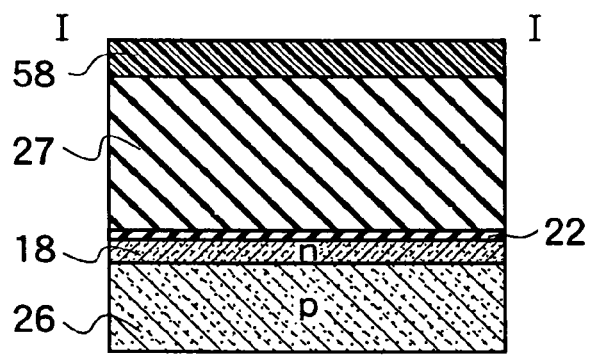
FIG. 26 is a schematic cross-sectional diagram cut along the line I-I of FIG. 25.
Figure 27:
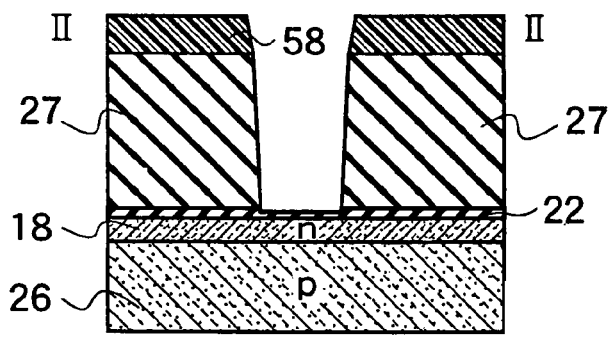
FIG. 27 is a schematic cross-sectional diagram cut along the line II-II of FIG. 25.
Figure 28:
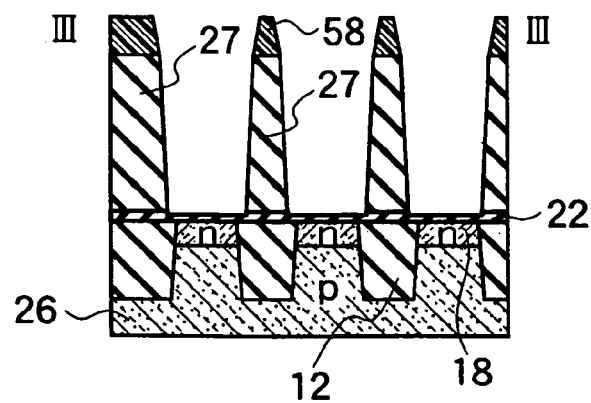
FIG. 28 is a schematic cross-sectional diagram cut along the line III-III of FIG. 25.
Figure 29:
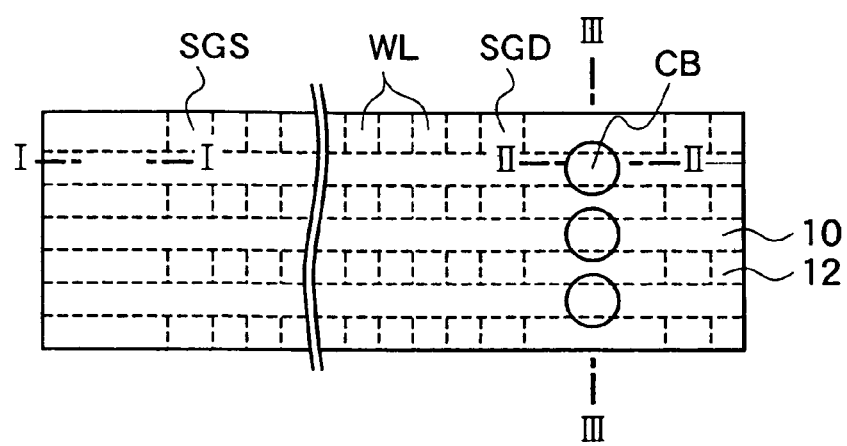
FIG. 29 is an aerial pattern diagram for describing a process of the method for fabricating the nonvolatile semiconductor memory according to the first embodiment of the present invention.
Figure 30:
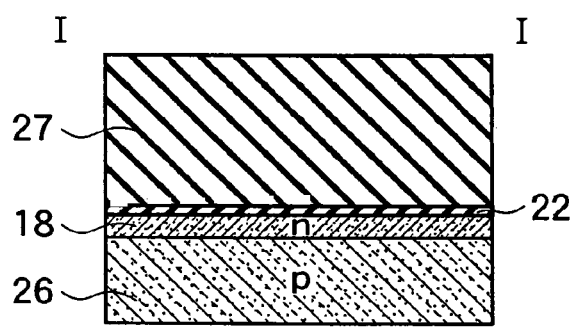
FIG. 30 is a schematic cross-sectional diagram cut along the line I-I of FIG. 29.
Figure 31:
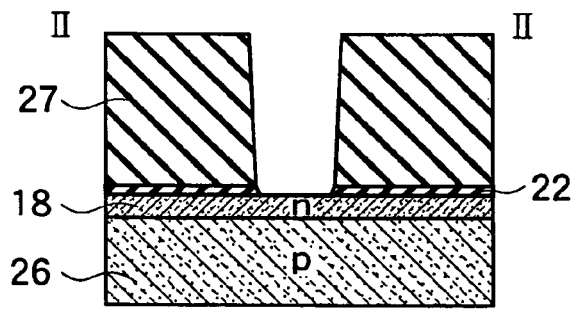
FIG. 31 is a schematic cross-sectional diagram cut along the line II-II of FIG. 29.
Figure 32:
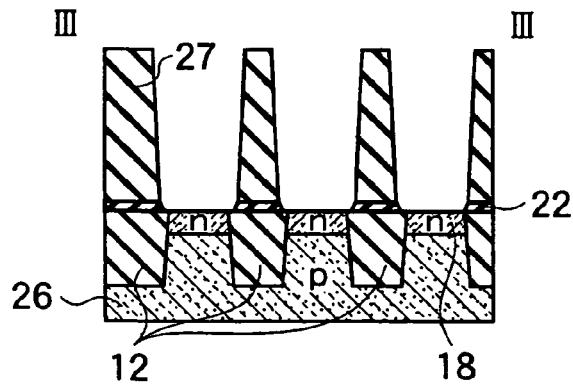
FIG. 32 is a schematic cross-sectional diagram cut along the line III-III of FIG. 29.
Figure 33:
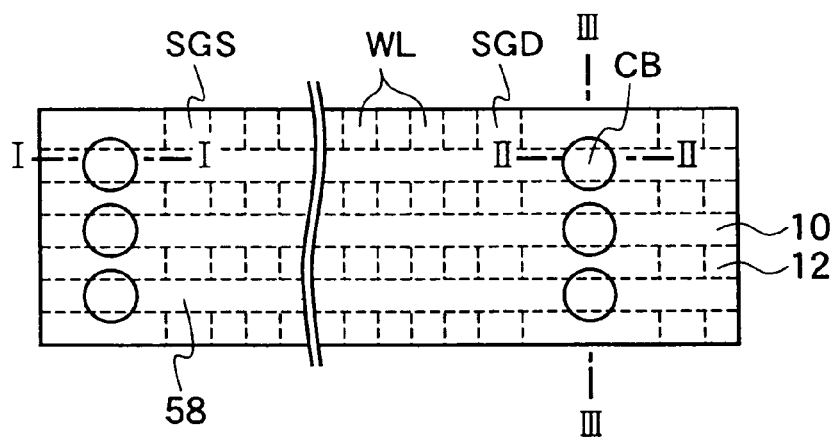
FIG. 33 is an aerial pattern diagram for describing a process of the method for fabricating the nonvolatile semiconductor memory according to the first embodiment of the present invention.
Figure 34:
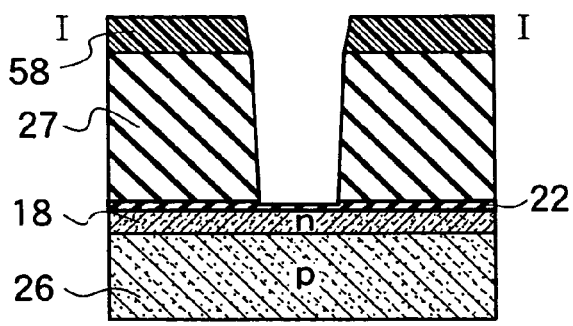
FIG. 34 is a schematic cross-sectional diagram cut along the line I-I of FIG. 33.
Figure 35:
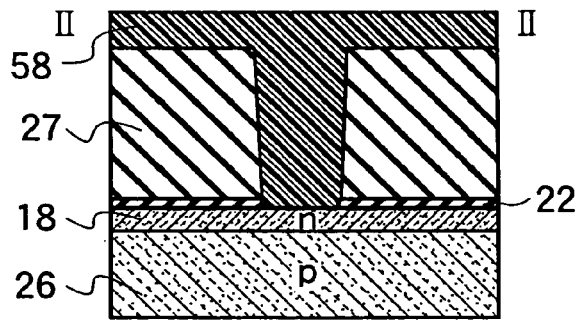
FIG. 35 is a schematic cross-sectional diagram cut along the line II-II of FIG. 33.
Figure 36:
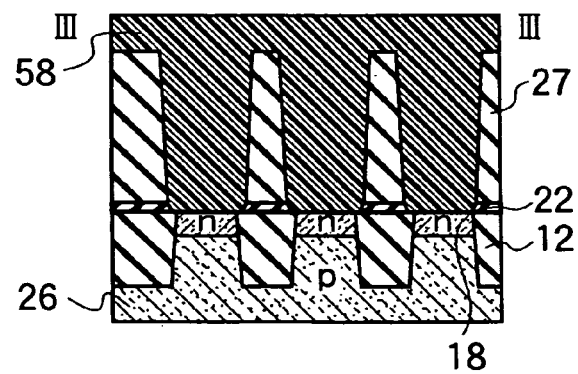
FIG. 36 is a schematic cross-sectional diagram cut along the line III-III of FIG. 33.
Figure 37:
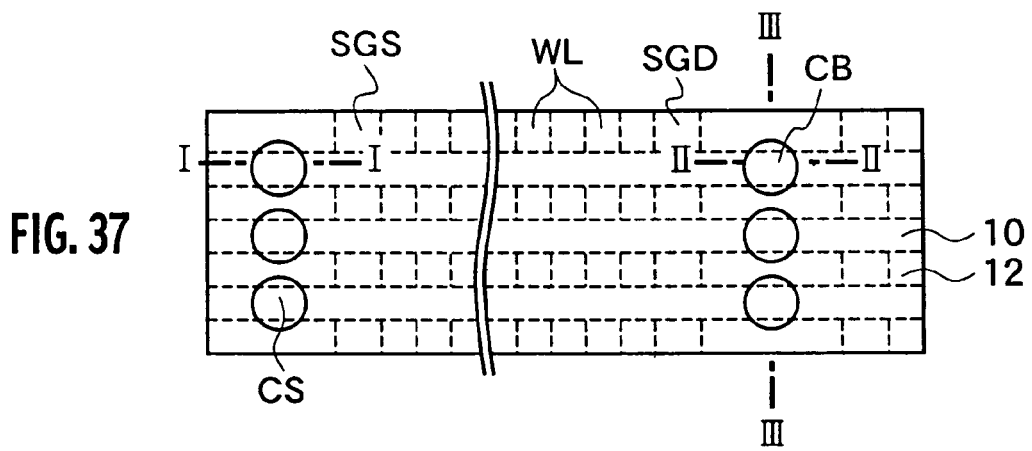
FIG. 37 is an aerial pattern diagram for describing a process of the method for fabricating the nonvolatile semiconductor memory according to the first embodiment of the present invention.

As shown in the structures of the first and the second embodiment shown in FIGS. 13 through 16 and FIGS. 17 through 20, usage of a long pattern extending along the line I-I in parallel to the device isolating region 12 instead of the conventionally used circular contact pattern allows formation of the openings for the contacts CB with a higher exposure intensity, with a higher exposure sensitivity than that for the conventional circular contact pattern, with a sufficient focal depth and with a sufficient exposure fluctuation tolerable width. This allows formation of more minute contacts CB than conventional circular contacts CB and minimization in the short diameter of the via contacts 16 along the widths of the data transfer lines BL. Therefore, the maximum value of the short diameter of each of the contacts CB can be made smaller than in the conventional device, and the shape of each of the contacts CB can be formed equivalent to or better than the conventional one. Note that in the second embodiment, the interlayer insulator films 27 and the barrier insulator film 22 may be slightly etched for improving adhesiveness and reduction in contamination prior to filling in the upper regions of the contacts CB with metal after filling in the lower regions of the contacts CB with a conductor. In this case, the metallic interconnect width is wider than the contact diameter along the interconnect width. As shown in FIG. 22, with the conventional example, when devices with the same resolution are used, minimum line widths cannot be achieved along two axes, respectively. Therefore, the contact pattern is larger than the minimum interconnect width. In either case, the distance between the interconnects and the contacts can be provided wider than the conventional example when the same interconnect width is used, if the metallic interconnect width is wider than the contact diameter along the interconnect width. As a result, the maximum diameter of each of the contacts CB can be shorter than the conventional device, and additional square-shaped contacts CB can be formed in comparison to the conventional device. This makes it difficult to create short-circuits between the interconnects almost parallel to one side of each contact and the contacts CB in comparison to the conventional device. In addition, even with a foundation having a circular contact, a larger contact area with the lower can be provided even if greater misalignment than in the case of the circular via contacts 16 occurs. This allows further reduction in the contact resistance with the foundation even when misalignment with the foundation occurs.

Furthermore, for example, as with the resist-conversion difference, the dimension errors along the short diameter of the via contacts 16 can widely absorb the dimension error along the long diameter thereof. This allows reduction in lithographic dimension error in comparison to the conventional device, and formation of the via contacts 16 with increased uniformed dimensions.

(Feature 2)

The conventional technology uses either a process of forming the contacts and data transfer lines and then depositing the barrier metal such as Ti, Ta, TaN, or TiN simultaneously, and subsequently filling and forming the contacts CB and the second contact filling material 70 using a metallic material such as tungsten, aluminum, or copper. Alternatively, the conventional process of first forming the contacts CB and then filling with a phosphorus or arsenic highly-doped polycrystalline silicon therein, etching back using anisotropic etching or isotropic etching such as CDE, and filling and forming the data transfer line extended regions 14 in the interconnect trench. Furthermore, after deposition of the barrier metal 64 such as Ti, Ta, TaN, or TiN, the contacts CB and the second implantation material 70 must be formed and filled in using a metallic material such as tungsten, aluminum, or copper. As a result, wet etching after filling and forming the interconnects reaches the upper regions on the contacts in the foundation. Since the insulator films are excessively etched due to the second wet etching after the first wet etching, a problem of short-circuits between the contacts develops. However, with the first and the second embodiment of the present invention, the conventional data transfer line extended regions 14 can be omitted even when a process of forming the contacts by filling in the interconnect trench is used. This prevents excessive etching of the data transfer line contacts CB due to wet etching, and resolution of the problem of short-circuits between the data transfer line contacts CB. Note that whether the interconnect layers equivalent to the data transfer line extended regions 14 are either filled in and formed by the damascene process or formed by etching the interconnect material by anisotropic etching (RIE) can be determined by whether or not the barrier metal 64 is consecutively formed on the sides and the bottoms of the interconnect layers equivalent to the data transfer line extended regions 14 as shown in the structures of the first and the second embodiment shown in FIGS. 13 through 16 and FIGS. 17 to 20. In other words, if the barrier metal 64 is formed, this means that the interconnect layers equivalent to the data transfer line extended regions 14 are filled in and formed by the damascene process.

With the second embodiment of the present invention, omitting the formation of the data transfer line extended regions 14 means that the extended regions 14 are unnecessary. Therefore, the size of each via contact 16 in the upper layer may be approximately 3 F along the line I-I and arranged along the line III-III with a minimum pitch of 2 F to 3 F, so as to control changes in thresholds of the memory cells to be held to a minimum (FIGS. 9 and 10 show two types of memory cells as typical memory cell structures: a floating-gate memory cell, and a MONOS memory cell having a charge storage layer). In addition, since the data transfer line BL extended regions 14 are not formed on the memory cells, change in electric potential at the capacitively coupled region of the memory cells due to change in electric potential of the data transfer lines BL can be controlled. This allows control of change in electric potential of the memory cell transistor electrodes during writing/reading due to change in the electric potential of each data transfer line BL, and implementation of a transistor with a narrower threshold distribution and a larger read-out margin.

Furthermore, since the data transfer line BL extended regions 14 are not formed on the memory cells, these regions can be allocated for other interconnects, such as the source lines SL, lined interconnects of SGS, lined interconnects of SGD, or interconnects used for synchronizing a row decoder. Alternatively, by arranging the passing interconnect 56 as shown in FIGS. 13, 14, 17, and 18 and then increasing the electric potential during writing, the potentials of the source and drain electrodes increase due to capacitive coupling of the passing interconnect 56 and the source and drain electrodes of memory cells formed thereunder, thereby decreasing the possibility of miswriting in non-target cells. Furthermore, the interconnect widths can be wider, and a nonvolatile semiconductor device capable of high-speed operation with low resistance can be achieved.

More specifically, in the first and the second embodiment, a case where the passing interconnect 56 is formed on at least one of the source and the drain electrode diffused layer in each memory cell adjacent to the SGD is discussed. In particular, the case of writing in order from the memory cell on the SGS side in FIGS. 13 through 16 using a memory cell writing sequence is considered. In addition, the case of preventing first memory cells, which are connected to the same data select line as other memory cells are connected and are not supposed for writing, from being miswritten is considered. The foregoing process is attained by applying a pulse voltage of Vpass to second memory cell control electrodes connected to the first memory cells, thereby increasing the source-drain voltage of each of the first memory cells; where Vpass denotes a voltage ranging from 5 to 15 V; and a pulse voltage of Vpgm ranging from 10 to 25 V, for example, is applied to the first memory cell control electrodes. Such array layout, which may bring about miswriting, may be based on a structure and an operation of selectively writing data to one of multiple memory cells connected to one of the data transfer lines BL.

In this case, since the memory cells, which are closer to the SGD side than a to-be-written cell, have always been erased, if the number of the second memory cells on the SGD side is less than the number of the first memory cells, the degree of the capacitive coupling due to the second memory cells decreases. As a result, the degree of the capacitive coupling due to the second memory cells decreases, the amount of increase in the voltage of the source or the drain electrode of each first memory cell decreases, and the probability of miswriting to the first memory cells further increases. More specifically, if there is no memory cell on the SGD side of the first memory cells, the probability of miswriting increases. However, like the first and the second embodiment, by forming the passing interconnect on at least one of the source or the drain electrode diffused layer of each memory cell adjacent to the SGD, and then applying a pulse voltage ranging from 5 to 25 V, for example, to the passing interconnect when applying Vpass, the probability of miswriting decreases.

Naturally, the probability of miswriting can be further reduced by forming the passing interconnect 56 even on at least one of the source or the drain electrode diffused layer of the adjacent second memory cell in addition to the memory cells adjacent to the SGD. Note that in the first embodiment shown in FIGS. 13 through 16, the passing interconnect 56 is not formed on the SGD but is partially formed on the drain diffusion layer on the SGD side of the first memory cells. With this structure, the voltage of the passing interconnect 56 is boosted, thereby increasing the electric potential of the SGD control electrode. This reduces the possibility that the boosted potential of the source-drain diffusion layer of the memory cell leaks to corresponding data transfer line BL via the SGD, preventing to a certain extent an occurrence of miswriting. In addition, since the distance between the via contacts 16 and the passing interconnect 56 can be extended, high insulator withstand voltage therebetween can be maintained. This is effective when, for example, the low resistant lined interconnects are not used for the SGD control electrode in the same layer as the passing interconnect 56, and interconnect resistance is high.

On the other hand, in the second embodiment shown in FIGS. 17 through 20, the passing interconnect 56 is formed on both the SGD and the drain diffusion layer, further along on the SGD side than the first memory cells. With this structure, by boosting the voltage of the passing interconnect 56, both voltages of the source and the drain electrode of the memory cell adjacent to the SGD are boosted, which prevents to a certain extent the problem of miswriting. This is effective when, for example, a low resistant lined interconnect is used for the SGD control electrode in the same layer as the passing interconnect 56, and the interconnect resistance of the effective SGD control electrode is low.

In addition, in the first and the second embodiment, an example with only one passing interconnect 56 is given. However, naturally, a plurality of passing interconnects may be formed between the SGS and the SGD. Even in this case, since the area of the data transfer line extended regions 14 may be reduced in comparison to the conventional example, a wide region in which the passing interconnect 56 can be formed may be provided. This allows more passing interconnects 56 or a wide passing interconnect 56 with low resistance to be provided.

In addition, as shown in FIGS. 13 through 16, by changing the shape of the via contacts 16 to an oblong shape, an alignment margin along the line I-I can be provided. Furthermore, by extending each via contact 16 area along the line I-I, each contact CB can be formed with a sufficient focal depth and a sufficient exposure fluctuation tolerable width using a higher exposure intensity and a higher exposure sensitivity, and the lithographic margin can be enhanced. This allows reduction in the contact diameter along the line III-III within the range capable of achieving the margin.

(Feature 3)

Formation of a pattern so as to provide a wider source line SL width using a vacant area not including interconnects for the data transfer line extended region 14 allows reduction in the resistance of the source line SL and a further stable threshold setting. In addition, formation of the source line contacts CS on the device regions 10 as with the data transfer line contacts CB allows a decrease in failure frequency or a decrease in the withstand voltage between the p-well region 26 and the second contact filling material 70 due to the second contact filling material 70 extending to the p-well region 26 when forming the source line contacts CS on the device isolating regions 12.

(Feature 4)

The same number of interconnect layers as in the conventional example can be used for the peripheral device interconnect structure since the data transfer line contact CB layer, the passing interconnect 56, and a via contact 16 layer are formed sequentially. More specifically, the peripheral device contacts may be formed using the same process as that of forming the source line contacts CS in the first embodiment. In this case, the peripheral device contacts on the semiconductor region may be directly aligned with the semiconductor region, the p-well regions 26, or the gate electrodes. Furthermore, like the conventional example, since it is unnecessary to align the data transfer line extended regions 14 and the data transfer line contacts CB in the memory cell block, the peripheral device contacts CB on the semiconductor region may be directly aligned with the passing interconnect 56. With the conventional example, since the data transfer line extended regions 14 must be aligned with the data transfer line contacts CB in the memory cell block, and when the peripheral device contacts CB are formed on the semiconductor region by lithography in a different process from that for the data transfer line contacts CB, indirect alignment must be performed, degrading alignment accuracy. In general, in the case of the multi-layered interconnects, a minute design rule and high alignment accuracy are needed for lower layer contacts and lower layer interconnects. With the structure of the present embodiments, alignment accuracy between the peripheral device contacts and the interconnects can be improved in comparison to the conventional example.

Third Embodiment

Roughly classified, there are three operation modes for a nonvolatile semiconductor memory according to a third embodiment of the present invention. These are called 'page mode', 'byte mode', and 'ROM region included EEPROM mode'.

Figure 97:
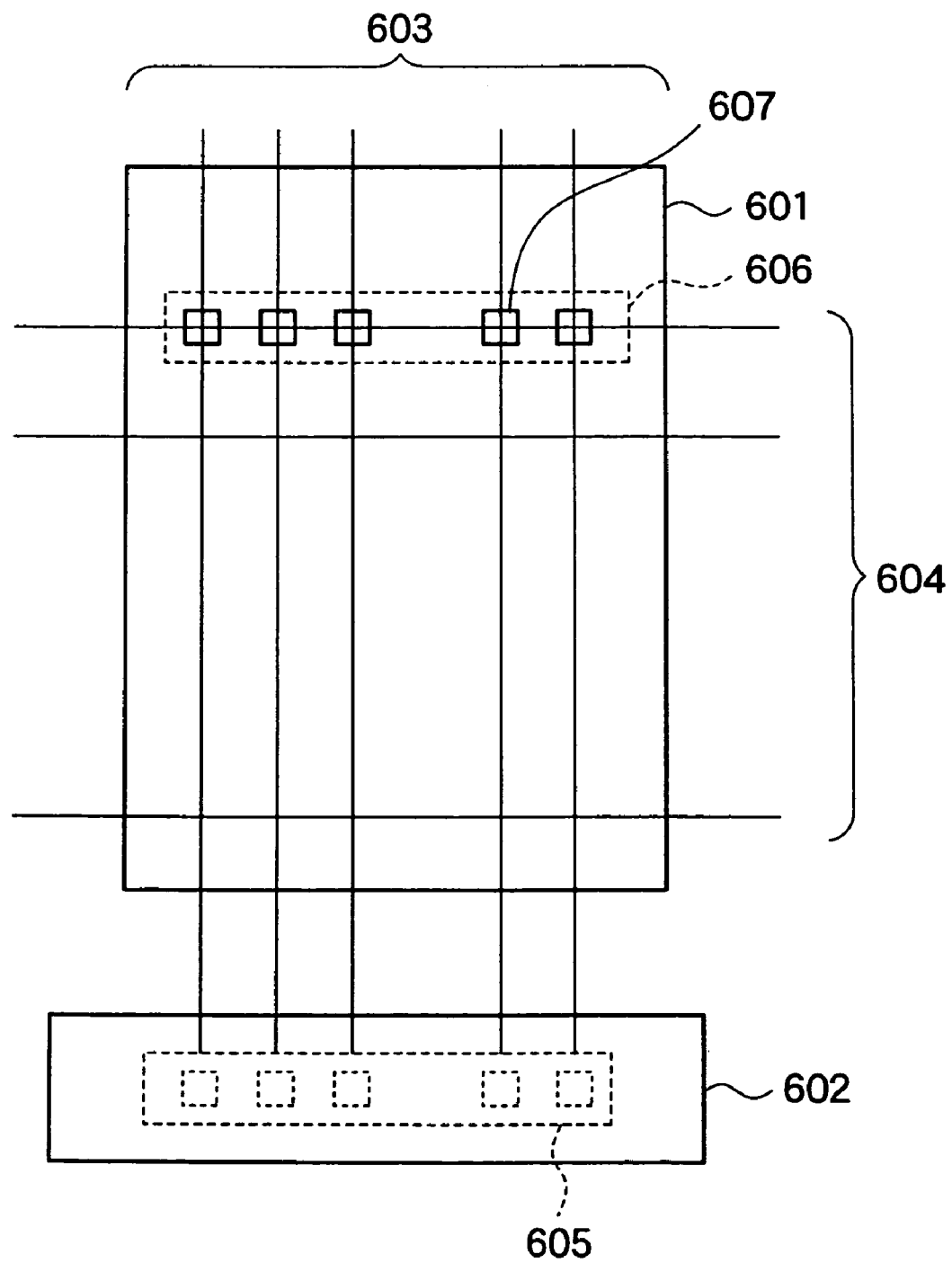
FIG. 97 is a schematic diagram of page flash memory, or a nonvolatile semiconductor memory according to a third embodiment of the present invention.

As shown in FIG. 97, in page mode, data is collectively read out from a memory cell row 606, provided on one of word lines 604 in a flash memory cell array 601, via bit lines 603 to a sense amplifier 602 as data from a memory cell row 605, and data from the sense amplifier 602 is collectively written. In other words, the read-out and the write-in operation are performed page-by-page. In FIG. 97, memory cells 607 are arranged on the intersections of the word lines 604 and the bit lines 603.

Figure 98:
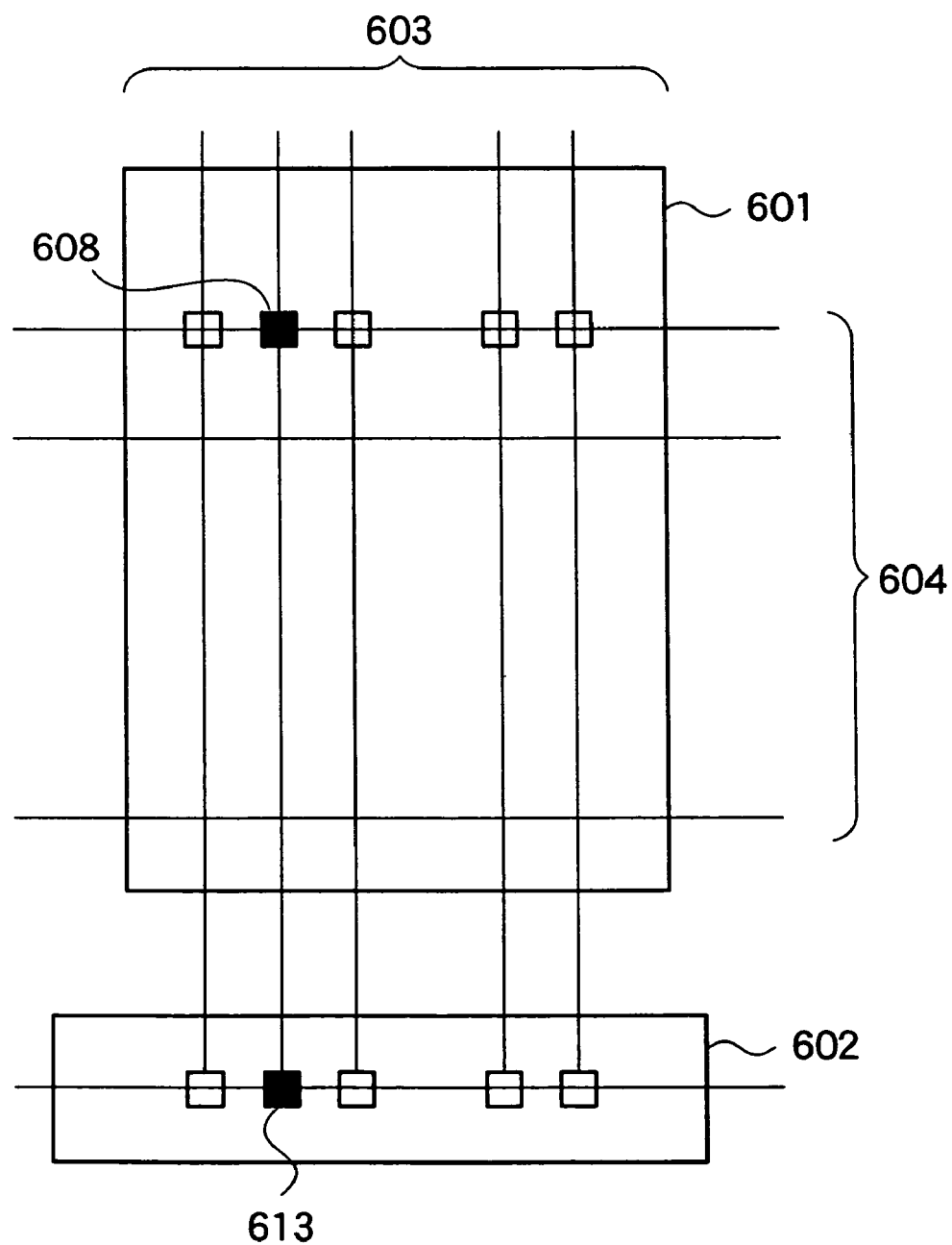
FIG. 98 is a schematic diagram of byte flash memory, or the nonvolatile semiconductor memory according to the third embodiment of the present invention.

In contrast, as shown in FIG. 98, in byte mode, a byte of data is read out from a memory cell 608, provided on the word lines 604 in the flash memory cell array 601, to the sense amplifier 602 as data from a memory cell 613, and a byte of data from the memory cell 613 in the sense amplifier 602 is written in the memory cell 608. In other words, the byte mode is different from the page mode in that the read-out and the write-in operation are performed byte-by-byte.

Figure 99:
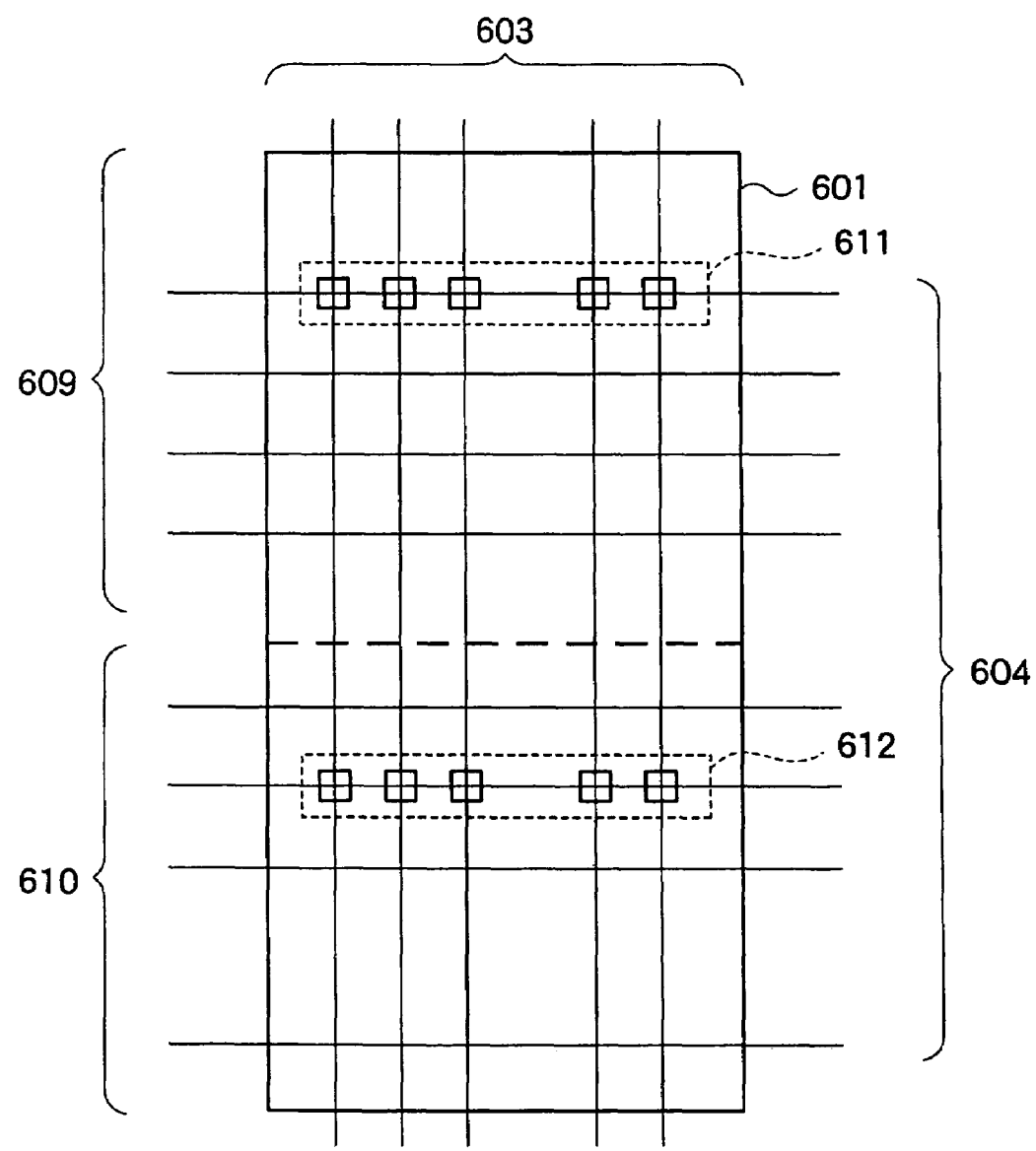
FIG. 99 is a schematic diagram of ROM region included EEPROM flash memory, or the nonvolatile semiconductor memory according to the third embodiment of the present invention.

As shown in FIG. 99, in ROM region included EEPROM mode, the flash memory cell array 601 is partitioned into a ROM region included EEPROM 610 section and a flash memory 609 section. Data stored in the flash memory cell array 601 is read out and rewritten in page-by-page or byte-by-byte while systematically changing over the ROM region included EEPROM 610 section. FIG. 99 shows a case of reading out a page of data from a memory cell row 611 on the same word line in the flash memory 609 to the ROM included EEPROM 610 as data from the memory cell row 612, and writing it.

Naturally, it is possible to operate the nonvolatile semiconductor memory according to the first and second embodiments of the present invention in each mode: page mode, byte mode, and ROM region included EEPROM mode. In particular, as described later, in the case of using a flash memory for memory cards or IC cards, the ROM region included EEPROM mode, allowing the flash memory to operate systematically, is important for configuring a system LSI as well as advancing one-chip integration.

Fourth Embodiment (System LSI)

There are various applications for the nonvolatile semiconductor memory according to the first through third embodiments of the present invention. Some of these applications are shown in FIG. 100 through FIG. 107.

(Application 1)

Figure 100:
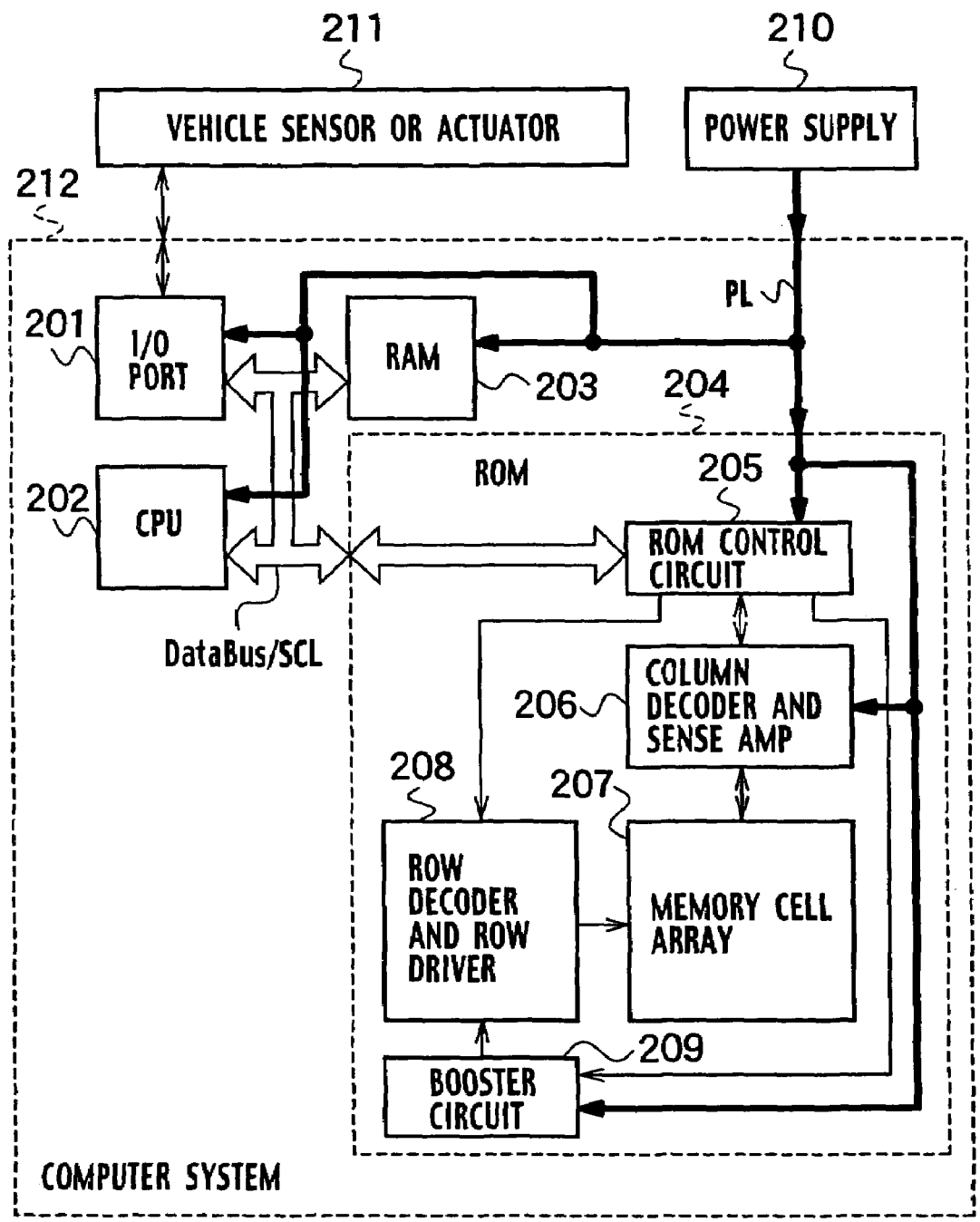
FIG. 100 is a schematic diagram of a vehicle integrated circuit to which is applied a nonvolatile semiconductor memory according to a fourth embodiment of the present invention.

The nonvolatile semiconductor memory according to the first through third embodiments of the present invention described above is also applicable to a semiconductor memory in which not only a stand-alone read-only memory (ROM) array, but also more complicated logic circuits and ROM arrays are formed. FIG. 100 shows a computer system 212 employing, for example, the aforementioned memory cell array structure of the nonvolatile semiconductor memory described in the first through the third embodiment. In particular, FIG. 100 shows the computer system 212 for a vehicle. The computer system 212 is electrically connected to a vehicle sensor or actuator 211 via wirings so as to transfer electrical signals via an input/output port 201. Power is supplied from a power supply 210 to the computer system 212 via a power line PL. It is desirable that the voltage output from the power supply 210 fall within the range between 1 V and 5 V, which satisfies the power supply voltage specifications for the logic circuits of RAM 203 or a CPU 202 and the input/output port 201 to be described later, and allows wiring using only a single power supply wire, which reduces the area occupied by the wire. Note that the power line PL is indicated by a bold line in the drawing for easy distinction.

Note that this computer system 212 includes the input/output port 201, RAM 203, which becomes the column memory, the CPU 202, which carries out calculations for data, and ROM 204. These elements are capable of transferring data via data bus lines and internal system control lines. ROM 204 is a region for storing programs to be executed by the CPU 202, and storing data of respective vehicle identification numbers or vehicle export destinations, or the like. In addition, ROM 204 includes a ROM control circuit 205, which is connected to the data bus. This ROM control circuit 205 is a logic circuit, which reads out, writes in, and erases data in a specific address of a memory cell in conformity with a read-out, a write-in, and an erasure instruction for ROM 204 given via the data bus or the internal system control lines. The ROM control circuit 205, which is connected to a column decoder and a sense amplifier 206, decodes the address of a specified column, and then transfers the write-in data or the read-out data of that column. Moreover, the column decoder and the sense amplifier 206 are connected to a memory cell array 207 via respective data transfer lines. The ROM control circuit 205, which is connected to a row decoder and a row driver 208, decodes the address of a specified row, and then, for example, applies the boost voltage provided from a booster circuit 209 to the data select line corresponding to that row upon write-in. In this case, the booster circuit 209 includes, for example, a charge pump circuit, and applies, for example, a high voltage in between the power supply voltage and 30 V to the memory cell array 207.

In addition, the row decoder and the row driver 208 are connected to the memory cell array 207 via respective data select lines. It is noted here that the memory cell array 207 has adopted the memory cell array structure of the nonvolatile semiconductor memory described in the first through third embodiments. With a vehicle LSI system, since there is a possibility that the car temperature exceeds the consumer specification temperature (e.g., 85° C.), a guarantee of high-temperature operations between 85° C. and 100° C. is required. However, the nonvolatile semiconductor memory system of this application can achieve a highly reliable memory system with few malfunctions even in such environment.

In addition, the surface area of the ROM circuit can be further reduced since punch-through does not occur even if the booster circuit 209 and the row decoder and the row driver 208 to which a high voltage is applied respectively, are arranged closer to the ROM control circuit 205 and the column decoder and the sense amplifier 206, which operate at a lower power supply voltage. Naturally, in this application, for example, a mixed circuit including the CPU 202 and/or RAM 203 may be formed not only in ROM 204 but on the same semiconductor substrate as the ROM. Even in such example, the surface area of the mixed circuit can be further reduced since the punch-through does not occur, even if the CPU 202 or RAM 203 operating at a low voltage is arranged closer to the row decoder and the row driver 208 and the booster circuit 209.

(Application 2)

Figure 101:
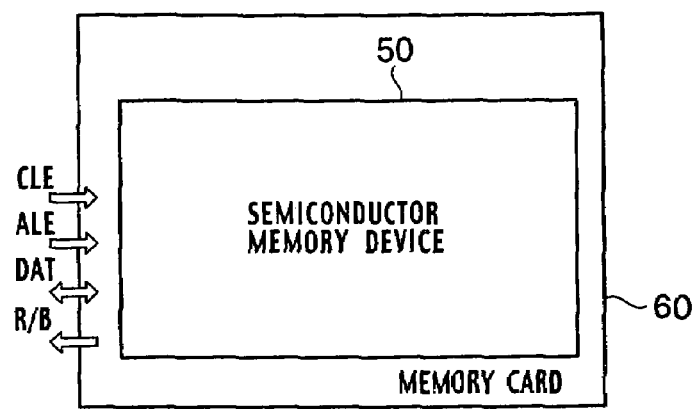
FIG. 101 is a schematic diagram showing the internal configuration of a memory card to which is applied the nonvolatile semiconductor memory according to the fourth embodiment of the present invention.

As an example, the structure of a memory card 60 including a semiconductor memory device 50 is shown in FIG. 101. The nonvolatile semiconductor memory according to the first through third embodiments of the present invention is applicable to the semiconductor memory device 50. The memory card 60, as shown in FIG. 101, is operable so as to receive a predetermined signal from an external device (not shown in the drawing) or to output a predetermined signal from an external device (not shown in the drawing).

A signal line DAT, a command line enable signal line CLE, an address line enable signal line ALE, and a ready/busy signal line R/B are connected to the memory card 60, which includes the semiconductor memory device 50. The signal line DAT is used to transfer a data signal, an address signal, and a command signal. The command line enable signal line CLE is used to transmit a signal, which indicates that the command signal is being transferred over the signal line DAT. The address line enable signal line ALE is used to transmit a signal, which indicates that the address signal is being transferred over the signal line DAT. The ready/busy signal line R/B is used to transmit a signal, which indicates whether or not the semiconductor memory device 50 is ready.

(Application 3)

Figure 102:
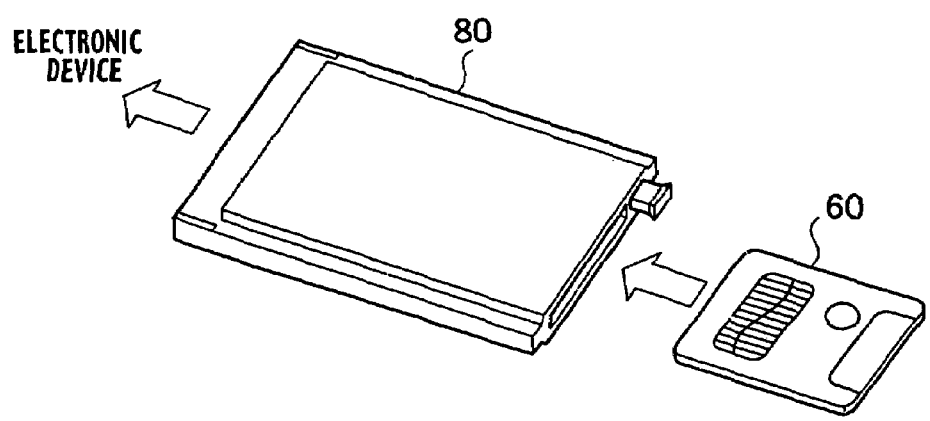
FIG. 102 is a schematic diagram of a memory card and a card holder to which is applied the nonvolatile semiconductor memory according to the fourth embodiment of the present invention.

As an application example of the memory card 60 shown in FIG. 101, a memory card holder 80 may be utilized, as shown in FIG. 102. The memory card holder 80 may receive the memory card 60, which uses the nonvolatile semiconductor memory described in detail in the first through third embodiments of the present invention as the semiconductor memory device 50. The memory card holder 80 is connected to an electronic device (not shown in the drawing), and is operable as an interface between the memory card 60 and the electronic device.

(Application 4)

Figure 103:
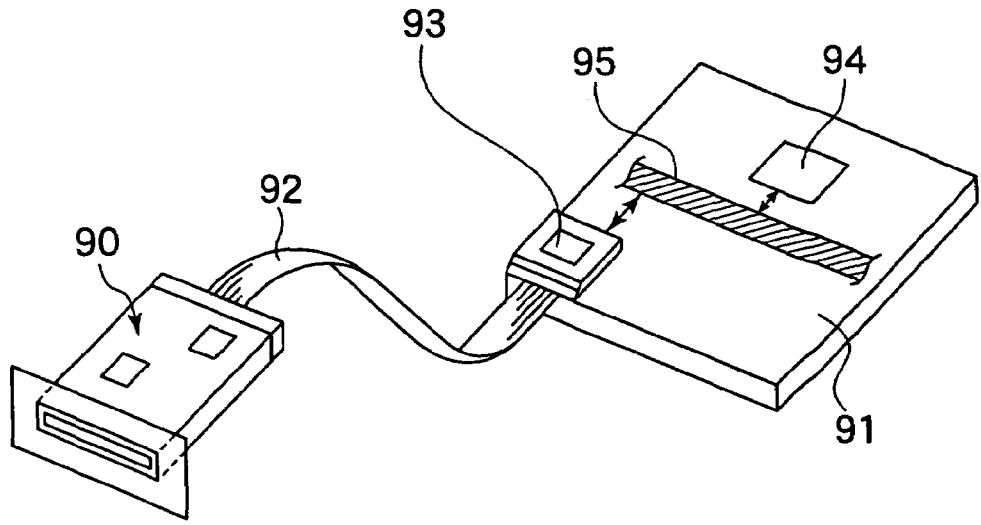
FIG. 103 is a schematic diagram of a connecting device capable of receiving the memory card and card holder to which is applied the nonvolatile semiconductor memory according to the fourth embodiment of the present invention.

Yet another application is described while referencing FIG. 103. In FIG. 103, a connecting apparatus 90 capable of receiving the memory card 60 or the memory card holder 80 is disclosed. The nonvolatile semiconductor memory described in detail in the first through third embodiments of the present invention is embedded in either the memory card 60 or the memory card holder 80 as the semiconductor memory 50.

The memory card 60 or the memory card holder 80 is attached and connected electrically to the connecting apparatus 90. The connecting apparatus 90 is connected to a circuit board 91, which mounts a CPU 94 and a bus 94 via a connecting wire 92 and an interface circuit 93.

(Application 5)

Figure 104:
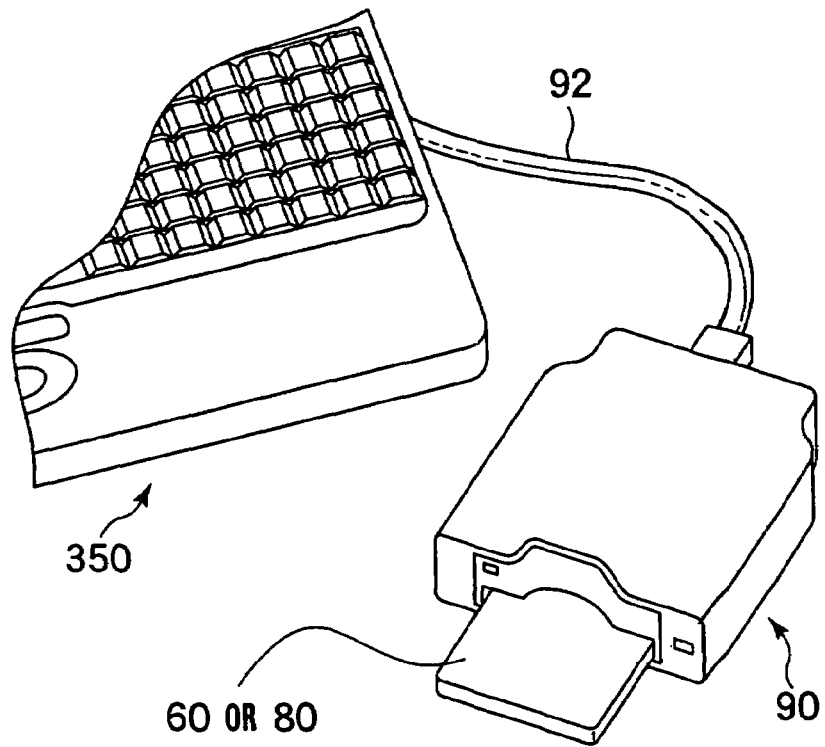
FIG. 104 is a schematic diagram of a coupling device, which embeds an internal memory card to which is applied the nonvolatile semiconductor memory according to the fourth embodiment of the present invention, and connects to a personal computer via a connecting wire.

Another application is described while referencing FIG. 104. The nonvolatile semiconductor memory described in detail in the first through third embodiments of the present invention is embedded in either the memory card 60 or the memory card holder 80 as the semiconductor memory device 50. The memory card 60 or the memory card holder 80 is attached and connected electrically to the connecting apparatus 90. The connecting apparatus 90 is connected to a personal computer (PC) 350 via the connecting wire 92.

(Application 6)

Figure 105:
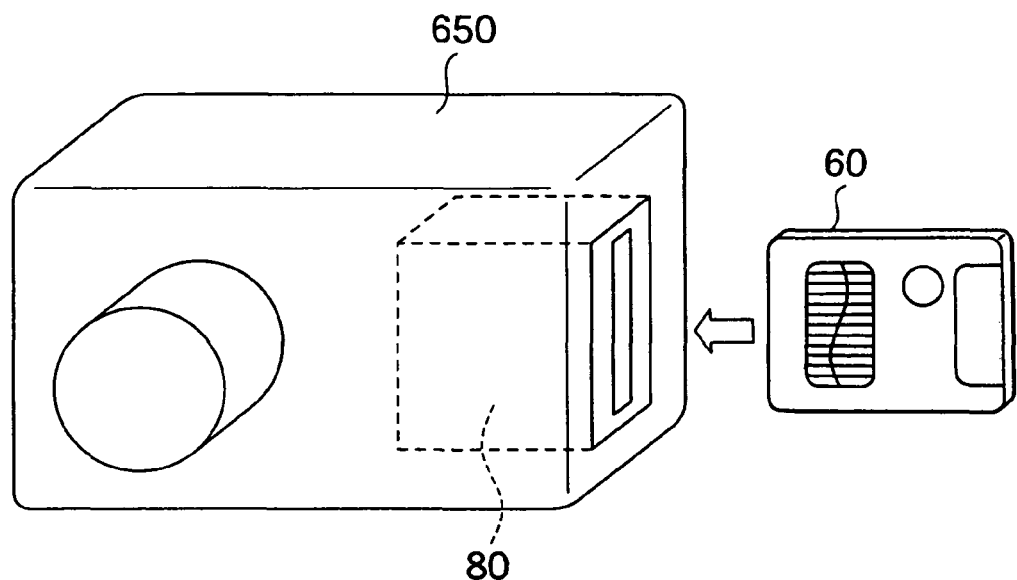
FIG. 105 shows a digital camera system, which is capable of embedding a memory card to which is applied the nonvolatile semiconductor memory according to the fourth embodiment of the present invention.

Another application is described while referencing FIG. 105. The nonvolatile semiconductor memory described in detail in the first through third embodiments of the present invention is embedded in the memory card 60 as the semiconductor memory device 50. FIG. 105 shows an example of applying such memory card 60 to a digital camera 650 embedded with the memory card holder 80.

(Application 7)

Figure 106:
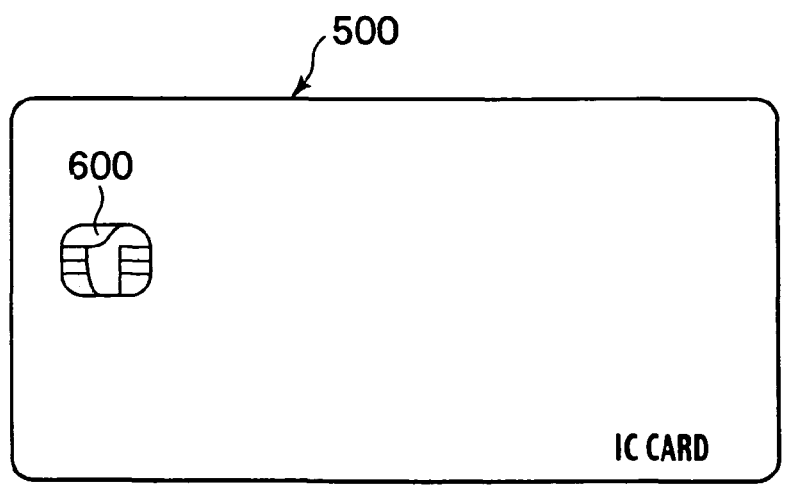
FIG. 106 is a schematic diagram of an IC card to which is applied the nonvolatile semiconductor memory according to the fourth embodiment of the present invention.
Figure 107:
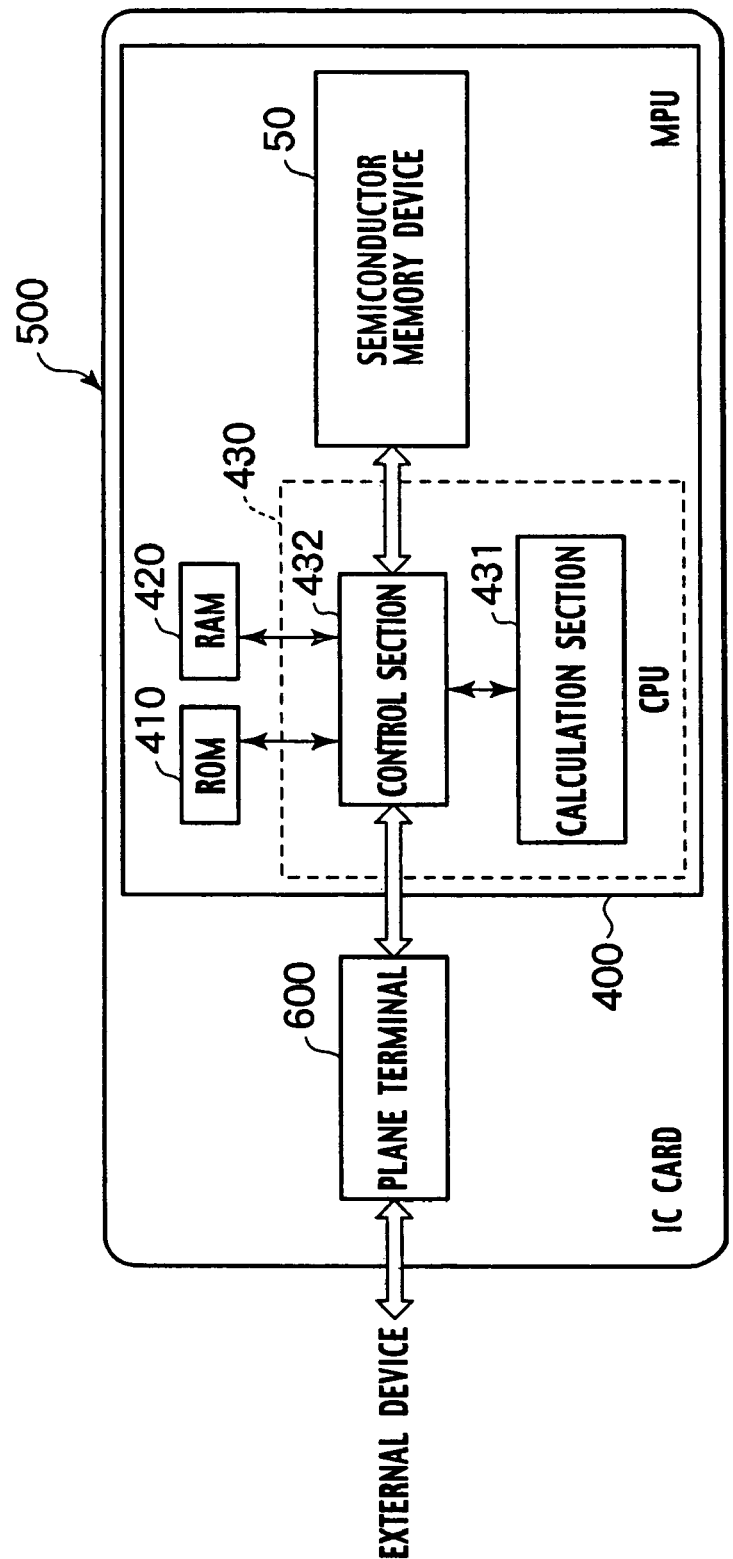
FIG. 107 is a schematic diagram showing the internal configuration of an IC card to which is applied the nonvolatile semiconductor memory according to the fourth embodiment of the present invention.

Another application of the nonvolatile semiconductor memory according to the first through third embodiments of the present invention is an interface circuit (IC) card 500 including an MPU 400 made up of a semiconductor memory device 50, ROM 410, RAM 420, a CPU 430, and a plane terminal 600, as shown in FIGS. 106 and 107. The IC card 500 may be connected to an external device via the plane terminal 600. In addition, the plane terminal 600 is coupled to the MPU 400 in the IC card 500. The CPU 430 has a calculation section 431 and a control section 432. The control section 432 is coupled to the semiconductor memory device 50, ROM 410, and RAM 420. It is desirable that the MPU 400 be molded on one of the surfaces of the IC card 500, and the plane terminal 600 be manufactured on the other surface of the IC card 500. As shown in FIG. 107, the nonvolatile semiconductor memory described in detail in the first through third embodiments of the present invention is applicable to the semiconductor memory device 50 or ROM 410. In addition, it is possible for the nonvolatile semiconductor memory to operate in page mode, byte mode, or ROM region included EEPROM mode.

Other Embodiments

Note that the present invention is not limited to the above mentioned embodiments, and various modifications are possible. The method of forming a device isolating film or an insulator film may be, for example, a formation method of implanting oxygen ions into deposited silicon or a formation method of oxidizing deposited silicon rather than the method of converting silicon into a silicon oxide film or a silicon nitride film. Moreover, a field-shield structure using a gate electrode or a LOCOS structure may be employed as a device isolation.

$TiO_2$, $Al_2O_3$, a tantalum oxide film, strontium titanate, barium titanate, lead zirconium titanate, or a stacked layer thereof may be used for the charge storage layer.

While the p-silicon substrate is assumed as the semiconductor substrate in the embodiments, an n-silicon substrate, an SOI silicon layer of a silicon-on-insulator (SOI) substrate, or a monocrystalline semiconductor substrate including silicon such as a SiGe alloys mixed crystal or a SiGeC mixed crystal may be used instead.

In addition, formation of an n-channel FET on the p-well region has been described above; however, this may be replaced with a p-channel FET upon the n-well region. In that case, a n-type for the source and the drain regions and the semiconductor regions in the above embodiments may be substituted for the p-type, and a p-type for the same substituted for the n-type, and the doping impurities As, P, and Sb may be replaced with either In or B.

Furthermore, a silicon semiconductor, a SiGe alloys mixed crystal, or a SiGeC mixed crystal may be used for the control gate electrode, or it may be a polycrystal or a stacked layer structure thereof. Moreover, amorphous silicon, an amorphous SiGe mixed crystal, or an amorphous SiGeC mixed crystal may be used, or a stacked layer structure thereof may be used. However, it is desirable to use a semiconductor, in particular, a silicon included semiconductor, which allows formation of p-gate electrodes and prevention of electron injection from the gate electrode.

In addition, the charge storage layers may be arranged in a dotted pattern, and the present invention may be applicable to this case also.

In addition, the embodiments of the present invention can be modified and implemented in various ways as long as not deviating from the summary of the present invention.

As described above, the present invention is described according to embodiments; however, it should not be perceived that descriptions forming a part of this disclosure and drawings are intended to limit the present invention. Various alternative embodiments, working examples, and operational techniques will become apparent from this disclosure for those skills in the art. Accordingly, a technical range of the present invention is determined only by specified features of the invention according to the above-mentioned descriptions and appropriate appended claims.

It should be noted that each of the above embodiments can be implemented in respective combinations. In this manner, the present invention naturally includes various embodiments not described herein.

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art. Accordingly, the technical scope of the present invention is defined by only the claims that appear appropriate from the above explanation.

Various modifications will become possible for those skilled in the art after receiving the teachings of the present disclosure without departing from the scope thereof.

What is claimed is:

1. A non-volatile semiconductor memory device, comprising:
    a semiconductor substrate including a substrate surface;
    a first interlayer insulating film formed on the substrate surface of the semiconductor substrate;
    a second interlayer insulating film formed on the first interlayer insulating film;
    a bit line formed on the second interlayer insulating film, the bit line extending to a first direction;
    a first plug formed in the first interlayer insulating film, the first plug including:
        a lower portion having a silicon material, the lower portion having a first bottom surface contacting to the semiconductor substrate, and
        an upper portion located on the lower portion and having a metallic material, the upper portion having a first upper surface exposed from the first interlayer insulating film, the first upper surface having a first width along the first direction and a second width along a second direction perpendicular to the first direction;
    a second plug formed in the second interlayer insulating film, including a second upper surface contacting to the bit line and a second bottom surface contacting to the first upper surface of the first plug, the second bottom surface having a send third width along the first direction and a forth width along the second direction, the second plug extending in a direction parallel to the first direction as a long-side direction; and
    a plurality of gate electrodes of memory cell transistors formed above the substrate surface of the semiconductor substrate, each of the gate electrodes including a third upper surface;
    wherein the third width is larger than the first width, the fourth width is smaller than the second width, and a height of an interface between the first and second interlayer insulating films is higher than a height of the third upper surface of the gate electrodes of the memory cell transistor relative to the substrate surface of the semiconductor substrate.

2. The device according to claim 1, wherein the upper portion of the first plug includes an upper side surface contacting to the second plug.

3. The device according to claim 1, further comprising a source line formed in the first interlayer insulating film, and a third plug formed between the source line and the semiconductor substrate.

4. The device according to claim 3, wherein the source line includes a metallic material, and the third plug includes a silicon material.

5. The device according to claim 3, wherein the source line extends to a second direction.

6. The device according to claim 3, wherein the gate electrodes of memory cell transistors are disposed between the first and third plugs.

7. The device according to claim 6, wherein each of the memory cell transistors includes a floating gate electrode, respectively.

* * * * *